US012513808B2

(12) United States Patent
Nakano et al.

(10) Patent No.: US 12,513,808 B2
(45) Date of Patent: Dec. 30, 2025

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventors: Masaki Nakano, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 147 days.

(21) Appl. No.: 18/351,630

(22) Filed: Jul. 13, 2023

(65) Prior Publication Data

US 2024/0049378 A1 Feb. 8, 2024

(30) Foreign Application Priority Data

Aug. 2, 2022 (JP) ................................ 2022-123546

(51) Int. Cl.
*G03F 7/00* (2006.01)
*H05G 2/00* (2006.01)

(52) U.S. Cl.
CPC ....... *H05G 2/0027* (2024.08); *G03F 7/70033* (2013.01); *G03F 7/70525* (2013.01); *G03F 7/7065* (2013.01)

(58) Field of Classification Search
CPC ........ H05G 2/006; H05G 2/008; H05G 2/005; G03F 7/70033; G03F 7/70525; G03F 7/7065
See application file for complete search history.

(56) References Cited

U.S. PATENT DOCUMENTS 10,631,393 B2 * 4/2020 Hori ...................... H05G 2/006
2006/0133967 A1 6/2006 Selt et al.
(Continued)

FOREIGN PATENT DOCUMENTS

JP S62-036058 Y2 9/1987
JP 2015-053292 A 3/2015

OTHER PUBLICATIONS

Search Report mailed by the Netherlands Patent Office on Oct. 30, 2025, which corresponds to Dutch Patent Application No. 2035291, and is related to U.S. Appl. No. 18/351,630; with English language translation.

Primary Examiner — Mesfin T Asfaw
(74) Attorney, Agent, or Firm — Studebaker Brackett PLLC

(57) ABSTRACT

An extreme ultraviolet light generation apparatus includes a droplet target generation device and a solid target replenishment device. The droplet target generation device includes a tank configured to melt a solid target substance to generate a liquid target substance, and a nozzle configured to continuously generate a droplet target from the liquid target substance in the tank and output the droplet target toward a plasma generation region to which pulse laser light is concentrated, and is configured to apply a velocity difference between a plurality of droplet targets including the droplet target so that the plurality of droplet targets coalesce. The solid target replenishment device is configured to replenish the tank with a one-time replenishment amount of the solid target substance such that the coalescence of the plurality of droplet targets is completed before the plurality of droplet targets reach the plasma generation region.

26 Claims, 55 Drawing Sheets

(56) References Cited

U.S. PATENT DOCUMENTS

| | | | |
|---|---|---|---|
| 2006/0192155 A1* | 8/2006 | Algots | H05G 2/006 250/504 R |
| 2012/0286176 A1* | 11/2012 | Rajyaguru | H05G 2/006 250/504 R |
| 2013/0221587 A1 | 8/2013 | Shiraishi et al. | |
| 2020/0344867 A1 | 10/2020 | Lukens et al. | |
| 2020/0363728 A1 | 11/2020 | Nakano | |
| 2021/0364927 A1 | 11/2021 | Hori et al. | |

\* cited by examiner

EXTREME ULTRAVIOLET LIGHT GENERATION APPARATUS AND ELECTRONIC DEVICE MANUFACTURING METHOD

CROSS-REFERENCE TO RELATED APPLICATIONS

The present application claims the benefit of Japanese Patent Application No. 2022-123546, filed on Aug. 2, 2022, the entire contents of which are hereby incorporated by reference.

BACKGROUND

1. Technical Field

The present disclosure relates to an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, the development of an exposure apparatus that combines an extreme ultraviolet (EUV) light generation apparatus that generates EUV light having a wavelength of about 13 nm and reduced projection reflection optics is expected.

As the EUV light generation apparatus, a laser produced plasma (LPP) type apparatus using plasma generated by irradiating a target substance with pulse laser light has been developed.

LIST OF DOCUMENTS

Patent Documents

Patent Document 1: Japanese Patent Application Publication No. 2015-053292
Patent Document 2: US Patent Application Publication No. 2013/0221587
Patent Document 3: US Patent Application Publication No. 2020/0363728
Patent Document 4: US Patent Application Publication No. 2006/0133967
Patent Document 5: Japanese Examined Utility Model Application Publication No. S62-036058

SUMMARY

An extreme ultraviolet light generation apparatus according to an aspect of the present disclosure includes a droplet target generation device including a tank configured to melt a solid target substance to generate a liquid target substance, and a nozzle configured to continuously generate a droplet target from the liquid target substance in the tank and output the droplet target toward a plasma generation region to which pulse laser light is concentrated, and configured to apply a velocity difference between a plurality of droplet targets including the droplet target so that the plurality of droplet targets coalesce; and a solid target replenishment device configured to replenish the tank with a one-time replenishment amount of the solid target substance such that the coalescence of the plurality of droplet targets is completed before the plurality of droplet targets reach the plasma generation region.

An electronic device manufacturing method according to an aspect of the present disclosure includes generating extreme ultraviolet light using an extreme ultraviolet light generation apparatus, outputting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a droplet target generation device including a tank configured to melt a solid target substance to generate a liquid target substance, and a nozzle configured to continuously generate a droplet target from the liquid target substance in the tank and output the droplet target toward a plasma generation region to which pulse laser light is concentrated, and configured to apply a velocity difference between a plurality of droplet targets including the droplet target so that the plurality of droplet targets coalesce; and a solid target replenishment device configured to replenish the tank with a one-time replenishment amount of the solid target substance such the that coalescence of the plurality of droplet targets is completed before the plurality of droplet targets reach the plasma generation region.

An electronic device manufacturing method according to an aspect of the present disclosure includes inspecting a defect of a mask by irradiating the mask with extreme ultraviolet light generated by an extreme ultraviolet light generation apparatus, selecting a mask using a result of the inspection, and exposing and transferring a pattern formed on the selected mask onto a photosensitive substrate. Here, the extreme ultraviolet light generation apparatus includes a droplet target generation device including a tank configured to melt a solid target substance to generate a liquid target substance, and a nozzle configured to continuously generate a droplet target from the liquid target substance in the tank and output the droplet target toward a plasma generation region to which pulse laser light is concentrated, and configured to apply a velocity difference between a plurality of droplet targets including the droplet target so that the plurality of droplet targets coalesce; and a solid target replenishment device configured to replenish the tank with a one-time replenishment amount of the solid target substance such that the coalescence of the plurality of droplet targets is completed before the plurality of droplet targets reach the plasma generation region.

BRIEF DESCRIPTION OF THE DRAWINGS

Embodiments of the present disclosure will be described below merely as examples with reference to the accompanying drawings.

DESCRIPTION OF EMBODIMENTS

Contents

Figure 1:
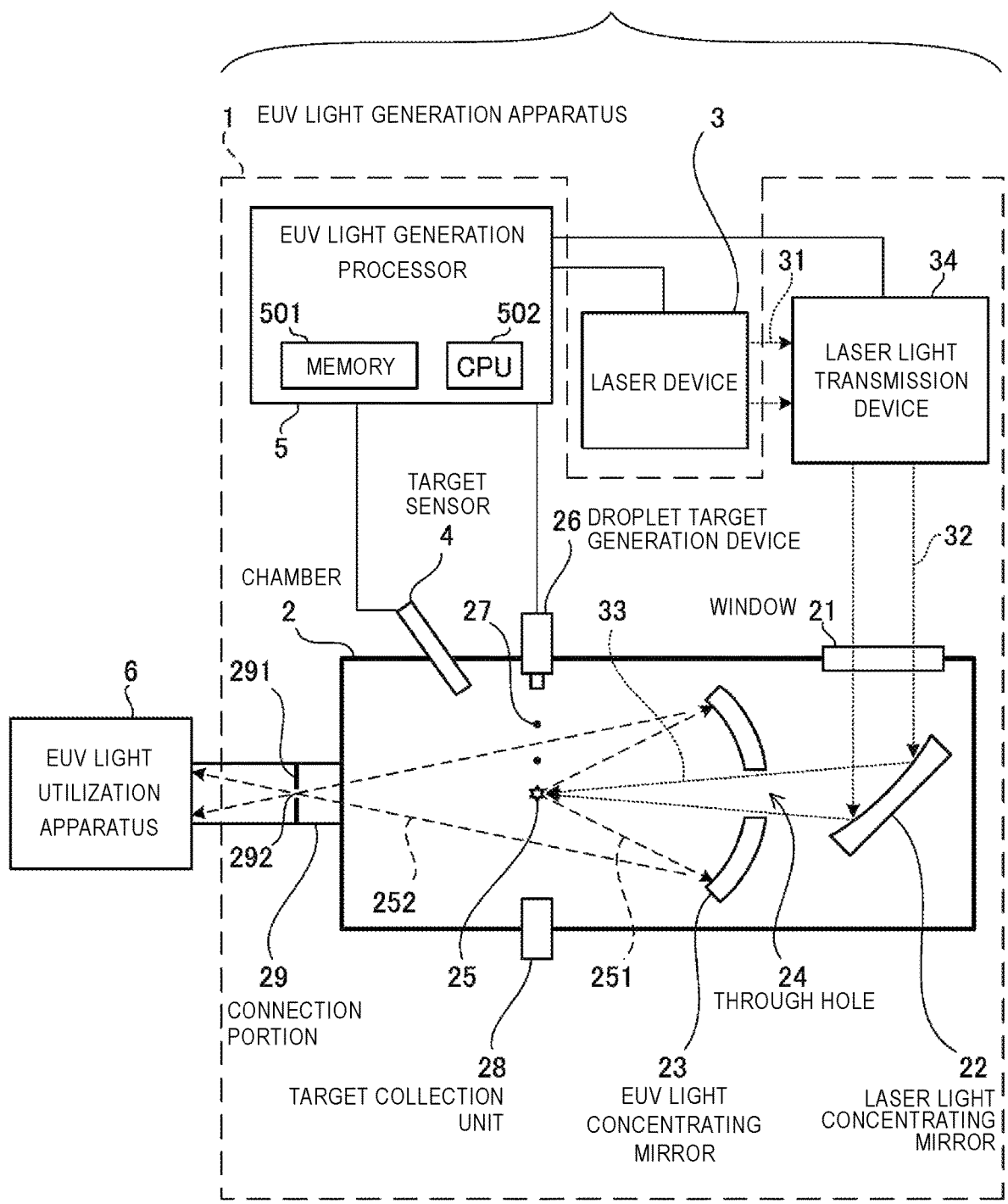
FIG. 1 schematically shows the configuration of an LPP EUV light generation system.

1. Overall description of EUV light generation system 11
   1.1 Configuration
   1.2 Operation
2. Comparative example
   2.1 Configuration
      2.1.1 Solid target replenishment device 8
      2.1.2 Droplet target generation device 26
      2.1.3 CW laser light source 41 and passage sensor unit 42
      2.1.4 Pulse light source 43 and imaging unit 44
      2.1.5 EUV sensor 40
      2.1.6 EUV light utilization apparatus processor
   2.2 Operation of various processors
      2.2.1 Overview
      2.2.2 Operation of EUV light generation processor 5
      2.2.3 Operation of droplet target generation processor 265
      2.2.4 Operation of solid target replenishment processor 85
   2.3 Problem of comparative example
3. Replenishment amount Qt set using target measurement result
   3.1 Configuration
   3.2 Operation of various processors
      3.2.1 Overview
      3.2.2 Operation of EUV light generation processor 5
      3.2.3 Calculation example of lower limit value of replenishment amount Qt
      3.2.4 Operation of solid target replenishment processor 85
   3.3 Effect
4. Replenishment amount Qt set using target measurement system
   4.1 Configuration
   4.2 Operation
   4.3 Effect
5. Replenishment amount Qt set based on pulse energy stability Eσ of EUV light
   5.1 Operation of various processors
      5.1.1 Overview
      5.1.2 Operation of EUV light generation processor 5
      5.1.3 Operation of solid target replenishment processor 85
   5.2 Effect
6. Temperature control of tank 260 when replenishing solid target substance 27a
   6.1 Configuration
   6.2 Operation of various processors
      6.2.1 Overview
      6.2.2 Operation of EUV light generation processor 5
      6.2.3 Operation of droplet target generation processor 265
   6.3 Application to second embodiment
   6.4 Application to third embodiment
   6.5 Effect
7. Duty control of drive waveform when replenishing solid target substance 27a
   7.1 Configuration
   7.2 Operation of various processors
      7.2.1 Overview
      7.2.2 Operation of EUV light generation processor 5
      7.2.3 Operation of droplet target generation processor 265
   7.3 Effect
8. Modulation control of drive waveform when replenishing solid target substance 27a
   8.1 Configuration
   8.2 Operation of various processors
      8.2.1 Overview
      8.2.2 Operation of EUV light generation processor 5
      8.2.3 Operation of droplet target generation processor 265
      8.2.4 Example of modulated wave
         8.2.4.1 PM modulated wave Vpm(t)
         8.2.4.2 FM modulated wave Vfm(t)
         8.2.4.3 AM modulated wave Vam(t)
   8.3 Effect
9. Others
   9.1 Measuring instrument 82 of solid target replenishment device 8
   9.2 Solid target replenishment device 8 in which one-time replenishment amount Qt is fixed
   9.3 Load lock device 83 including shutter 831
   9.4 Droplet target generation device 26 in which heater 260st and heater 267nz are arranged in small tank 267st and nozzle 266 respectively
   9.5 Pressure regulator 261
   9.6 EUV light utilization apparatus 6
   9.7 Supplement Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. OVERALL DESCRIPTION OF EUV LIGHT GENERATION SYSTEM 11

1.1 Configuration

FIG. 1 schematically shows the configuration of an LPP EUV light generation system 11. An EUV light generation apparatus 1 is used together with a laser device 3. In the present disclosure, a system including the EUV light generation apparatus 1 and the laser device 3 is referred to as the EUV light generation system 11. The EUV light generation apparatus 1 includes a chamber 2 and a droplet target generation device 26. The chamber 2 is a sealable container. The droplet target generation device 26 supplies a target 27 containing a target substance into the chamber 2. The material of the target substance may include tin, terbium, gadolinium, lithium, xenon, or a combination of any two or more thereof.

A through hole is formed in a wall of the chamber 2. The through hole is blocked by a window 21 and pulse laser light 32 output from the laser device 3 passes through the window 21. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region 25 and the second focal point is located at an intermediate focal point 292. A through hole 24 is formed at the center of the EUV light concentrating mirror 23, and pulse laser light 33 passes through the through hole 24.

The EUV light generation apparatus 1 includes an EUV light generation processor 5, a target sensor 4, and the like. The EUV light generation processor 5 is a processing device including a memory 501 in which a control program is stored and a central processing unit (CPU) 502 which executes the control program. The EUV light generation processor 5 is specifically configured or programmed to perform various processes included in the present disclosure. The target sensor 4 detects at least one of the presence, trajectory, position, and velocity of the target 27. The target sensor 4 may have an imaging function.

Further, the EUV light generation apparatus 1 includes a connection portion 29 providing communication between the internal space of the chamber 2 and the internal space of an EUV light utilization apparatus 6. An example of the EUV light utilization apparatus 6 will be described later with reference to FIGS. 54 and 55. A wall 291 in which an aperture is formed is arranged in the connection portion 29. The wall 291 is arranged such that the aperture is located at the second focal point of the EUV light concentrating mirror 23.

Further, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of the pulse laser light 32, and an actuator for adjusting the position, posture, and the like of the optical element.

1.2 Operation

Operation of the EUV light generation system 11 will be described with reference to FIG. 1. Pulse laser light 31 output from the laser device 3 enters, via the laser light transmission device 34, the chamber 2 through the window 21 as the pulse laser light 32. The pulse laser light 32 travels along a laser light path in the chamber 2, is reflected by the laser light concentrating mirror 22, and is radiated to the target 27 as the pulse laser light 33.

The droplet target generation device 26 outputs the target 27 toward the plasma generation region 25 in the chamber 2. The target 27 is irradiated with the pulse laser light 33. The target 27 irradiated with the pulse laser light 33 is turned into plasma, and radiation light 251 is radiated from the plasma. EUV light included in the radiation light 251 is reflected by the EUV light concentrating mirror 23 with higher reflectance than light in other wavelength ranges. Reflection light 252 including the EUV light reflected by the EUV light concentrating mirror 23 is concentrated at the intermediate focal point 292 and output to the EUV light utilization apparatus 6. Here, one target 27 may be irradiated with a plurality of pulses included in the pulse laser light 33.

The EUV light generation processor 5 controls the entire EUV light generation system 11. The EUV light generation processor 5 processes a detection result of the target sensor 4. Based on the detection result of the target sensor 4, the EUV light generation processor 5 controls the timing at which the target 27 is output, the output direction of the target 27, and the like. Further, the EUV light generation processor 5 controls an oscillation timing of the laser device 3, the travel direction of the pulse laser light 32, the concentration position of the pulse laser light 33, and the like. Such various kinds of control described above are merely exemplary, and other control may be added as necessary.

2. COMPARATIVE EXAMPLE

2.1 Configuration

Figure 2:
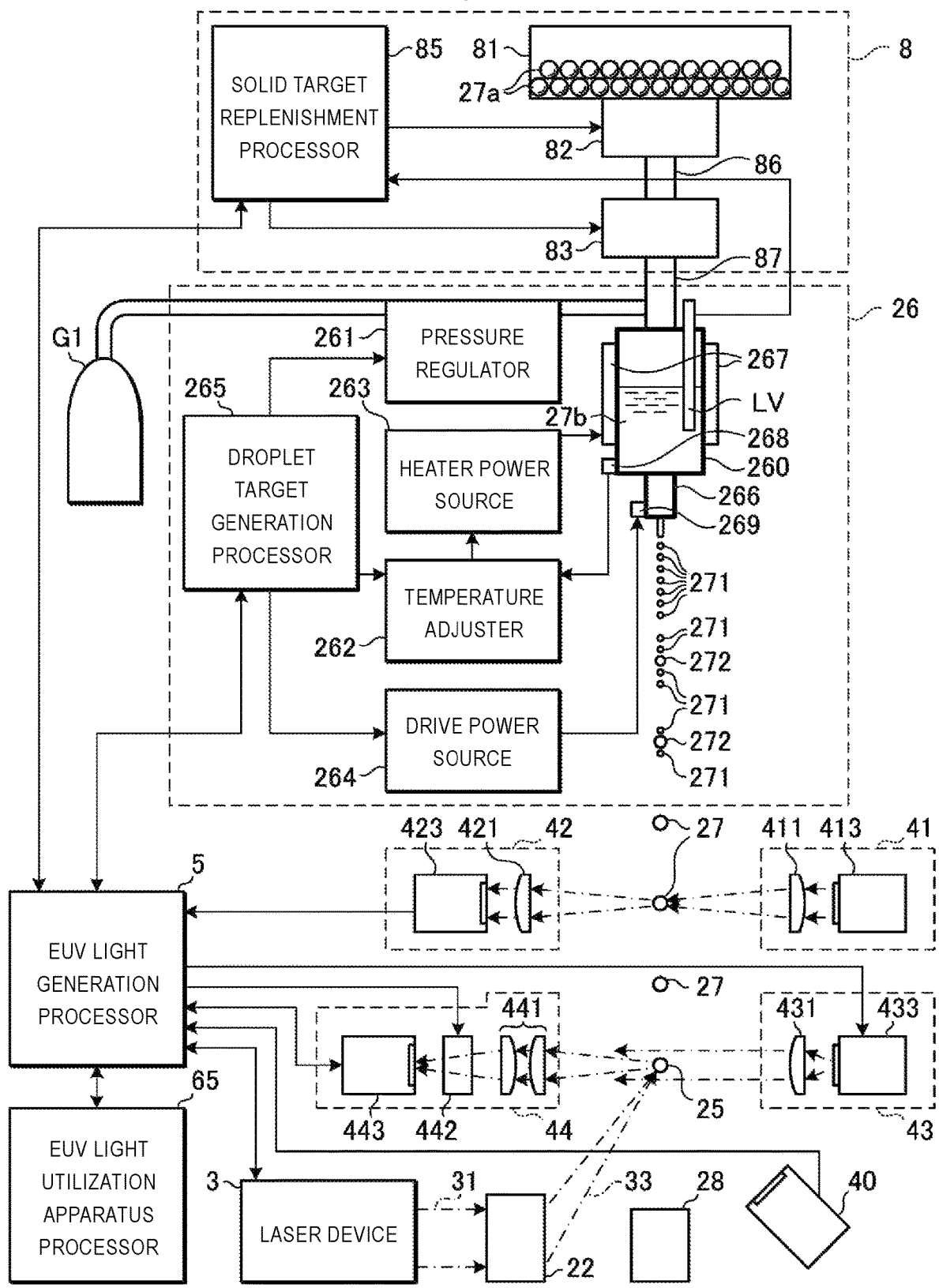
FIG. 2 shows the configuration of a droplet target generation device and the periphery thereof in the EUV light generation system according to a comparative example.

FIG. 2 shows the configuration of the droplet target generation device 26 and the periphery thereof in an EUV light generation system 11 according to a comparative example. The comparative example of the present disclosure is an example recognized by the applicant as known only by the applicant, and is not a publicly known example admitted by the applicant. The droplet target generation device 26 is used together with a solid target replenishment device 8, an EUV sensor 40, a CW laser light source 41, a passage sensor unit 42, a pulse light source 43, and an imaging unit 44. The passage sensor unit 42 and the imaging unit 44 correspond to the detection device in the present disclosure.

2.1.1 Solid Target Replenishment Device 8

The solid target replenishment device 8 includes a solid target container 81, a measuring instrument 82, a load lock device 83, and a solid target replenishment processor 85. The solid target replenishment processor 85 includes a memory and a CPU (not shown) and has a configuration similar to that of the EUV light generation processor 5.

The solid target container 81 is a container to contain the solid target substance 27a such as tin. The solid target substance 27a may be, for example, spherical particles of substantially the same size. Alternatively, it may be particles having a shape other than a spherical shape, pellets, or ingots. The temperature inside the solid target container 81 is lower than the melting point of the target substance. The pressure in the solid target container 81 is about the same as the atmospheric pressure.

The measuring instrument 82 is arranged at the lower end of the solid target container 81. The solid target container 81 is connected to a supply pipe 86 via the measuring instrument 82, and the supply pipe 86 is connected to the load lock device 83. The load lock device 83 is further connected to a supply pipe 87, and the supply pipe 87 is connected to the tank 260 of the droplet target generation device 26.

The measuring instrument 82 normally stops supplying the solid target substance 27a from the solid target container 81 to the supply pipe 86. The measuring instrument 82 can move the solid target substance 27a to the supply pipe 86 while measuring the amount thereof. Measuring the amount of the solid target substance 27a includes counting the number of particles of the solid target substance 27a. The measured solid target substance 27a is moved by gravity to the load lock device 83 as passing through the supply pipe 86. After a predetermined amount of the solid target substance 27a passes, the measuring instrument 82 stops passing of the solid target substance 27a. A one-time solid target replenishment amount Qt is set by the EUV light generation processor 5.

Figure 3:
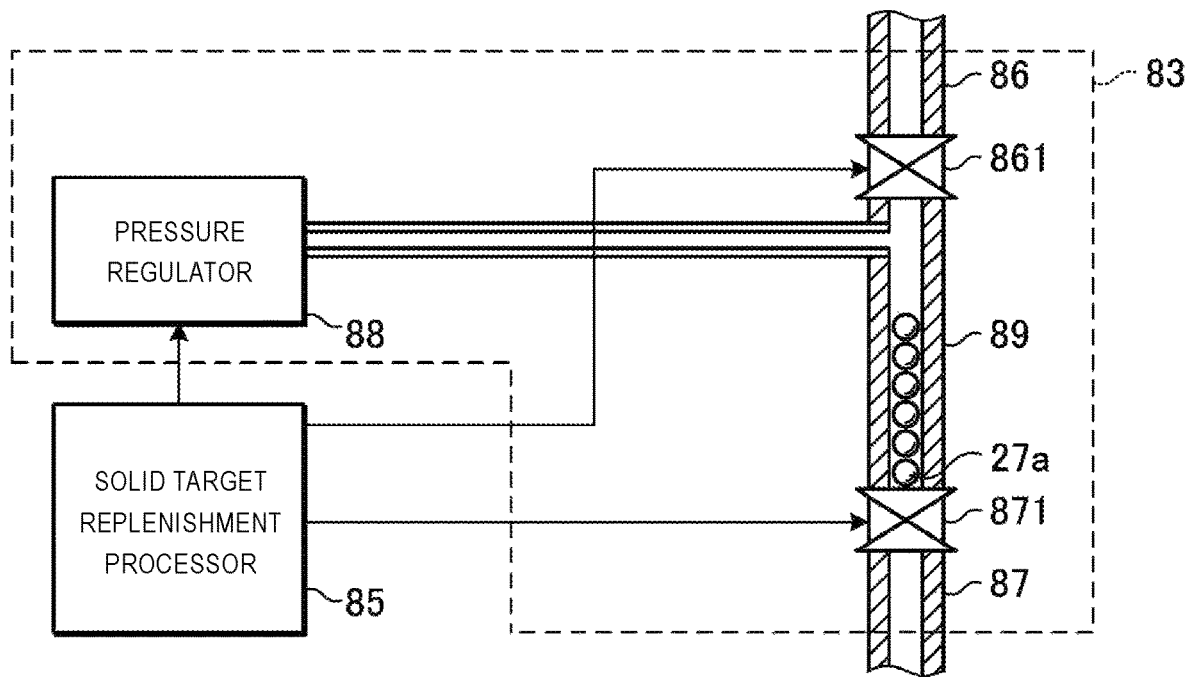
FIG. 3 schematically shows a configuration example of a load lock device.

FIG. 3 schematically shows a configuration example of the load lock device 83. The load lock device 83 includes a pressure regulator 88 and a load lock chamber 89, and is arranged between the supply pipes 86, 87. An inlet valve 861 is arranged in the supply pipe 86, and an outlet valve 871 is arranged in the supply pipe 87. The pressure regulator 88 is connected between the load lock chamber 89 and an inert gas cylinder (not shown) via a pipe. The load lock chamber 89 may be further connected to an exhaust pump (not shown). The load lock chamber 89 is configured to be capable of containing the solid target substance 27a supplied from the measuring instrument 82. The temperature in the load lock chamber 89 is lower than the melting point of the target substance.

The inlet valve 861 and the outlet valve 871 are controlled by the solid target replenishment processor 85 to ensure that one is closed before the other is opened. With the inlet valve 861 open, the solid target substance 27a can be moved from the measuring instrument 82 to the load lock chamber 89. In a state in which the solid target substance 27a is contained in the load lock chamber 89 with the inlet valve 861 and the outlet valve 871 closed, the pressure regulator 88 is controlled by the solid target replenishment processor 85 so that the inside of the load lock chamber 89 is at the same pressure as the inside of the tank 260 of the droplet target generation device 26. When the outlet valve 871 is then opened, the solid target substance 27a can be moved from the load lock chamber 89 to the tank 260. Accordingly, fluctuation of the pressure in the tank 260 is suppressed.

2.1.2 Droplet Target Generation Device 26

Referring again to FIG. 2, the droplet target generation device 26 includes the tank 260, a droplet target generation processor 265, a nozzle 266, a heater 267, a temperature sensor 268, and a vibration device 269. The droplet target generation processor 265 includes a memory and a CPU (not shown) and has a configuration similar to that of the EUV light generation processor 5.

The tank 260 is a container to contain the target substance supplied from the load lock chamber 89 via the supply pipe 87. The tank 260 is connected to a pressure regulator 261 via a part of the supply pipe 87. The pressure regulator 261 is connected to a gas cylinder G1 outside the droplet target generation device 26. The gas cylinder G1 contains a high-pressure rare gas such as an argon gas or a helium gas as a pressurized gas. The droplet target generation processor 265 controls the pressure regulator 261, so that the pressure in the tank 260 is regulated to a predetermined pressure. The predetermined pressure is lower than the pressure of the gas supplied from the gas cylinder G1 and higher than the atmospheric pressure.

The heater 267 is attached to the tank 260. The heater 267 is connected to a heater power source 263. The droplet target generation processor 265 controls a temperature adjuster 262 based on the output of the temperature sensor 268 arranged on the tank 260, and the temperature adjuster 262 controls the heater power source 263, thereby controlling the temperature in the tank 260. As a result, the solid target substance 27a is melted in the tank 260 to form a liquid target substance 27b. A target temperature Tt of the tank 260 is set to a temperature higher than the melting point of the target substance by the EUV light generation processor 5. Note that another heater (not shown) may be attached to the nozzle 266.

A level sensor LV is arranged in the tank 260. The level sensor LV generates a signal requesting replenishment of the solid target substance 27a when the remaining amount of the liquid target substance 27b in the tank 260 becomes equal to or less than a lower limit value. This signal is transmitted to the solid target replenishment processor 85.

The nozzle 266 is arranged at the lower end of the tank 260 in the gravity direction. The tip of the nozzle 266 is opened to the inside of the chamber 2 (see FIG. 1). The vibration device 269 including a piezoelectric element is attached to the nozzle 266, and the vibration device 269 is connected to a drive power source 264. The drive power source 264 is controlled by the droplet target generation processor 265. The liquid target substance 27b in the tank 260 is output from the opening at the tip of the nozzle 266 owing to the difference between the pressure of gas supplied from the pressure regulator 261 and the pressure in the chamber 2. When vibration is applied to the nozzle 266 by the vibration device 269, the jet-like liquid target substance 27b output from the nozzle 266 is separated into droplets to form the droplet targets 271.

Figure 4:
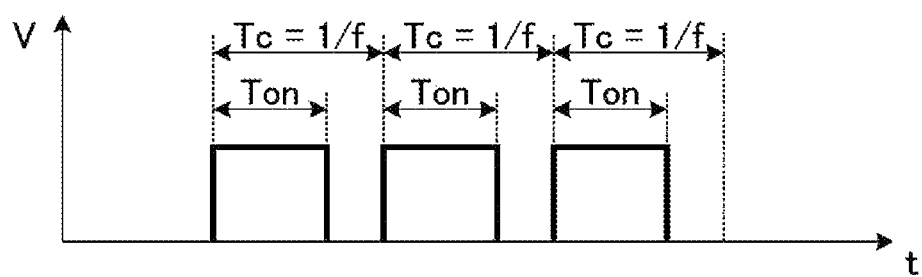
FIG. 4 is a waveform diagram of a drive voltage applied to a vibration device of a nozzle.

FIG. 4 is a waveform diagram of drive voltage applied to the vibration device 269 of the nozzle 266. The horizontal axis represents time t, and the vertical axis represents voltage V. The drive voltage may be provided in the form of a rectangular wave. When the cycle of the drive voltage is Tc and the repetition frequency is f, the cycle Tc is given by 1/f. The on-time per cycle of the drive voltage is defined as Ton. The ratio given by (Ton/Tc)×100 is referred to as a duty D of the drive waveform. For changing the duty D, the on-time Ton is changed without changing the cycle Tc.

Figure 5:
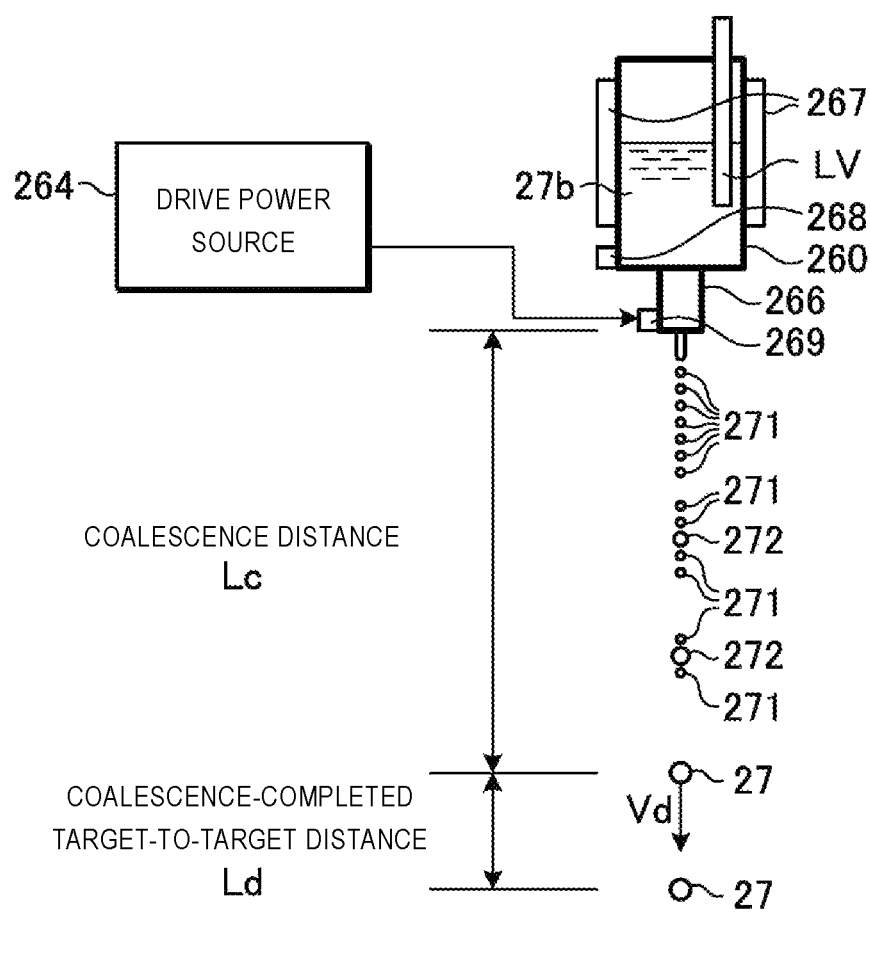
FIG. 5 schematically shows a state in which a plurality of droplet targets coalesce.

FIG. 5 schematically shows a state in which a plurality of the droplet targets 271 coalesce. By adjusting the drive waveform applied to the vibration device 269, a slight velocity difference may be generated between the plurality of droplet targets 271. When the velocity difference occurs in the plurality of droplet targets 271, adjacent droplet targets may coalesce to form a coalescence target 272. The coalescence target 272 further coalesces with an adjacent droplet target 271. A state in which the droplet targets 271 are not present before and after the coalescence target 272 is referred to as coalescence completion, and the coalescence target 272 at this time corresponds to the target 27. The droplet targets 271 existing before and after the coalescence target 272 before coalescence completion are referred to as satellites.

The distance from the tip of the nozzle 266 to the first target 27 with the coalescence thereof completed is defined as a coalescence distance Lc. When the velocity of the target 27 with the coalescence thereof completed is Vd, the coalescence-completed target-to-target distance Ld, which is the distance between the targets 27 with the coalescence thereof completed, is given by the following equation.

$$Ld = Vd \cdot Tc$$

In this way, the coalescence-completed target-to-target distance Ld is determined in accordance with the cycle Tc of the drive voltage.

2.1.3 CW Laser Light Source 41 and Passage Sensor Unit 42

Referring back to FIG. 2, the CW laser light source 41 and the passage sensor unit 42 are arranged on opposite sides of the trajectory of the target 27 or the droplet target 271.

The CW laser light source 41 includes a CW laser 413 and a light concentrating lens 411. The light concentrating lens 411 concentrates the laser light output from the CW laser 413 on the trajectory of the target 27 or the droplet target 271 and the periphery thereof.

The passage sensor unit 42 includes a light receiving optical system 421 and an optical sensor 423. The light receiving optical system 421 guides the light having passed through the trajectory of the target 27 or the droplet target 271 to a light receiving unit of the optical sensor 423. When the target 27 or the droplet target 271 passes through the optical path of the laser light output from the CW laser 413, a part of the laser light is blocked by the target 27 or the droplet target 271, and the intensity of the light received by the optical sensor 423 decreases. Thus, the passage timing of the target 27 or the droplet target 271 is detected, and the passage timing signal is output to the EUV light generation processor 5.

2.1.4 Pulse Light Source 43 and Imaging Unit 44

The pulse light source 43 and the imaging unit 44 are arranged on opposite sides of the plasma generation region 25.

The pulse light source 43 includes a flash lamp 433 and a collimator lens 431. The flash lamp 433 is controlled by the EUV light generation processor 5 to emit flash light with a predetermined delay time with respect to the passage timing detected by the passage sensor unit 42. This delay time is realized by the EUV light generation processor 5 transmitting a control signal through a delay circuit (not shown) connected between the EUV light generation processor 5 and the flash lamp 433. The collimator lens 431 collimates the light output from the flash lamp 433 so that the plasma generation region 25 and the periphery thereof is irradiated with the output light.

The imaging unit 44 includes a transfer optical system 441, a shutter 442, and an image sensor 443. The transfer optical system 441 is arranged such that an inverted image of the target 27 or the droplet target 271 having reached the plasma generation region 25 is formed on a light receiving surface of the image sensor 443. The shutter 442 is controlled by the EUV light generation processor 5 so as to open for a predetermined time in synchronization with the flash light emission. The image sensor 443 outputs, as an image, intensity distribution data of light incident on the light receiving surface. When the target 27 is positioned in the plasma generation region 25, a portion corresponding to an inverted image of the target 27 is dark, and the other portion is bright. Thus, the image of the target 27 or the droplet target 271 is output to the EUV light generation processor 5.

2.1.5 EUV Sensor 40

The EUV sensor 40 includes an energy measurement instrument (not shown) having a light receiving surface directed to the plasma generation region 25, and an EUV light transmission filter (not shown) arranged between the plasma generation region 25 and the energy measurement instrument. EUV light is generated when the pulse laser light 31 output from the laser device 3 is concentrated as the pulse laser light 33 by the laser light concentrating mirror 22 which is shown in a simplified manner and is radiated to the target 27 having reached the plasma generation region 25. The EUV sensor 40 detects the pulse energy Eeuv(k) of the EUV light output from the plasma generation region 25 and outputs the pulse energy Eeuv(k) to the EUV light generation processor 5.

2.1.6 EUV Light Utilization Apparatus Processor 65

The EUV light utilization apparatus 6 (see FIG. 1) includes an EUV light utilization apparatus processor 65. The EUV light generation processor 5 transmits and receives signals to and from the EUV light utilization apparatus processor 65, and determines whether or not to output EUV light to the EUV light utilization apparatus 6.

2.2 Operation of Various Processors

2.2.1 Overview

Operation of the EUV light generation processor 5, the droplet target generation processor 265, and the solid target replenishment processor 85 in the comparative example will be described with reference to FIGS. 6 to 12. The processors operate in cooperation with each other while transmitting and receiving signals.

Figure 6:
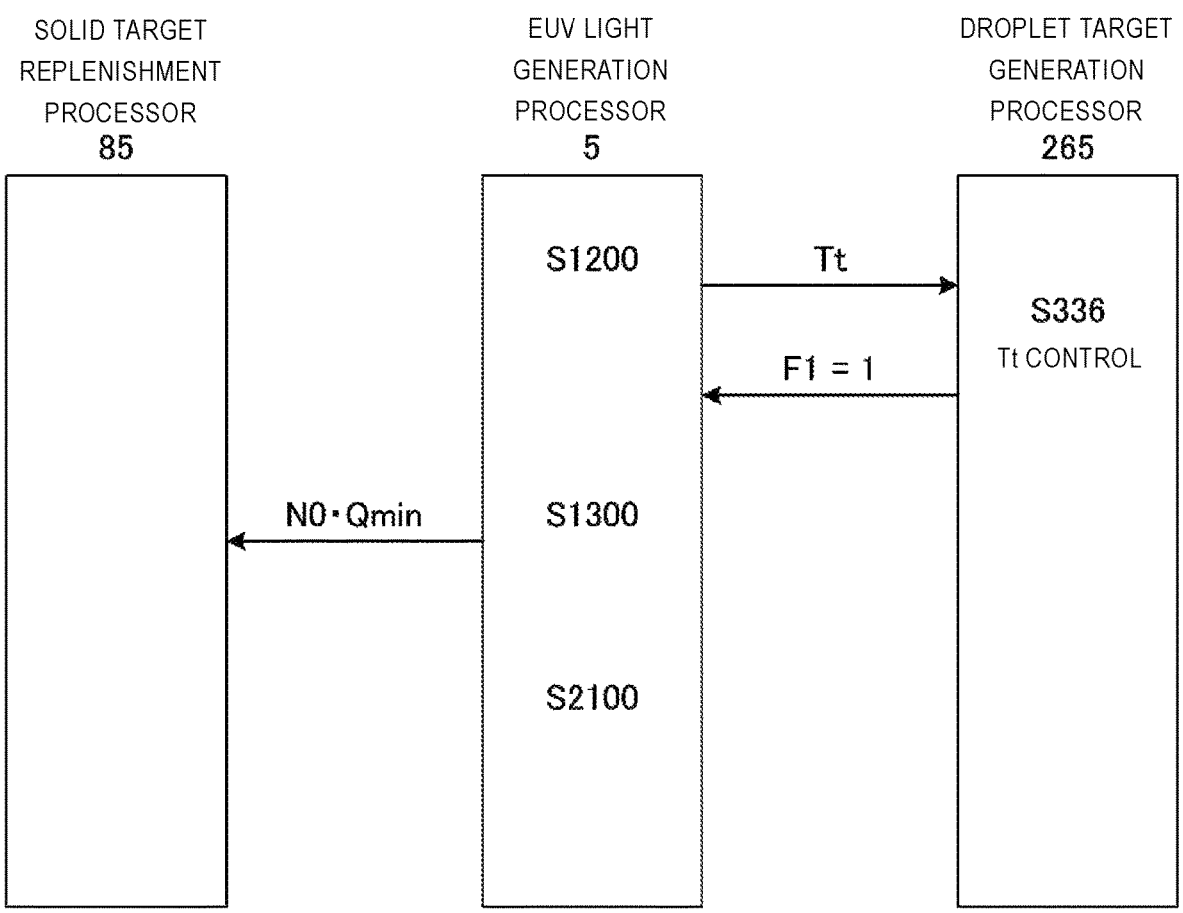
FIG. 6 is a time chart showing an outline of cooperation among an EUV light generation processor, a droplet target generation processor, and a solid target replenishment processor in the comparative example.

FIG. 6 is a time chart showing an outline of cooperation among the EUV light generation processor 5, the droplet target generation processor 265, and the solid target replenishment processor 85 in the comparative example. In FIG. 6, time passes downward from the upper end. The operation of the EUV light generation processor 5 includes S1200 (activation of the droplet target generation device 26), S1300 (activation of the solid target replenishment device 8), and S2100 (generation of EUV light, as described with reference to FIGS. 7 to 9).

In S1200, the EUV light generation processor 5 transmits the target temperature Tt of the tank 260 to the droplet target generation processor 265. As will be described with reference to FIGS. 10 and 11, the droplet target generation processor 265 performs control in accordance with the target temperature Tt in S336, and transmits a flag F1=1 to the EUV light generation processor 5 when the temperature T of the tank 260 is stabilized. Upon receiving the flag F1=1, the EUV light generation processor 5 ends the process of S1200. Here, the process of the droplet target generation processor 265 continues thereafter, and the temperature T of the tank 260 is maintained.

In S1300, the EUV light generation processor 5 sets the one-time solid target replenishment amount Qt to N0·Qmin and transmits the set value to the solid target replenishment processor 85. As described with reference to FIG. 12, when the remaining amount in the tank 260 becomes equal to or less than the lower limit value, the solid target replenishment processor 85 moves the solid target substance 27a of the replenishment amount Qt to the tank 260. The process of the solid target replenishment processor 85 continues thereafter to replenish the solid target substance 27a when the remaining amount in the tank 260 decreases.

In S2100, the EUV light generation processor 5 controls the EUV light generation apparatus 1 to generate the EUV light and output the EUV light to the EUV light utilization apparatus 6. This operation is repeated together with the operation of the droplet target generation processor 265 and the solid target replenishment processor 85 until an EUV light stop signal is received from the EUV light utilization apparatus 6.

2.2.2 Operation of EUV Light Generation Processor 5

Figure 7:
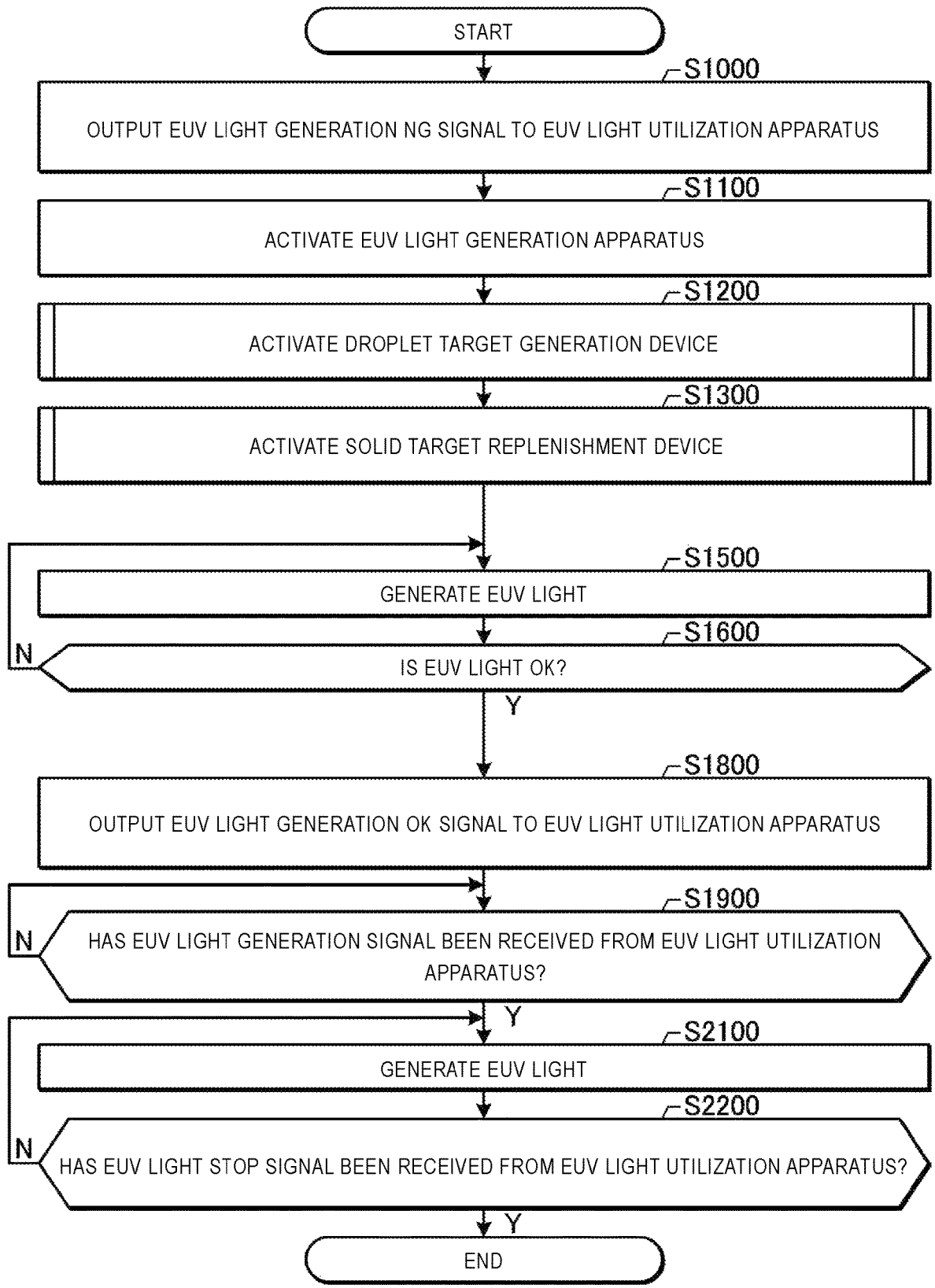
FIG. 7 is a flowchart showing operation of the EUV light generation processor according to the comparative example.

FIG. 7 is a flowchart showing operation of the EUV light generation processor 5 in the comparative example.

In S1000, the EUV light generation processor 5 outputs an EUV light generation NG signal to the EUV light utilization apparatus 6. The EUV light generation NG signal is a valid signal until cancellation thereof is performed in S1800 described later.

In S1100, the EUV light generation processor 5 activates the EUV light generation apparatus 1. The activation of the EUV light generation apparatus 1 includes following operation.
- (a) Activation of various devices such as the EUV sensor 40, the CW laser light source 41, the passage sensor unit 42, the pulse light source 43, and the imaging unit 44
- (b) Setting of various delay times for the pulse light source 43, the imaging unit 44, and the like
- (c) Setting of the target pulse energy of the EUV light
- (d) Activation of the laser device 3

In S1200, the EUV light generation processor 5 activates the droplet target generation device 26. Details of S1200 will be described with reference to FIG. 8.

In S1300, the EUV light generation processor 5 activates the solid target replenishment device 8. Details of S1300 will be described with reference to FIG. 9.

In S1500, the EUV light generation processor 5 controls the EUV light generation apparatus 1 to generate the EUV light. The generation of the EUV light includes following operation.
- (a) Output of a light emission trigger to the laser device 3
- (b) Measurement of pulse energy Eeuv(k) of the EUV light
- (c) Feedback control of pulse energy of the pulse laser light based on the measurement result of the pulse energy Eeuv(k) of the EUV light In S1500, a shutter (not shown) is closed so that the EUV light is not output to the EUV light utilization apparatus 6.

In S1600, the EUV light generation processor 5 determines whether the EUV light is OK, for example, whether or not the pulse energy Eeuv(k) of the EUV light is stable. When the EUV light is not OK (S1600:NO), the EUV light generation processor 5 returns processing to S1500. When the EUV light is OK (S1600:YES), the EUV light generation processor 5 advances processing to S1800. In branches included in the flowchart of the present disclosure, "N" indicates a branch destination in the case of NO and "Y" indicates a branch destination in the case of YES.

In S1800, the EUV light generation processor 5 outputs an EUV light generation OK signal to the EUV light utilization apparatus 6. The EUV light generation NG signal of S1000 is canceled.

In S1900, the EUV light generation processor 5 determines whether or not the EUV light generation signal has been received from the EUV light utilization apparatus 6. When the EUV light generation signal is not received (S1900:NO), processing waits until the EUV light generation signal is received. When the EUV light generation signal is received (S1900:YES), the EUV light generation processor 5 advances processing to S2100.

In S2100, the EUV light generation processor 5 controls the EUV light generation apparatus 1 to generate the EUV light. This process is similar to S1500. However, in S2100, the shutter (not shown) is opened so that the EUV light is output to the EUV light utilization apparatus 6.

In S2200, the EUV light generation processor 5 determines whether or not the EUV light stop signal has been received from the EUV light utilization apparatus 6. When the EUV light stop signal is not received (S2200:NO), the EUV light generation processor 5 returns processing to S2100. When the EUV light stop signal is received (S2200:YES), the EUV light generation processor 5 ends processing of the present flowchart.

Figure 8:
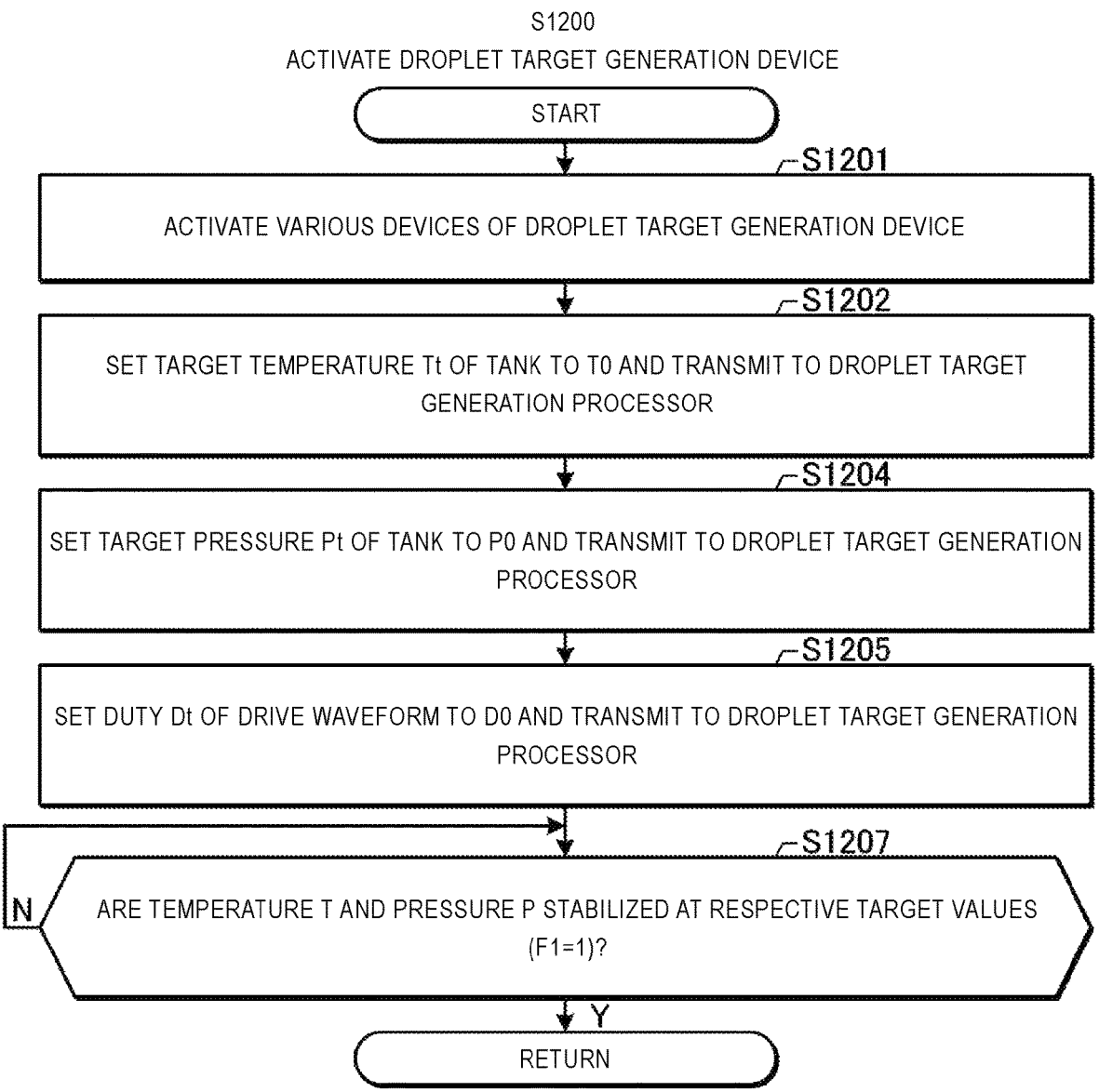
FIG. 8 is a flowchart showing details of the operation of activating the droplet target generation device.

FIG. 8 is a flowchart showing details of the operation of activating the droplet target generation device 26. FIG. 8 corresponds to a subroutine of S1200 of FIG. 7.

In S1201, the EUV light generation processor 5 activates various devices of the droplet target generation device 26.

In S1202, the EUV light generation processor 5 sets the target temperature Tt of the tank 260 to T0 and transmits the target temperature Tt to the droplet target generation processor 265. When the target substance is tin, T0 is, for example, 260° C.

In S1204, the EUV light generation processor 5 sets target pressure Pt of the tank 260 to P0 and transmits the target pressure Pt to the droplet target generation processor 265.

In S1205, the EUV light generation processor 5 sets a duty Dt of the drive waveform of the drive voltage to be applied to the vibration device 269 to D0 and transmits the duty Dt to the droplet target generation processor 265.

Figure 10:
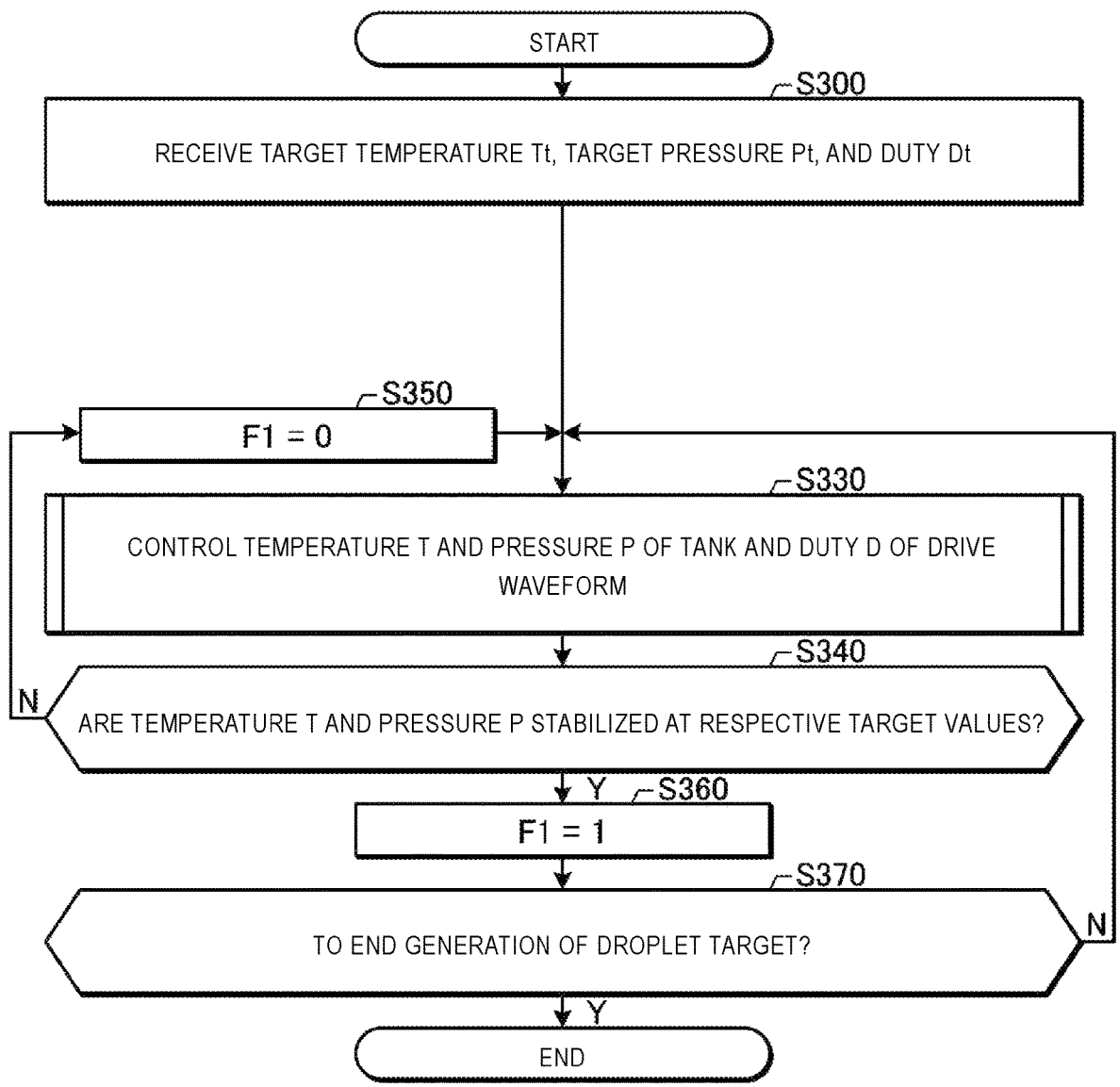
FIG. 10 is a flowchart showing operation of the droplet target generation processor in the comparative example.
Figure 11:
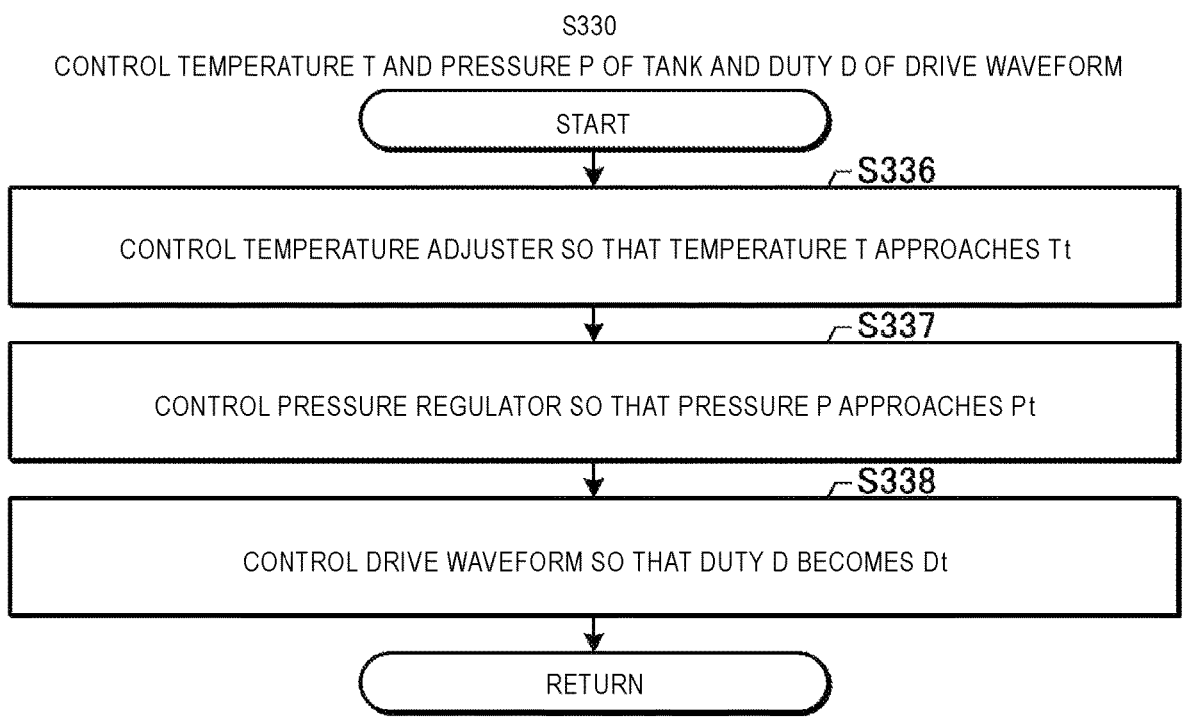
FIG. 11 is a flowchart showing details of the operation of controlling temperature T and pressure P of a tank and a duty D of the drive waveform.

In accordance with the values set in S1202 to S1205, the processing of the droplet target generation processor 265 is performed as in FIGS. 10 and 11.

In S1207, the EUV light generation processor 5 determines whether or not the temperature T and the pressure P of the tank 260 are stabilized at the respective target values. Specifically, the value of the flag F1 is received from the droplet target generation processor 265. When the flag F1 is 0 (S1207:NO), processing waits until the temperature T and the pressure P are stabilized. When the flag F1 is 1 (S1207:YES), it is determined that the temperature T and the pressure P are stabilized, and processing of the present flowchart is ended and returns to the processing shown in FIG. 7.

Figure 9:
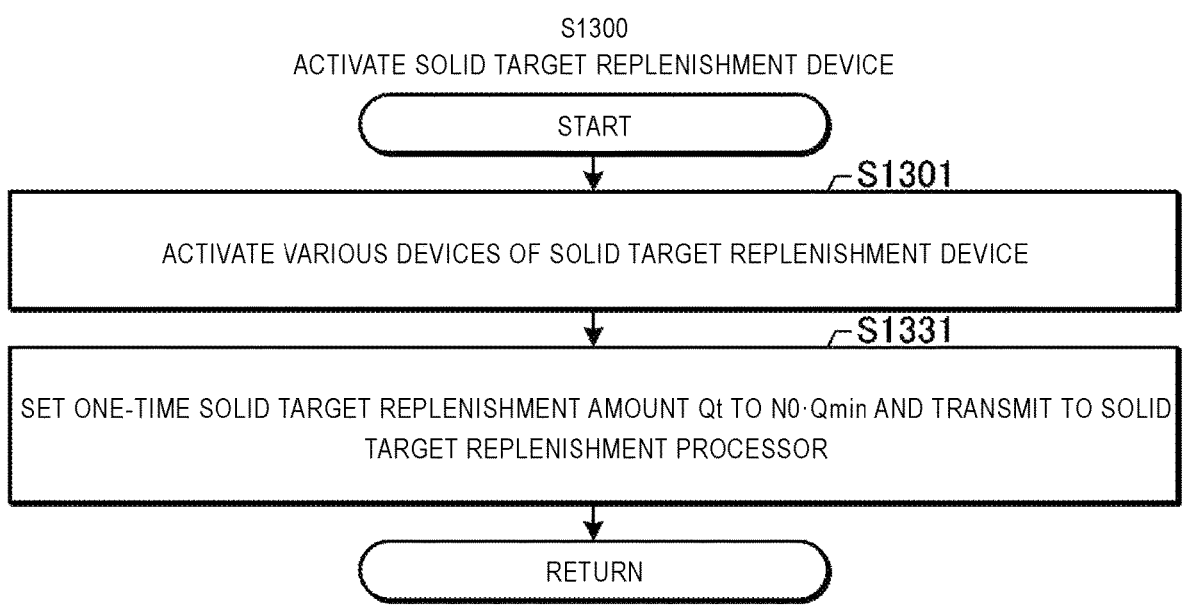
FIG. 9 is a flowchart showing details of the operation of activating a solid target replenishment device.

FIG. 9 is a flowchart showing details of the operation of activating the solid target replenishment device 8. FIG. 9 corresponds to a subroutine of S1300 of FIG. 7.

In S1301, the EUV light generation processor 5 activates various devices of the solid target replenishment device 8.

In S1331, the EUV light generation processor 5 sets the one-time solid target replenishment amount Qt to N0·Qmin and transmits the set value to the solid target replenishment processor 85. Qmin is the mass per one particle of the solid target substance 27a and N0 is the number of particles of the solid target substance 27a set as the one-time replenishment amount.

Figure 12:
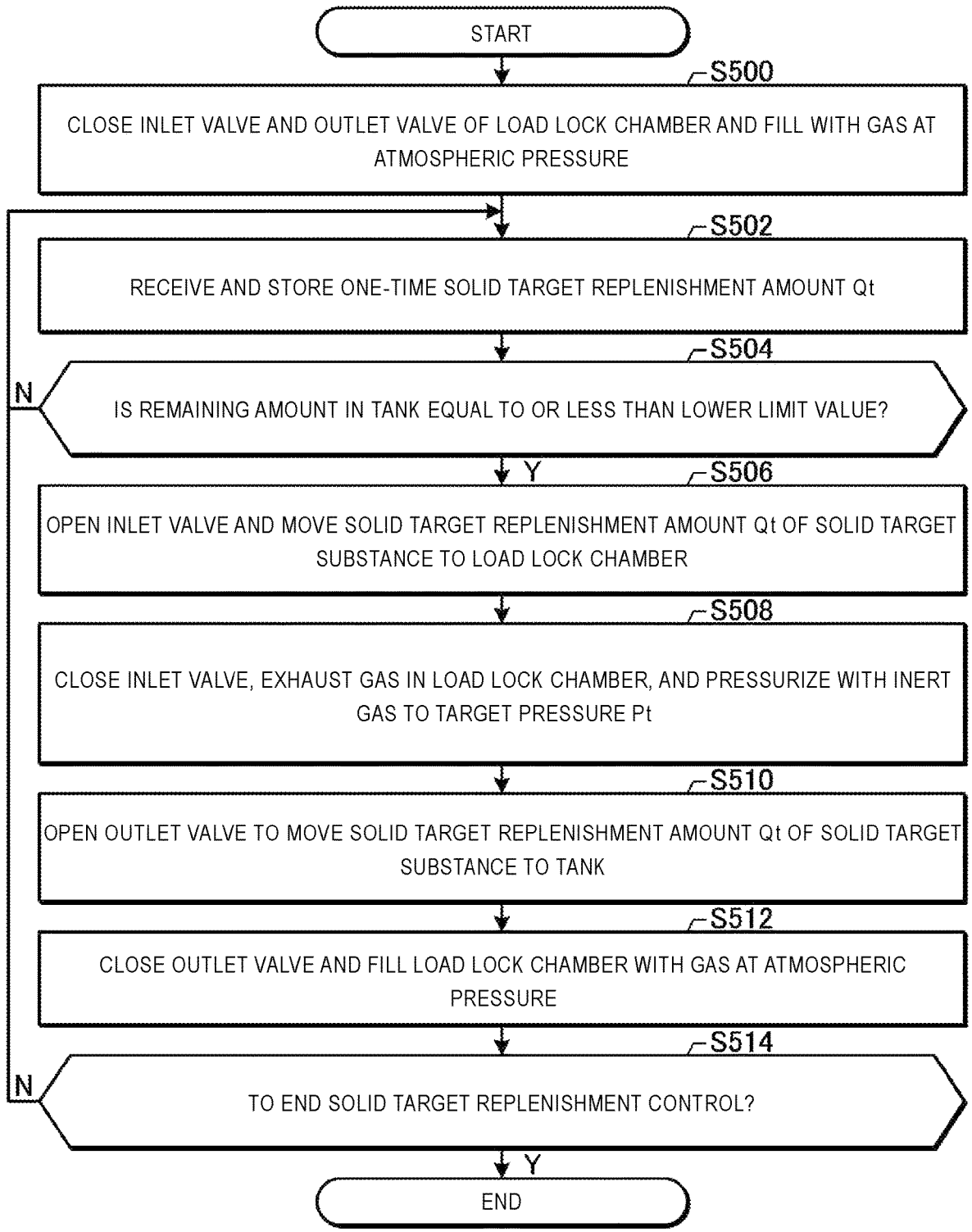
FIG. 12 is a flowchart showing operation of the solid target replenishment processor in the comparative example.

In accordance with the value set in S1331, the processing of the solid target replenishment processor 85 is performed as in FIG. 12.

After S1331, the EUV light generation processor 5 ends the processing of the present flowchart and returns to processing shown in FIG. 7.

2.2.3 Operation of Droplet Target Generation Processor 265

FIG. 10 is a flowchart showing operation of the droplet target generation processor 265 in the comparative example.

In S300, the droplet target generation processor 265 receives the target temperature Tt, the target pressure Pt, and the duty Dt from the EUV light generation processor 5.

In S330, the droplet target generation processor 265 controls the temperature T and the pressure P of the tank 260 and the duty D of the drive waveform. Details of S330 will be described with reference to FIG. 11.

In S340, the droplet target generation processor 265 determines whether or not the temperature T and the pressure P of the tank 260 are stabilized at the respective target values. When the temperature T and the pressure P are not stabilized (S340:NO), the droplet target generation processor 265 sets the flag F1 to 0 in S350 and returns to S330. When the temperature T and the pressure P are stabilized (S340:YES), the droplet target generation processor 265 sets the flag F1 to 1 in S360 and advances processing to S370.

In S370, the droplet target generation processor 265 determines whether or not to end the generation of the droplet target 271. When the EUV light generation processor 5 receives the EUV light stop signal from the EUV light utilization apparatus 6, the generation of the droplet target 271 is to be ended (S370:YES), and the droplet target generation processor 265 ends processing of the present flowchart. When the generation of the droplet target 271 is not to be ended (S370:NO), the droplet target generation processor 265 returns processing to S330. That is, even after the temperature T and the pressure P are stabilized (S340: YES), controlling of the temperature T, the pressure P, and the duty D is performed (S330) as long as the generation of the droplet target 271 is to be performed.

FIG. 11 is a flowchart showing details of the operation of controlling the temperature T and the pressure P of the tank 260 and the duty D of the drive waveform. FIG. 11 corresponds to a subroutine of S330 of FIG. 10.

The droplet target generation processor 265 controls the temperature adjuster 262 so that the temperature T of the tank 260 approaches the target temperature Tt in S336, controls the pressure regulator 261 so that the pressure P of the tank 260 approaches the target pressure Pt in S337, and controls the drive waveform so that the duty D becomes Dt in S338.

Thereafter, the droplet target generation processor 265 ends the processing of the present flowchart and returns to processing shown in FIG. 10.

2.2.4 Operation of Solid Target Replenishment Processor 85

FIG. 12 is a flowchart showing operation of the solid target replenishment processor 85 in the comparative example.

In S500, the solid target replenishment processor 85 closes the inlet valve 861 and the outlet valve 871 of the load lock chamber 89 (see FIG. 3) and fills the inside of the load lock chamber 89 with a gas at the atmospheric pressure.

In S502, the solid target replenishment processor 85 receives and stores the one-time solid target replenishment amount Qt from the EUV light generation processor 5. As in the comparative example, when the replenishment amount Qt is set only once at the time of activation of the solid target replenishment device 8 (see FIG. 9), the replenishment amount Qt may be received only once at the beginning. Processing of the present disclosure in which the replenishment amount Qt is subsequently updated will be described later.

In S504, the solid target replenishment processor 85 determines whether or not the remaining amount of the liquid target substance 27b in the tank 260 is equal to or less than the lower limit value. When the remaining amount is more than the lower limit value (S504:NO), the solid target replenishment processor 85 returns processing to S502. When the remaining amount is equal to or less than the lower limit value (S504:YES), the solid target replenishment processor 85 advances processing to S506.

In S506, the solid target replenishment processor 85 opens the inlet valve 861 and moves the replenishment amount Qt of the solid target substance 27a to the load lock chamber 89.

In S508, the solid target replenishment processor 85 closes the inlet valve 861 and exhausts the gas in the load lock chamber 89. Here, in the case in which the inside of the load lock chamber 89 is filled with atmospheric air, exhausting may be performed until the pressure at which most of the atmospheric air is exhausted is reached. Then, the solid target replenishment processor 85 controls the pressure regulator 88 to pressurize the load lock chamber 89 with the inert gas to the target pressure Pt.

In S510, the solid target replenishment processor 85 opens the outlet valve 871 to move the replenishment amount Qt of the solid target substance 27a to the tank 260 of the droplet target generation device 26. Since the load lock chamber 89 is pressurized to the target pressure Pt, the pressure fluctuation in the tank 260 when the outlet valve 871 is opened is suppressed.

In S512, the solid target replenishment processor 85 closes the outlet valve 871 and fills the load lock chamber 89 with the gas at the atmospheric pressure.

In S514, the solid target replenishment processor 85 determines whether or not to end the solid target replenishment control. When the EUV light generation processor 5 receives the EUV light stop signal from the EUV light utilization apparatus 6, the replenishment of the solid target is to be ended (S514:YES), and the solid target replenishment processor 85 ends processing of the present flowchart. When the replenishment of the solid target is not to be ended (S514:NO), the solid target replenishment processor 85 returns processing to S502. That is, even after the solid target substance 27a is replenished once, the solid target substance 27a is replenished when the remaining amount in the tank 260 becomes again equal to or less than the lower limit value.

2.3 Problem of Comparative Example

Lifetime of each of the inlet valve 861 and the outlet valve 871 included in the load lock device 83 depends on the number of times of opening and closing. Since it is desirable that the number of times of opening and closing is as small as possible, it is desirable that the solid target replenishment amount Qt at one time is as large as possible.

However, it has been found that when the replenishment amount Qt is too large, coalescence failure of the droplet targets 271 occurs. The coalescence failure of the droplet targets 271 is a phenomenon in which the coalescence distance Lc (see FIG. 5) of the droplet target 271 becomes longer than the distance from the opening at the tip of the nozzle 266 of the droplet target generation device 26 to the plasma generation region 25. In this case, the coalescence target 272 without the coalescence thereof completed or the droplet target 271 is irradiated with the pulse laser light 33 in the plasma generation region 25.

When the coalescence failure of the droplet targets 271 occurs, the pulse energy Eeuv(k) of the EUV light unintentionally fluctuates. When the EUV light utilization apparatus 6 is an exposure apparatus, the exposure performance may be adversely affected, and when the EUV light utilization apparatus 6 is an inspection apparatus, the inspection performance may be adversely affected.

In addition, when the coalescence failure of the droplet targets 271 occurs, a large amount of debris of the target substance which is not turned into plasma is generated, and there is a possibility that optical components in the chamber 2 are contaminated.

In some embodiments described below, the tank 260 is replenished with the one-time replenishment amount Qt of the solid target substance 27a such that the coalescence of the droplet targets 271 is completed before the droplet targets 271 reach the plasma generation region 25.

3. REPLENISHMENT AMOUNT Qt SET USING TARGET MEASUREMENT RESULT

3.1 Configuration

Figure 13:
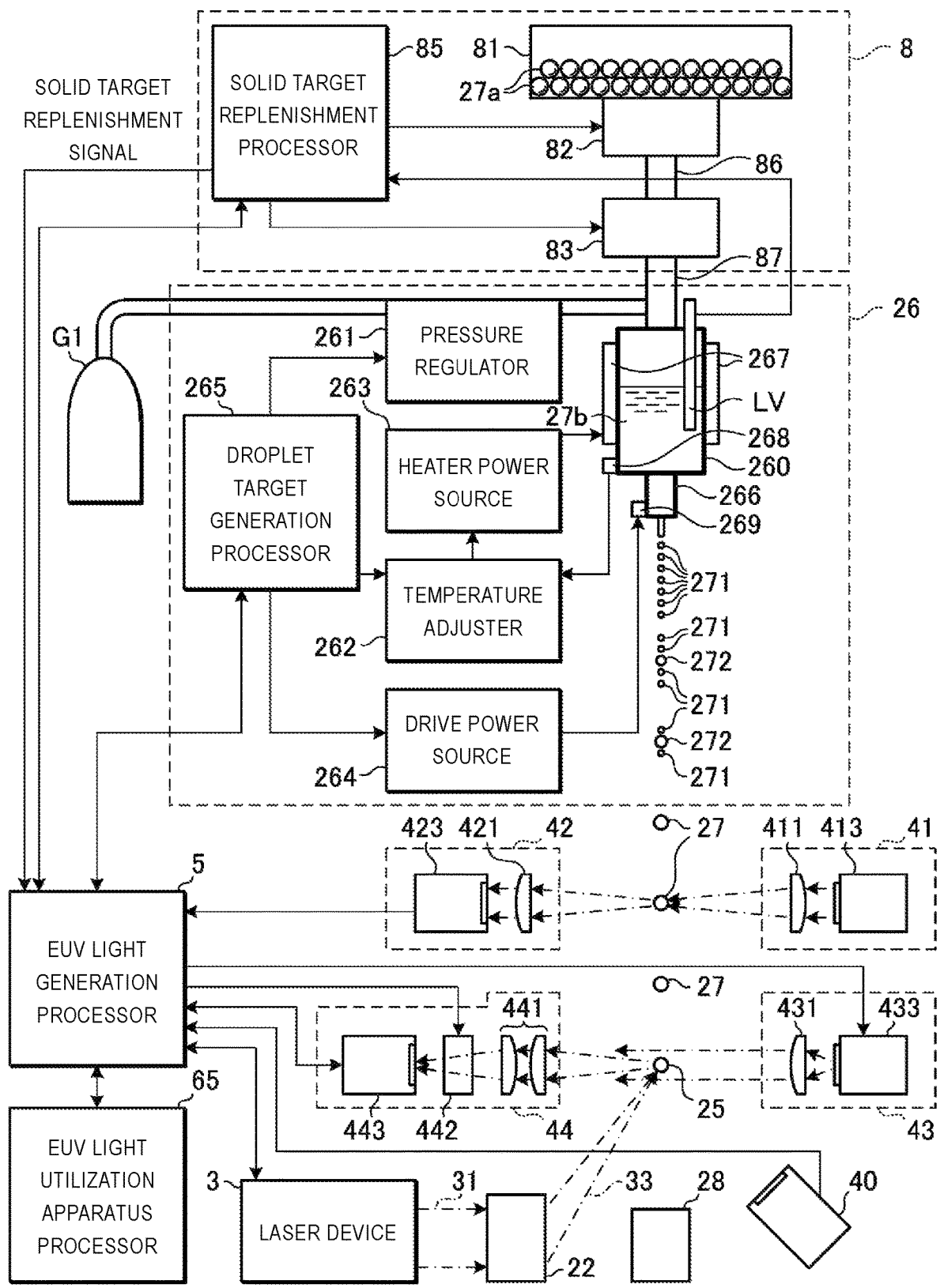
FIG. 13 shows the configuration of the droplet target generation device and the periphery thereof in the EUV light generation system according to a first embodiment.

FIG. 13 shows the configuration of the droplet target generation device 26 and the periphery thereof in an EUV light generation system 11 according to a first embodiment. In the first embodiment, a signal line for transmitting a solid target replenishment signal from the solid target replenishment processor 85 to the EUV light generation processor 5 is arranged. In other respects, the configuration of the first embodiment is similar to that of the comparative example.

3.2 Operation of Various Processors

3.2.1 Overview

Operation of the EUV light generation processor 5, the droplet target generation processor 265, and the solid target replenishment processor 85 in the first embodiment will be described with reference to FIGS. 14 to 20.

Figure 14:
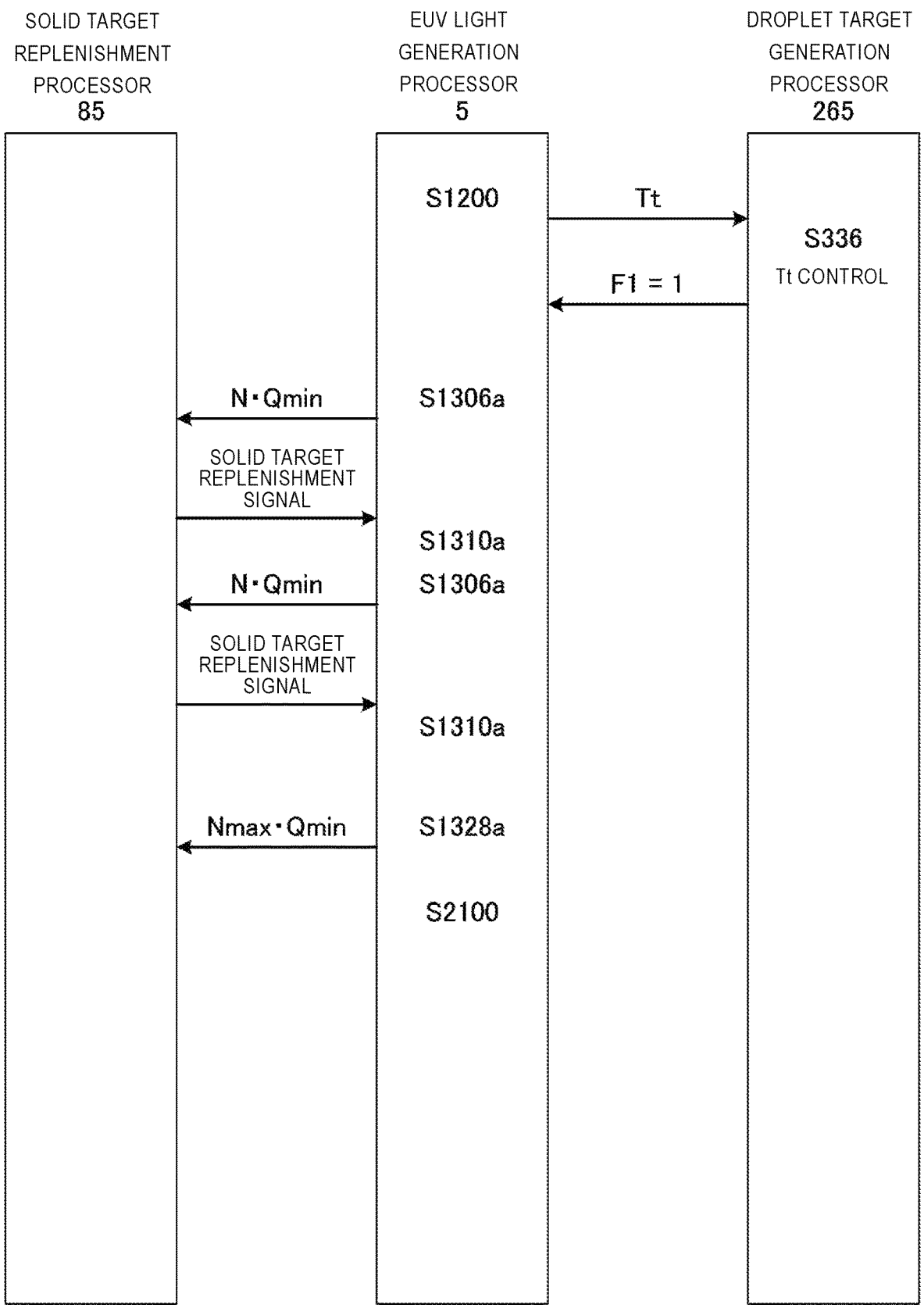
FIG. 14 is a time chart showing an outline of cooperation among the EUV light generation processor, the droplet target generation processor, and the solid target replenishment processor in the first embodiment.

FIG. 14 is a time chart showing an outline of cooperation among the EUV light generation processor 5, the droplet target generation processor 265, and the solid target replenishment processor 85 in the first embodiment.

The processing in which the EUV light generation processor 5 activates the droplet target generation device 26 in S1200 and the processing in which the droplet target generation processor 265 performs control according to the target temperature Tt in S336 are similar to those in the comparative example.

As described with reference to FIGS. 15 to 19, the operation of the EUV light generation processor 5 includes S1306a (transmission of a trial replenishment amount N·Qmin), S1310a (measurement of the droplet target 271), and S1328a (transmission of a replenishment amount Nmax·Qmin) included in S1300a (activation of the solid target replenishment device 8).

(a) In S1306a, the EUV light generation processor 5 sets the one-time solid target replenishment amount Qt to the trial replenishment amount N·Qmin and transmits the set value to the solid target replenishment processor 85.

(b) As described with reference to FIG. 20, when the remaining amount in the tank 260 becomes equal to or less than the lower limit value, the solid target replenishment processor 85 moves the replenishment amount Qt, set to the trial replenishment amount N·Qmin, of the solid target substance 27a to the tank 260, and also transmits the solid target replenishment signal.

(c) Upon receiving the solid target replenishment signal, the EUV light generation processor 5 measures the coalescence target 272 in S1310a, and determines whether or not the coalescence is completed.

Thereafter, the operation of (a) to (c) is repeated as adding 1 to the value of N. In S1328a, the EUV light generation processor 5 sets the one-time solid target replenishment amount Qt to Nmax·Qmin and transmits the set value to the solid target replenishment processor 85.

The process in which the EUV light generation processor 5 generates the EUV light in S2100 is similar to that in the comparative example. When the remaining amount in the tank 260 becomes equal to or less than the lower limit value, the solid target replenishment processor 85 moves the replenishment amount Qt, set to Nmax·Qmin, of the solid target substance 27a to the tank 260. Such operation is repeated until the EUV light stop signal is received from the EUV light utilization apparatus 6.

3.2.2 Operation of EUV Light Generation Processor 5

FIG. 5 is a flowchart showing operation of the EUV light generation processor 5 in the first embodiment. The difference between the comparative example and the first embodiment is that the process of S1300a is performed instead of S1300 as the process to activate the solid target replenishment device 8.

Figure 15:
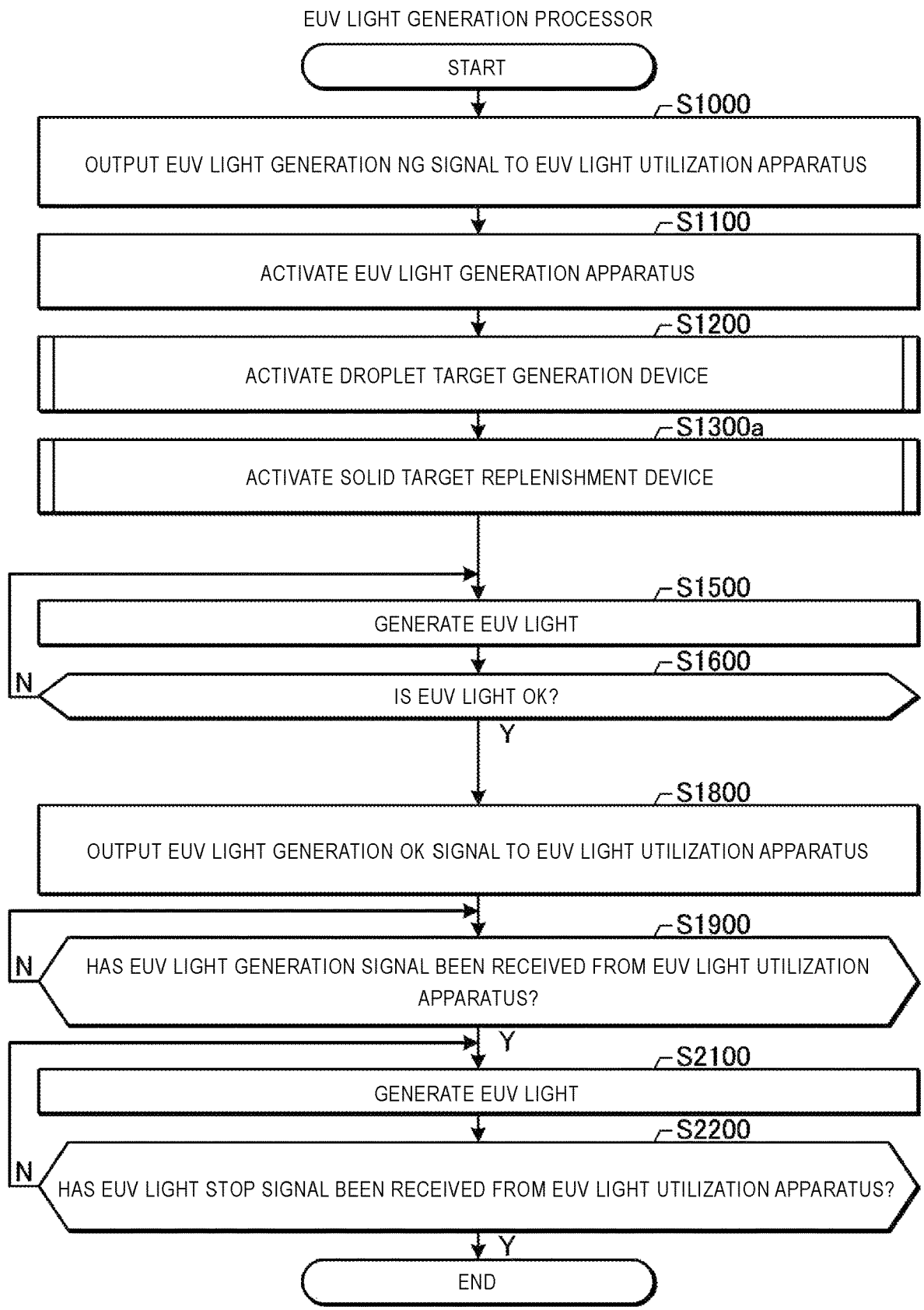
FIG. 15 is a flowchart showing operation of the EUV light generation processor in the first embodiment.
Figure 16:
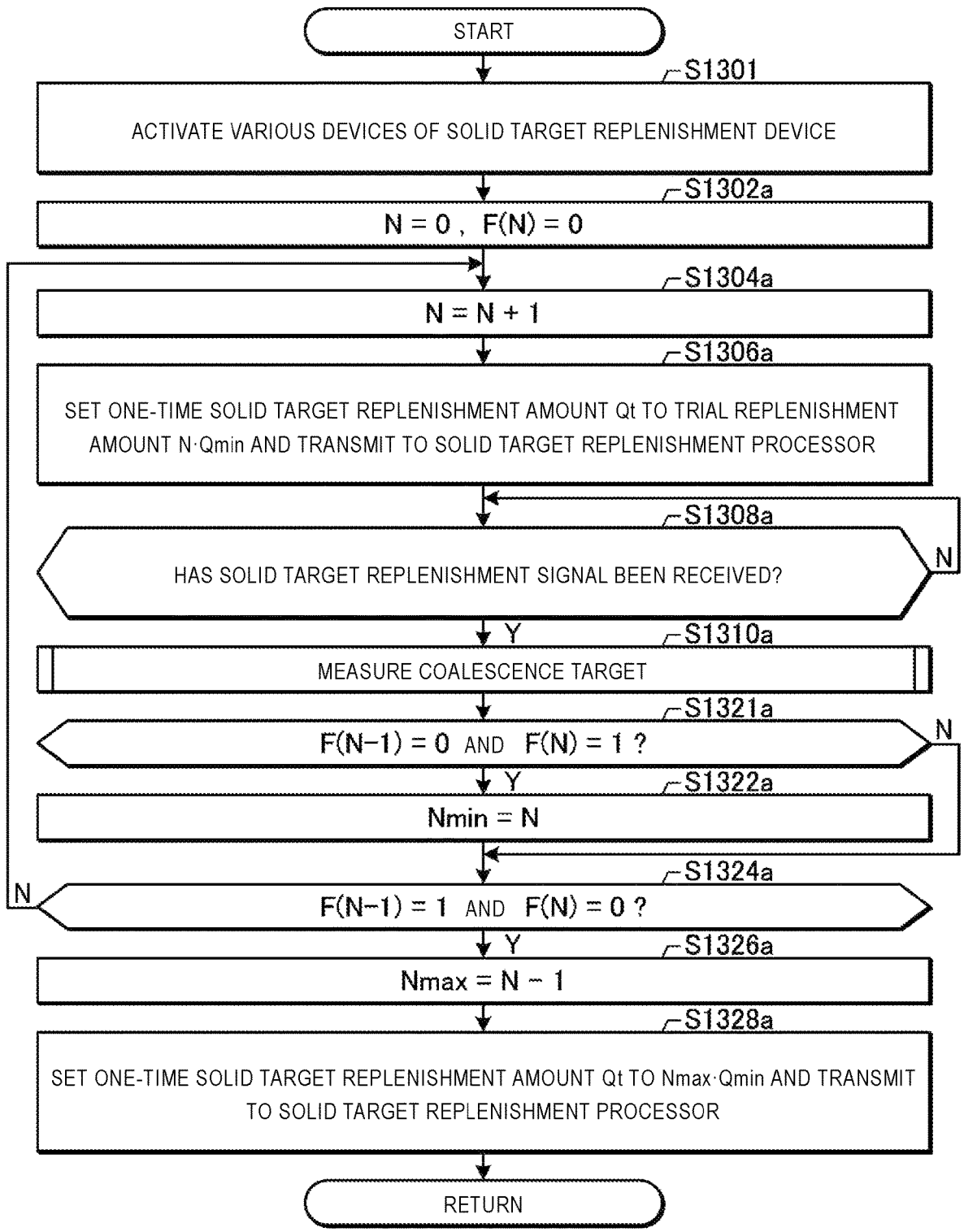
FIG. 16 is a flowchart showing details of the operation of activating the solid target replenishment device.

FIG. 16 is a flowchart showing details of the operation of activating the solid target replenishment device 8. FIG. 16 corresponds to a subroutine of S1300a of FIG. 15. In S1301, the EUV light generation processor 5 activates various devices similarly to the comparative example.

In S1302a, the EUV light generation processor 5 sets the value of a counter N indicating the number of particles of the solid target substance 27a to 0, and sets a flag F(N) indicating the coalescence state when the value of N is 0 to 0.

In S1304a, the EUV light generation processor 5 adds 1 to the value of N to update the value of N. In S1306a, the EUV light generation processor 5 sets the one-time solid target replenishment amount Qt to the trial replenishment amount N·Qmin, and transmits the set value to the solid target replenishment processor 85.

In S1308a, the EUV light generation processor 5 determines whether or not the solid target replenishment signal has been received from the solid target replenishment processor 85. When the solid target replenishment signal is not received (S1308a:NO), the EUV light generation processor 5 waits until the solid target replenishment signal is received. When the solid target replenishment signal is received (S1308a:YES), the EUV light generation processor 5 advances processing to S1310a.

In S1310a, the EUV light generation processor 5 measures the coalescence target 272 and detects the coalescence state. When coalescence failure occurs, the flag F(N) is set to 0, and when the coalescence is completed, the flag F(N) is set to 1. Details of S1310a will be described with reference to FIGS. 17 to 19.

In S1321a, the EUV light generation processor 5 determines whether or not the previous flag F(N−1) and the current flag F(N) are 0 and 1, respectively. When F(N−1) and F(N) are 0 and 1, respectively (S1321a:YES), the EUV light generation processor 5 advances processing to S1322a. Otherwise (S1321a:NO), the EUV light generation processor 5 advances processing to S1324a.

In S1322a, the EUV light generation processor 5 sets the minimum value Nmin of the number of particles of the solid target substance 27a that are completely coalesced to the current value N. The minimum value Nmin is a value of N when the state of the coalescence is measured while increasing N one by one in S1304a and the state is shifted from the coalescence failure (F(N−1)=0) to the coalescence completion (F(N)=1) in S1321a.

Note that the first embodiment differs from the fourth embodiment in that the process of the droplet target generation processor 265 is not changed when the coalescence target 272 is measured (S1310a) in order to determine the one-time solid target replenishment amount Qt. Therefore, it is likely that the coalescence is completed when N is 1 and the minimum value Nmin is to be 1.

In S1324a, the EUV light generation processor 5 determines whether or not the previous flag F(N−1) and the current flag F(N) are 1 and 0, respectively. When F(N−1) and F(N) are 1 and 0, respectively (S1324a:YES), the EUV light generation processor 5 advances processing to S1326a. Otherwise (S1324a:NO), the EUV light generation processor 5 returns processing to S1304a.

In S1326a, the EUV light generation processor 5 sets the maximum value Nmax of the number of particles of the solid target substance 27a that are completely coalesced to N−1 that is the previous value of N. The maximum value Nmax is a value of N−1 when the state of the coalescence is measured while increasing N one by one in S1304a and the state is shifted from the coalescence completed (F(N−1)=1) to the coalescence failure (F(N)=0) in S1324a.

In S1328a, the EUV light generation processor 5 sets the one-time solid target replenishment amount Qt to Nmax·Qmin and transmits the set value to the solid target replenishment processor 85.

After S1328a, the EUV light generation processor 5 ends the processing of the present flowchart and returns to processing shown in FIG. 15.

Figure 17:
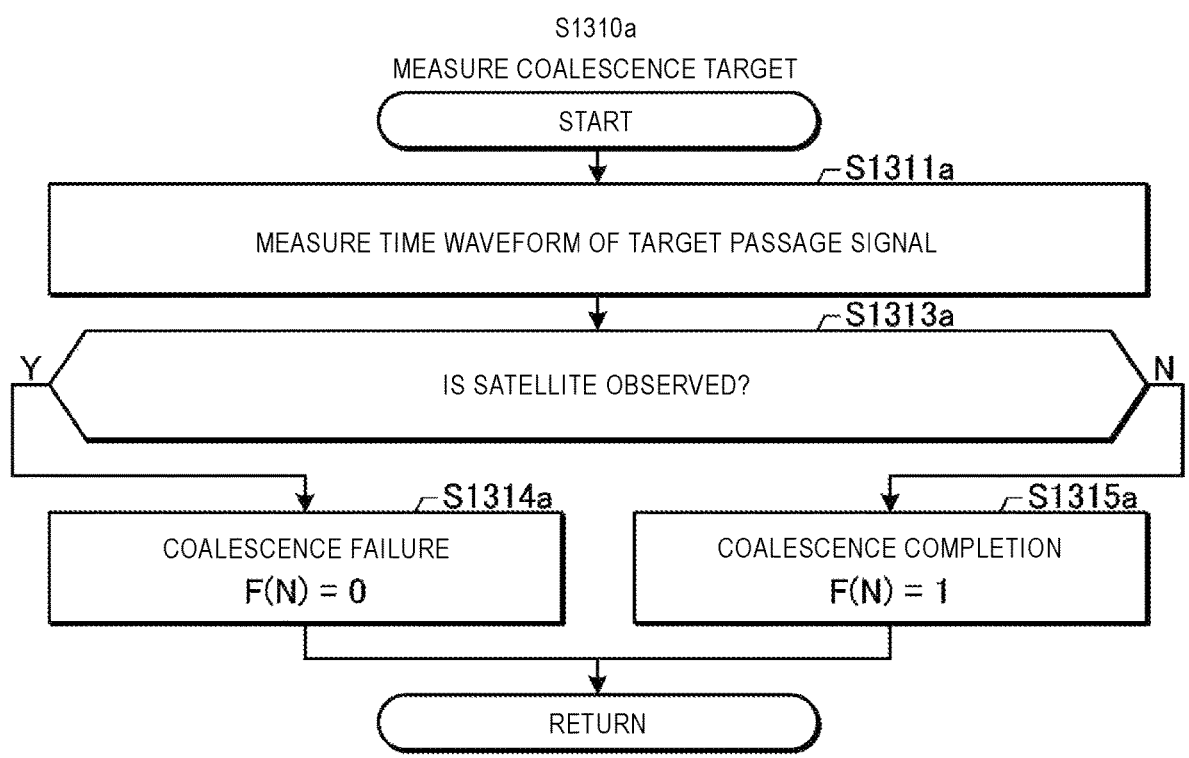
FIG. 17 is a flowchart showing details of the operation of measuring a coalescence target.

FIG. 17 is a flowchart showing details of the operation of measuring the coalescence target 272. FIG. 17 corresponds to a subroutine of S1310a of FIG. 16.

In S1311a, the EUV light generation processor 5 measures the time waveform of the target passage signal.

In S1313a, the EUV light generation processor 5 determines whether or not a satellite is observed from the target passage signal.

When a satellite is observed (S1313a:YES), the EUV light generation processor 5 advances processing to S1314a. In S1314a, the EUV light generation processor 5 determines that the coalescence failure occurs and sets the value of the flag F(N) to 0.

When a satellite is not observed (S1313a:NO), the EUV light generation processor 5 advances processing to S1315a. In S1315a, the EUV light generation processor 5 determines that the coalescence is completed and sets the value of the flag F(N) to 1.

After S1314a or S1315a, the EUV light generation processor 5 ends the processing of the present flowchart and returns to processing shown in FIG. 16.

Figure 18:
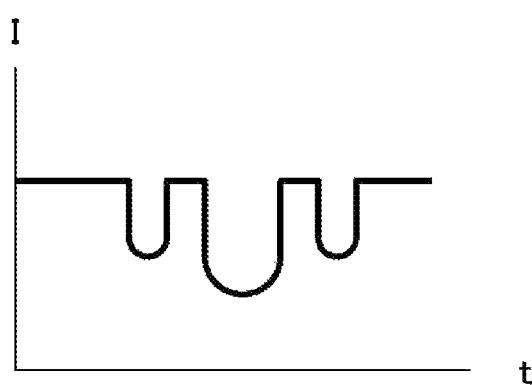
FIG. 18 is a graph showing an example of a time waveform of a target passage signal.

FIG. 18 is a graph showing an example of a time waveform of the target passage signal. In FIG. 18, the horizontal axis represents time t, and the vertical axis represents light intensity I. The time waveform of the target passage signal normally has high light intensity I, but the light intensity I decreases only when the droplet target 271 or the coalescence target 272 passes. As shown in FIG. 18, when a target passage signal including a portion in which the light intensity I is slightly decreased before and/or after a portion in which the light intensity I is greatly decreased is obtained, it is determined that coalescence failure occurs in the S1314a since the droplet target 271 which is a satellite is present before and/or after the coalescence target 272.

Figure 19:
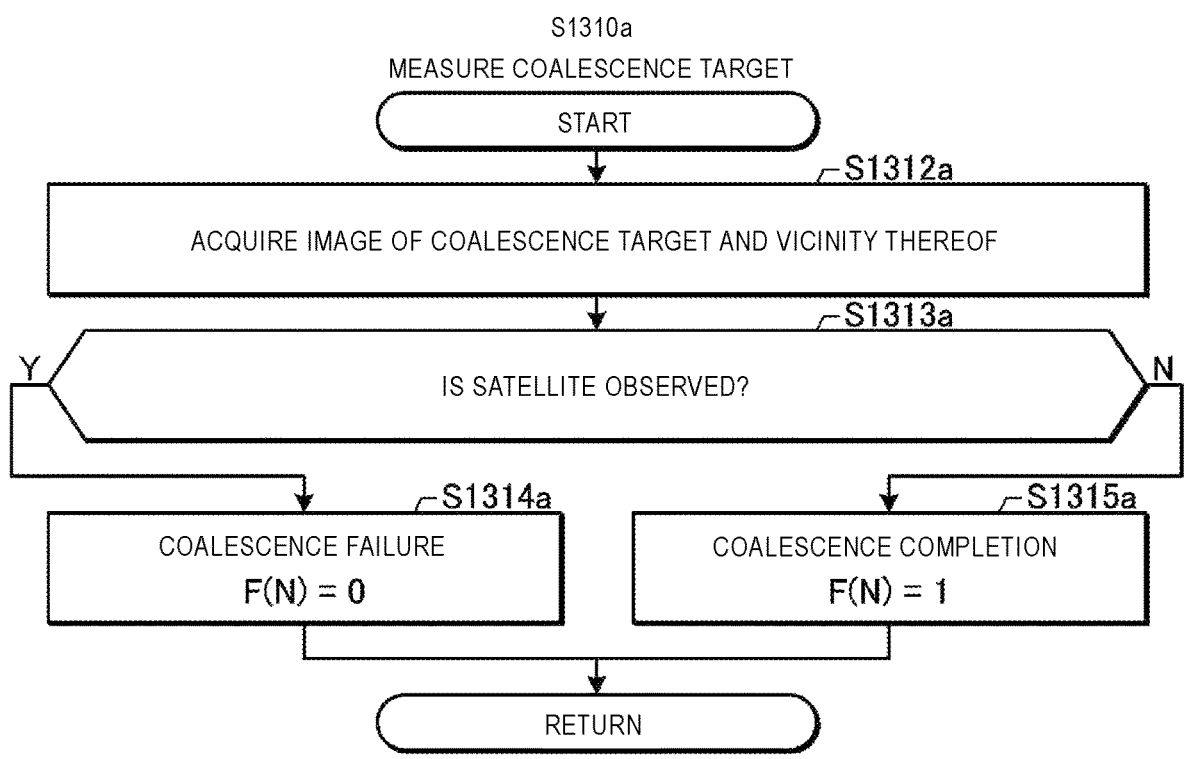
FIG. 19 is a flowchart showing other operation of measuring the coalescence target.

FIG. 19 is a flowchart showing other operation of measuring the coalescence target 272. FIG. 19 corresponds to a subroutine of S1310a of FIG. 16.

In S1312a, the EUV light generation processor 5 acquires an image of the coalescence target 272 and the vicinity thereof.

The processes of S1313a to S1315a are similar to those described with reference to FIG. 17.

3.2.3 Calculation Example of Lower Limit Value of Replenishment Amount Qt

In FIGS. 16 to 19, description has been provided on a case in which the maximum value Nmax·Qmin of the trial replenishment amount N·Qmin at which the coalescence of the droplet targets 271 is completed is set as the one-time replenishment amount Qt of the solid target substance 27a, but the replenishment amount Qt is not limited thereto. When the lifetime of the inlet valve 861 and the outlet valve 871 included in the load lock device 83 is sufficiently long, the replenishment amount Qt is simply required to be in a range of Nmin·Qmin to Nmax·Qmin. Nmin·Qmin is the minimum value of the trial replenishment amount N·Qmin at which the coalescence of the droplet targets 271 is completed, and is calculated using Nmin obtained in S1322a.

Description has been provided on a case in which replenishment timing of the solid target substance 27a is determined based on the output of the level sensor LV, but the present disclosure is not limited thereto. A replenishment cycle Ts may be set in advance, and the replenishment timing of the solid target substance 27a may be determined based on whether or not the time of the replenishment cycle Ts has elapsed from the previous replenishment.

The output amount Qv of the liquid target substance 27b per unit time at the nozzle 266 is constant as long as the pressure difference between the inside of the tank 260 and the inside of the chamber 2 and the size of the opening of the nozzle 266 are kept the same. Therefore, the replenishment cycle Ts can be calculated by the following equation.

$$Ts=Qt/Qv$$

Here, the number of times the inlet valve 861 and the outlet valve 871 included in the load lock device 83 can be opened and closed, that is, the lifetime of these valves, is represented as Nb times. When these valves are opened and closed at the replenishment cycle Ts, the lifetime Life of these valves can be calculated by the following equation.

$$Life=Ts \cdot Nb=(Qt/Qv) \cdot Nb$$

Therefore, the replenishment amount Qt is given by the following equation.

$$Qt=(Life/Nb) \cdot Qv$$

When the replacement cycle of the load lock device 83 is desired to be one year or more, a minimum value Q1y of the replenishment amount Qt of the solid target substance 27a can be calculated as follows.

$$Q1y=(365 \cdot 24 \cdot 3600/Nb) \cdot Qv$$

3.2.4 Operation of Solid Target Replenishment Processor 85

Figure 20:
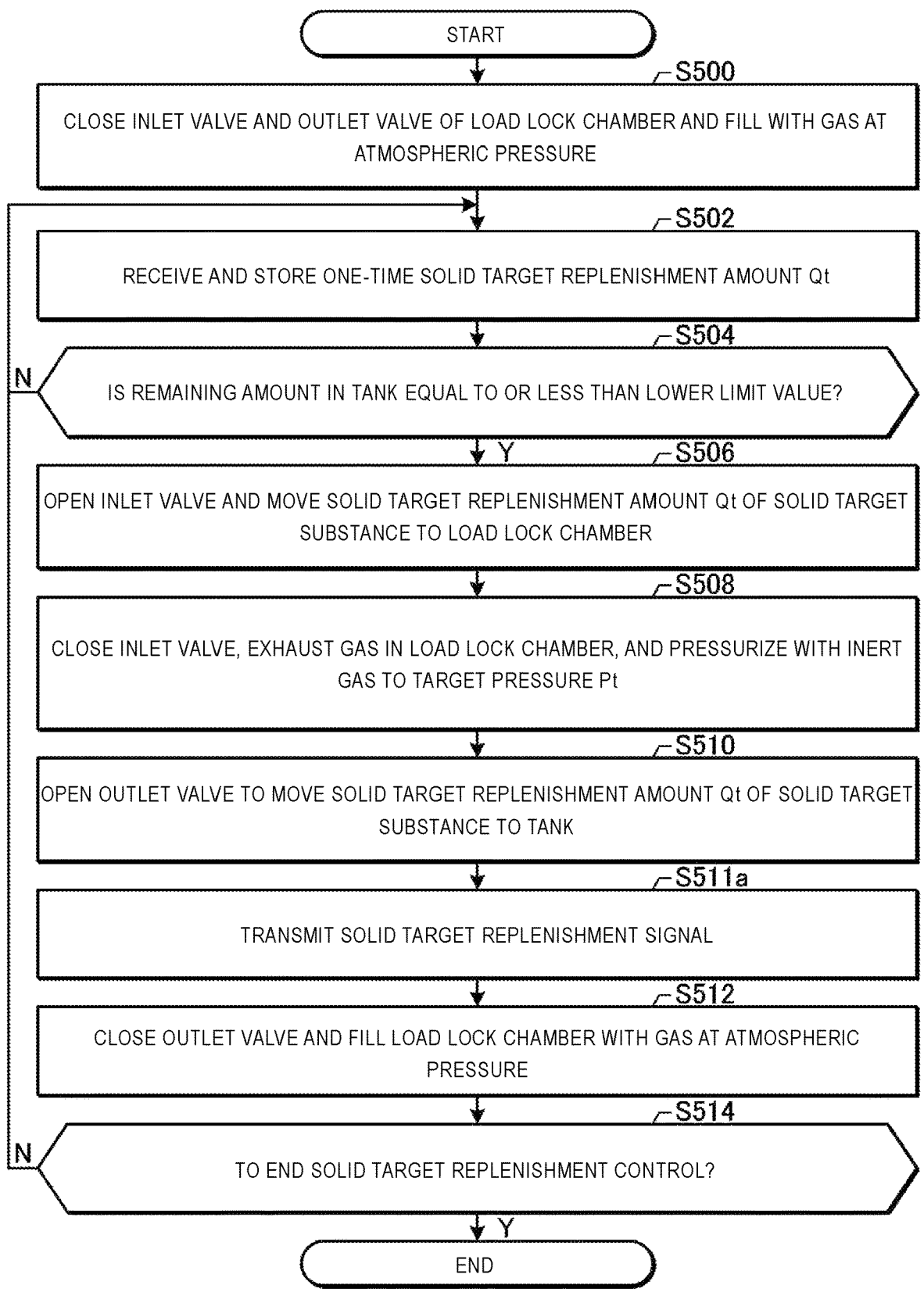
FIG. 20 is a flowchart showing operation of the solid target replenishment processor in the first embodiment.

FIG. 20 is a flowchart showing operation of the solid target replenishment processor 85 in the first embodiment. The difference between the comparative example and the first embodiment is that after moving the solid target substance 27a in S510, in the first embodiment, a process of transmitting the solid target replenishment signal to the EUV light generation processor 5 in S511a is added.

In other respects, the first embodiment is similar to the comparative example.

3.3 Effect (1) According to the first embodiment, the EUV light generation apparatus 1 includes the droplet target generation device 26 and the solid target replenishment device 8. The droplet target generation device 26 includes the tank 260 that melts the solid target substance 27a to generate the liquid target substance 27b, and the nozzle 266 that continuously generates the droplet target 271 from the liquid target substance 27b in the tank 260 and outputs the droplet target 271 toward the plasma generation region where the pulse laser light 33 is concentrated, and provides a velocity difference to the plurality of droplet targets 271 such that the plurality of droplet targets 271 coalesce. The solid target replenishment device 8 replenishes the tank 260 with the one-time replenishment amount Qt of the solid target substance 27a such that the coalescence of the plurality of droplet targets 271 is completed before the plurality of droplet targets 271 reach the plasma generation region 25.

Accordingly, by setting the replenishment amount Qt such that coalescence failure of the droplet target 271 is suppressed when the solid target substance 27a is supplied to the tank 260, deterioration of the pulse energy stability Eσ of the EUV light can be suppressed.

Further, since coalescence failure is suppressed, generation of debris of the target substance can be suppressed.

When the target substance is tin, a desirable range of the one-time replenishment amount Qt of the solid target substance 27a at which the coalescence is completed before the solid target substance 27a reaches the plasma generation region 25 is expressed as 0.112 cm$^3$ or more and 0.336 cm$^3$ or less in volume, and 0.825 g or more and 2.475 g or less in mass.

(2) According to the first embodiment, the EUV light generation apparatus 1 includes the solid target replenishment processor 85 that stores the replenishment amount Qt and controls the solid target replenishment device 8 according to the stored replenishment amount Qt.

Accordingly, by controlling the replenishment amount Qt, it is possible to flexibly cope with a change in the operation environment of the EUV light generation apparatus 1.

(3) According to the first embodiment, the EUV light generation apparatus 1 includes the passage sensor unit 42 or the imaging unit 44, the EUV light generation processor 5, and the solid target replenishment processor 85. The passage sensor unit 42 or the imaging unit 44 detects the state of the coalescence of the plurality of droplet targets 271 in synchronization with the replenishment of the solid target substance 27a from the solid target replenishment device 8 to the tank 260. The EUV light generation processor 5 determines the replenishment amount Qt based on the detection result of the passage sensor unit 42 or the imaging unit 44, and the solid target replenishment processor 85 controls the solid target replenishment device 8 in accordance with the replenishment amount Qt.

Accordingly, it is possible to determine the appropriate replenishment amount Qt by detecting the state of the coalescence of the droplet targets 271 and determining the replenishment amount Qt based on the detection result.

(4) According to the first embodiment, the EUV light generation apparatus 1 includes the optical sensor 423 for outputting the passage signal of the droplet target 271.

Accordingly, even without generating EUV light, by observing the presence or absence of the satellite by the optical sensor 423, it is possible to directly measure the state of the coalescence and determine the appropriate replenishment amount Qt.

(5) According to the first embodiment, while increasing the trial replenishment amount N·Qmin of the solid target substance 27a from the solid target replenishment device 8 to the tank 260, the EUV light generation processor 5 acquires the passage signal of the droplet target 271 output from the optical sensor 423 in synchronization with the replenishment of the solid target substance 27a from the solid target replenishment device 8 to the tank 260. The EUV light generation processor 5 determines, as the replenishment amount Qt, the maximum value Nmax·Qmin of the trial replenishment amount N·Qmin in the case in which the coalescence of the droplet targets 271 is completed.

Accordingly, by measuring the state of the coalescence by the optical sensor 423 while increasing the trial replenishment amount N·Qmin, it is possible to accurately determine the range of the replenishment amount Qt in which the coalescence is completed. Then, by setting the maximum value Nmax·Qmin of the trial replenishment amount N·Qmin in the case in which the coalescence is completed as the one-time replenishment amount Qt, it is possible to suppress an increase in the number of times of replenishment and to suppress a decrease in the lifetime of the solid target replenishment device 8.

(6) According to the first embodiment, the EUV light generation apparatus 1 includes the image sensor 443 that captures an image of the droplet target 271.

Accordingly, even without generating EUV light, by observing the presence or absence of the satellite by the image sensor 443, it is possible to directly measure the state of the coalescence and determine the appropriate replenishment amount Qt.

(7) According to the first embodiment, while increasing the trial replenishment amount N·Qmin of the solid target substance 27a from the solid target replenishment device 8 to the tank 260, the EUV light generation processor 5 acquires the image of the droplet target 271 captured by the image sensor 443 in synchronization with the replenishment of the solid target substance 27a from the solid target replenishment device 8 to the tank 260. The EUV light generation processor 5 determines, as the replenishment amount Qt, the maximum value Nmax·Qmin of the trial replenishment amount N·Qmin in the case in which the coalescence of the droplet targets 271 is completed.

Accordingly, by measuring the state of the coalescence by the the image sensor 443 while increasing the trial replenishment amount N·Qmin, it is possible to accurately determine the range of the replenishment amount Qt in which the coalescence is completed. Then, by setting the maximum value Nmax·Qmin of the trial replenishment amount N·Qmin in the case in which the coalescence is completed as the one-time replenishment amount Qt, it is possible to suppress an increase in the number of times of replenishment and to suppress a decrease in the lifetime of the solid target replenishment device 8.

In other respects, the first embodiment is similar to the comparative example.

4. REPLENISHMENT AMOUNT Qt SET USING TARGET MEASUREMENT SYSTEM

4.1 Configuration

Figure 21:
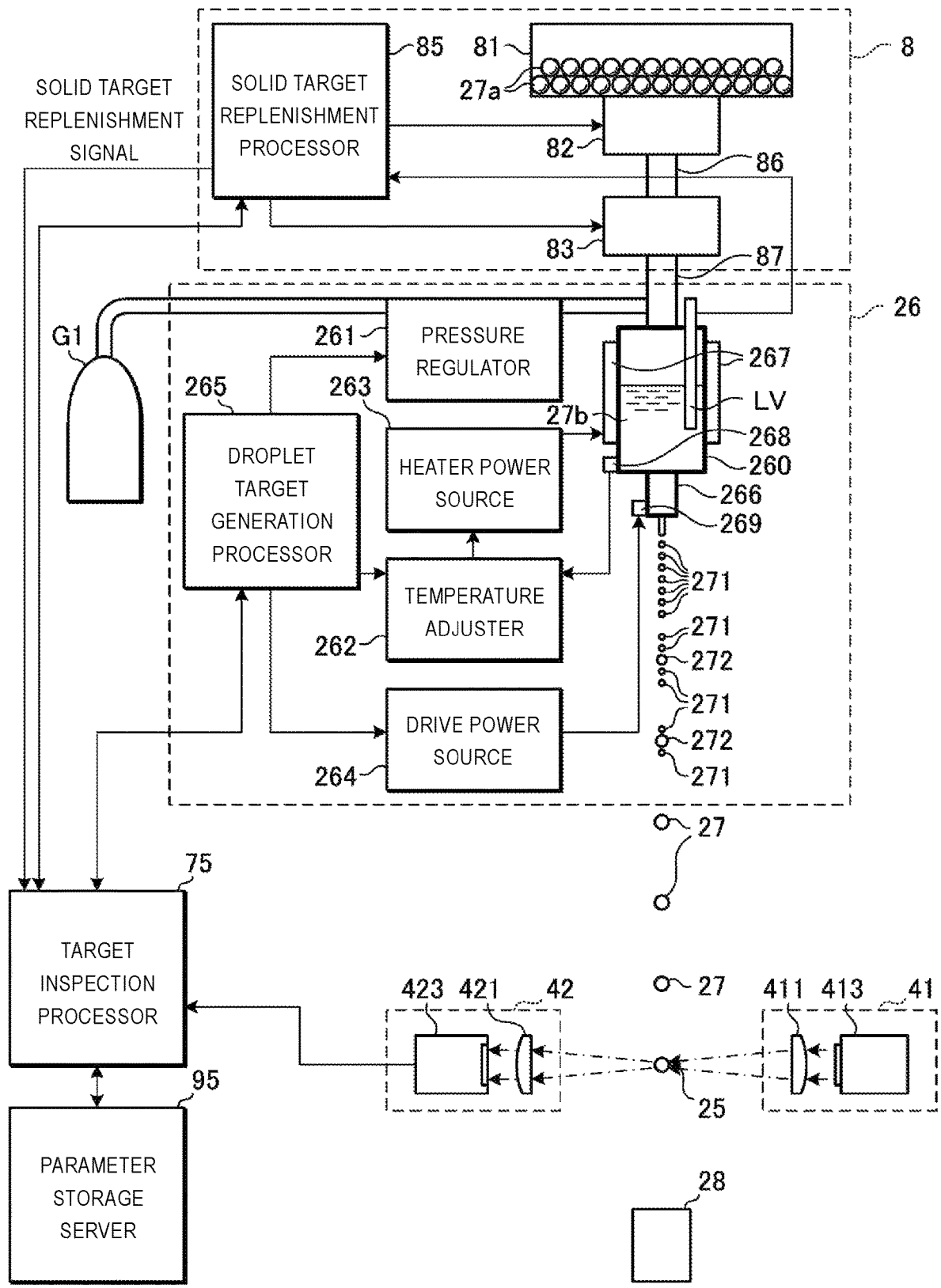
FIG. 21 schematically shows the configuration of the target measurement system used in a second embodiment.

FIG. 21 schematically shows the configuration of the target measurement system used in a second embodiment. The target measurement system includes the droplet target generation device 26, the solid target replenishment device 8, the CW laser light source 41, and the passage sensor unit 42. These components are similar to those in the first embodiment. Further, instead of the EUV light generation processor 5, the target measurement system includes a target inspection processor 75 having a similar configuration to that of the EUV light generation processor 5.

The target measurement system may not include some of the components required to generate the EUV light. For example, the target measurement system may not include the laser device 3, the laser light concentrating mirror 22, or the like.

4.2 Operation

Figure 22:
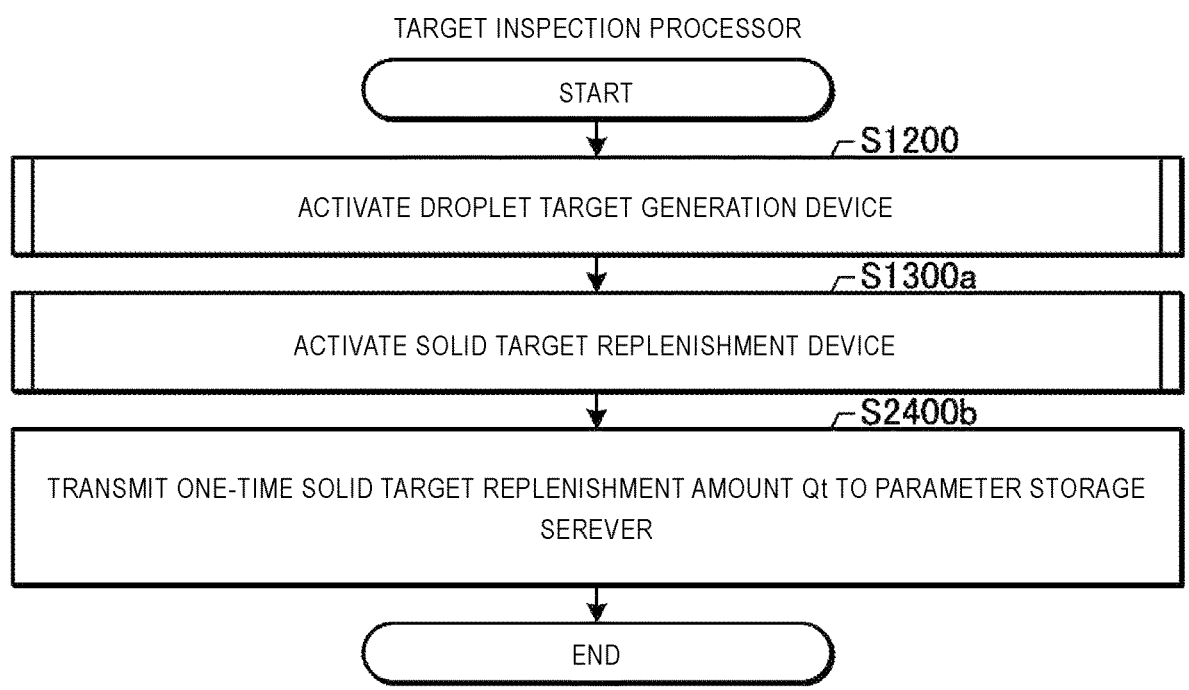
FIG. 22 is a flowchart showing operation of a target inspection processor in the second embodiment.

FIG. 22 is a flowchart showing operation of the target inspection processor 75 in the second embodiment. The target inspection processor 75 does not perform a process for generating the EUV light. The processes of the first and second embodiments are different in that the processes of S1000, S1100, and S1500 to S2200 in FIG. 15 are not performed in FIG. 22.

In S1200 of FIG. 22, the target inspection processor activates the droplet target generation device 26. This process is similar to the corresponding process in the comparative example except that the process is performed by the target inspection processor 75.

In S1300a, the target inspection processor 75 activates the solid target replenishment device 8. This process is similar to the corresponding process in the first embodiment except that the process is performed by the target inspection processor 75.

In S2400b, the target inspection processor 75 transmits the one-time solid target replenishment amount Qt to a parameter storage server 95.

The EUV light generation processor 5 of the EUV light generation apparatus 1 receives the one-time solid target replenishment amount Qt from the parameter storage server 95 and transmits the replenishment amount Qt to the solid target replenishment processor 85 included in the EUV light generation apparatus 1, so that the replenishment amount Qt can be set so as not to cause coalescence failure of the droplet targets 271.

In other respects, the second embodiment is similar to the first embodiment.

4.3 Effect

According to the second embodiment, the state of the coalescence of the droplet targets 271 can be detected using the target measurement system, and the replenishment amount Qt can be determined based on the detection result. The replenishment amount Qt can be used as the replenishment amount Qt of the solid target substance 27a in the EUV light generation apparatus 1 including the droplet target generation device 26 of the same type. In other respects, the second embodiment is similar to the first embodiment.

5. REPLENISHMENT AMOUNT Qt SET BASED ON PULSE ENERGY STABILITY Eσ OF EUV LIGHT

5.1 Operation of Various Processors

5.1.1 Overview

Figure 23:
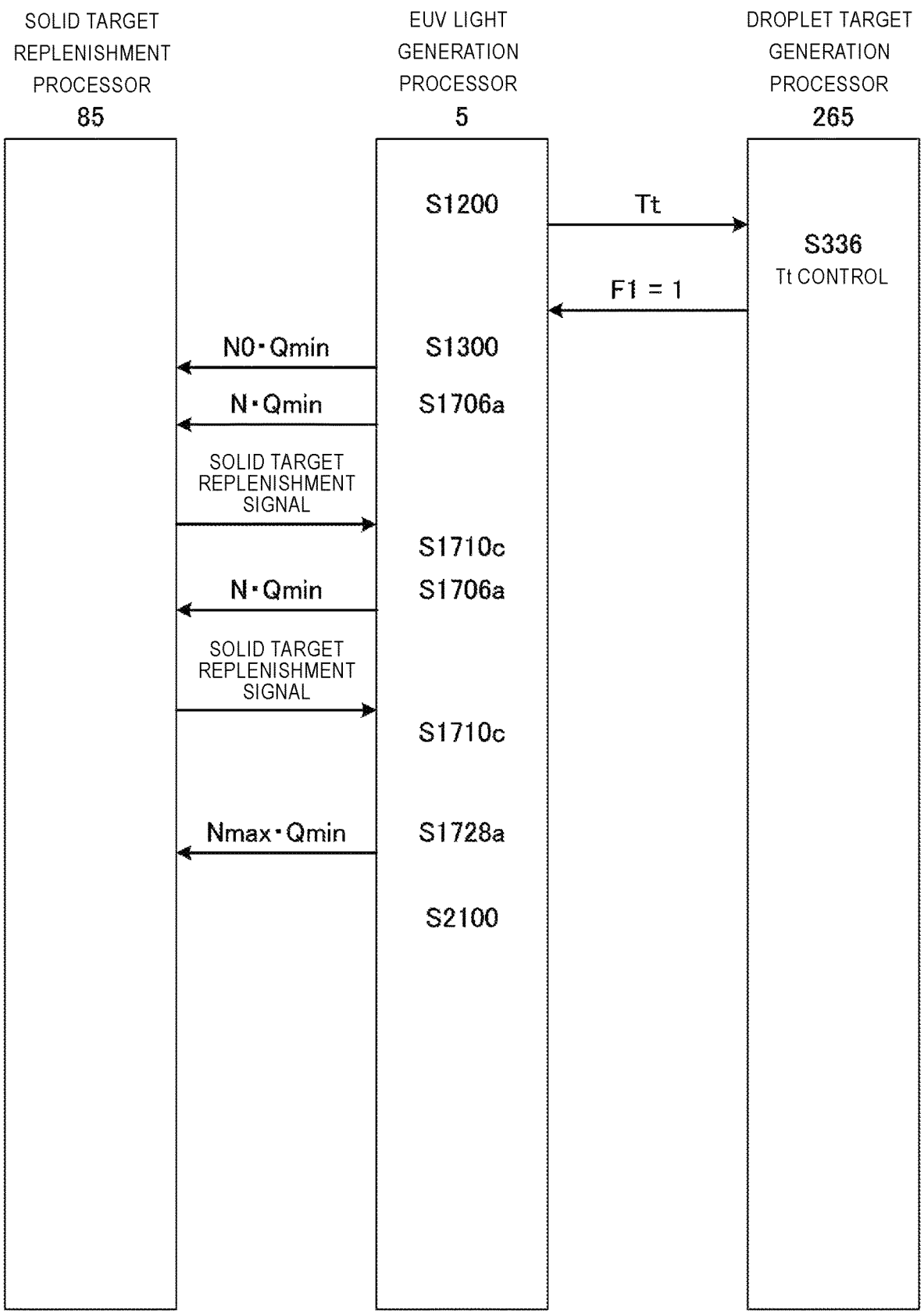
FIG. 23 is a time chart showing an outline of cooperation among the EUV light generation processor, the droplet target generation processor, and the solid target replenishment processor in a third embodiment.

FIG. 23 is a time chart showing an outline of cooperation among the EUV light generation processor 5, the droplet target generation processor 265, and the solid target replenishment processor 85 in the third embodiment. The configuration of the EUV light generation system 11 according to a third embodiment is similar to that of the first embodiment.

In FIG. 23, the processing in which the EUV light generation processor 5 activates the droplet target generation device 26 in S1200 and the processing in which the droplet target generation processor 265 performs control according to the target temperature Tt in S336 are similar to those in the comparative example.

In S1300 (activation of the solid target replenishment device 8), the one-time solid target replenishment amount Qt is set to N0·Qmin as in the comparative example. Thereafter, the EUV light is generated, and S1706a (transmission of the trial replenishment amount N·Qmin), S1710c (measurement of the pulse energy stability Eσ of the EUV light), and S1728a (transmission of the replenishment amount Nmax·Qmin) included in S1700c (resetting the one-time solid target replenishment amount Qt) are performed.

The process in which the EUV light generation processor 5 generates the EUV light in S2100 is similar to that in the comparative example.

5.1.2 Operation of EUV Light Generation Processor 5

Figure 24:
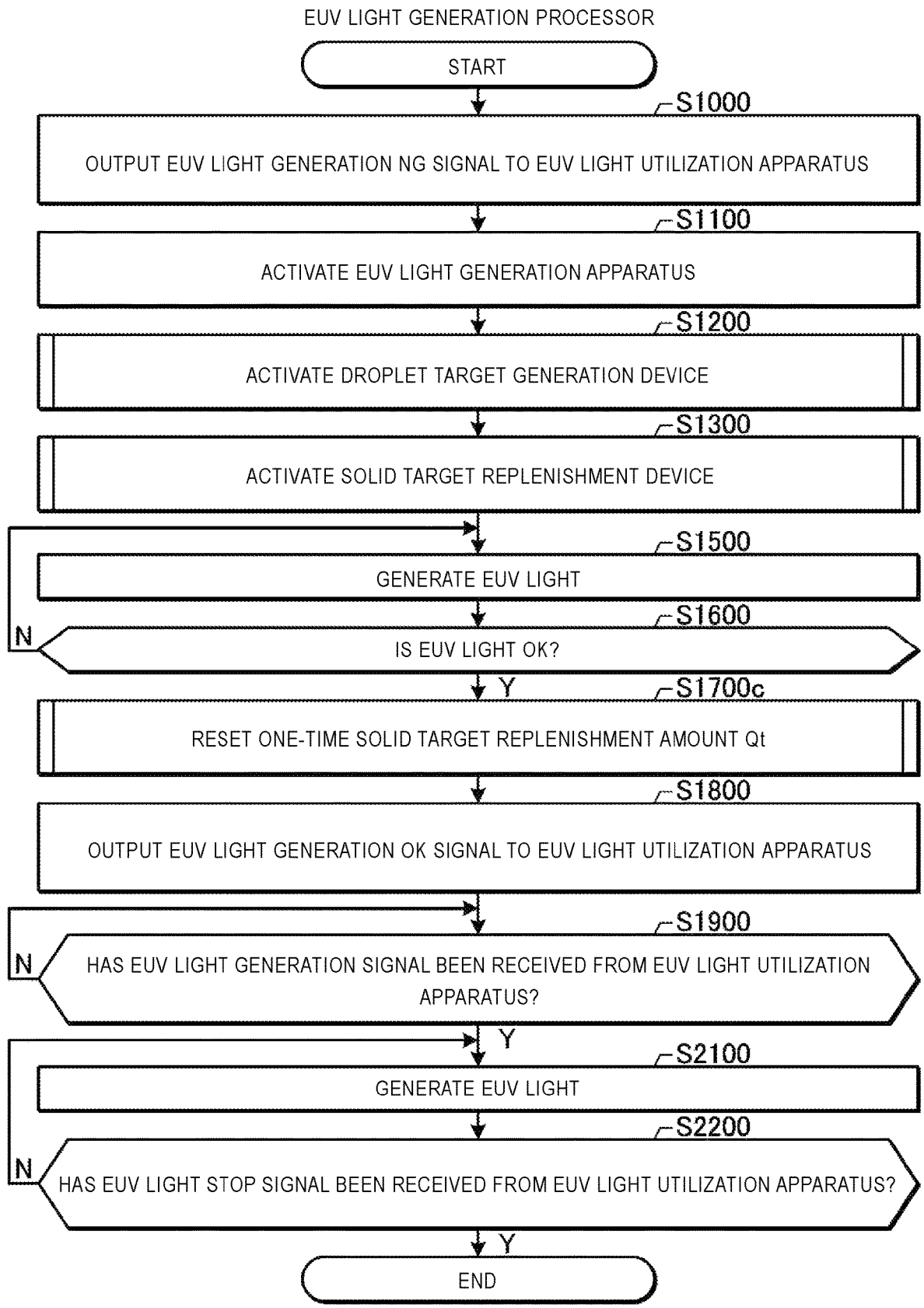
FIG. 24 is a flowchart showing operation of the EUV light generation processor in the third embodiment.

FIG. 24 is a flowchart showing operation of the EUV light generation processor 5 in the third embodiment. The difference between the comparative example and the third embodiment is that the process of S1700c is performed after the EUV light becomes OK in S1600.

Figure 25:
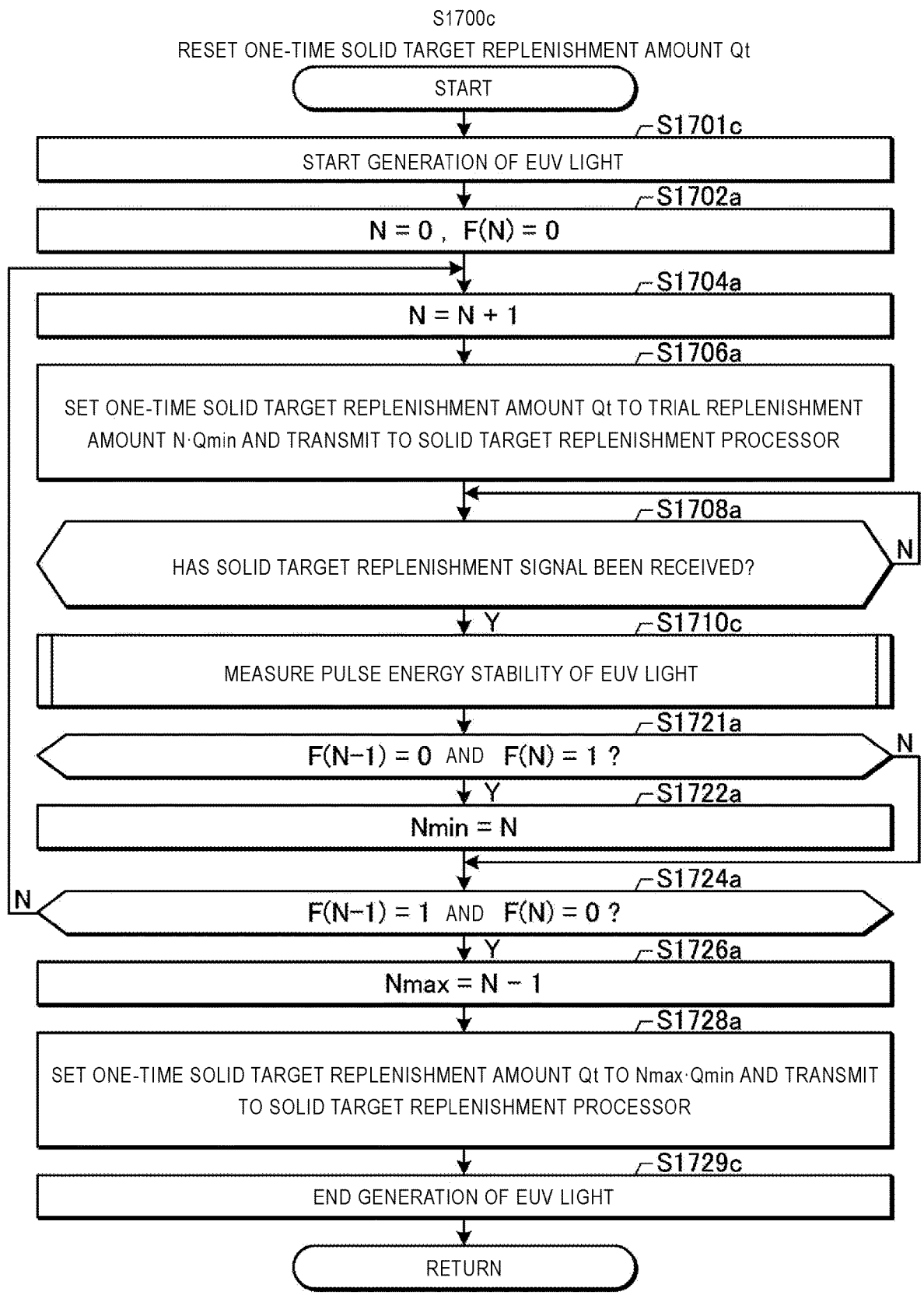
FIG. 25 is a flowchart showing details of the operation of resetting a one-time solid target replenishment amount Qt.

FIG. 25 is a flowchart showing details of the operation of resetting the one-time solid target replenishment amount Qt. FIG. 25 corresponds to a subroutine of S1700c of FIG. 24.

In S1701c, the EUV light generation processor 5 causes the EUV light generation apparatus 1 to start generation of the EUV light. The generation of the EUV light is continued until S1729c.

The processes of S1702a to S1708a are similar to the processes of S1302a to S1308a in FIG. 16.

When the solid target replenishment signal is received in S1708a, the EUV light generation processor 5 measures the pulse energy stability Eσ of the EUV light in S1710c. The state of the coalescence is determined from the pulse energy stability Eσ, and the flag F(N) is set to 0 when coalescence failure occurs and the flag F(N) is set to 1 when the coalescence is completed. Details of S1710c will be described with reference to FIG. 26.

The processes of S1721a to S1728a are similar to the processes of S1321a to S1328a in the first embodiment (see FIG. 16).

After setting the one-time solid target replenishment amount Qt to Nmax·Qmin in S1728a, the EUV light generation processor 5 ends the generation of the EUV light in S1729c.

After S1729c, the EUV light generation processor 5 ends the processing of the present flowchart and returns to processing shown in FIG. 24.

Figure 26:
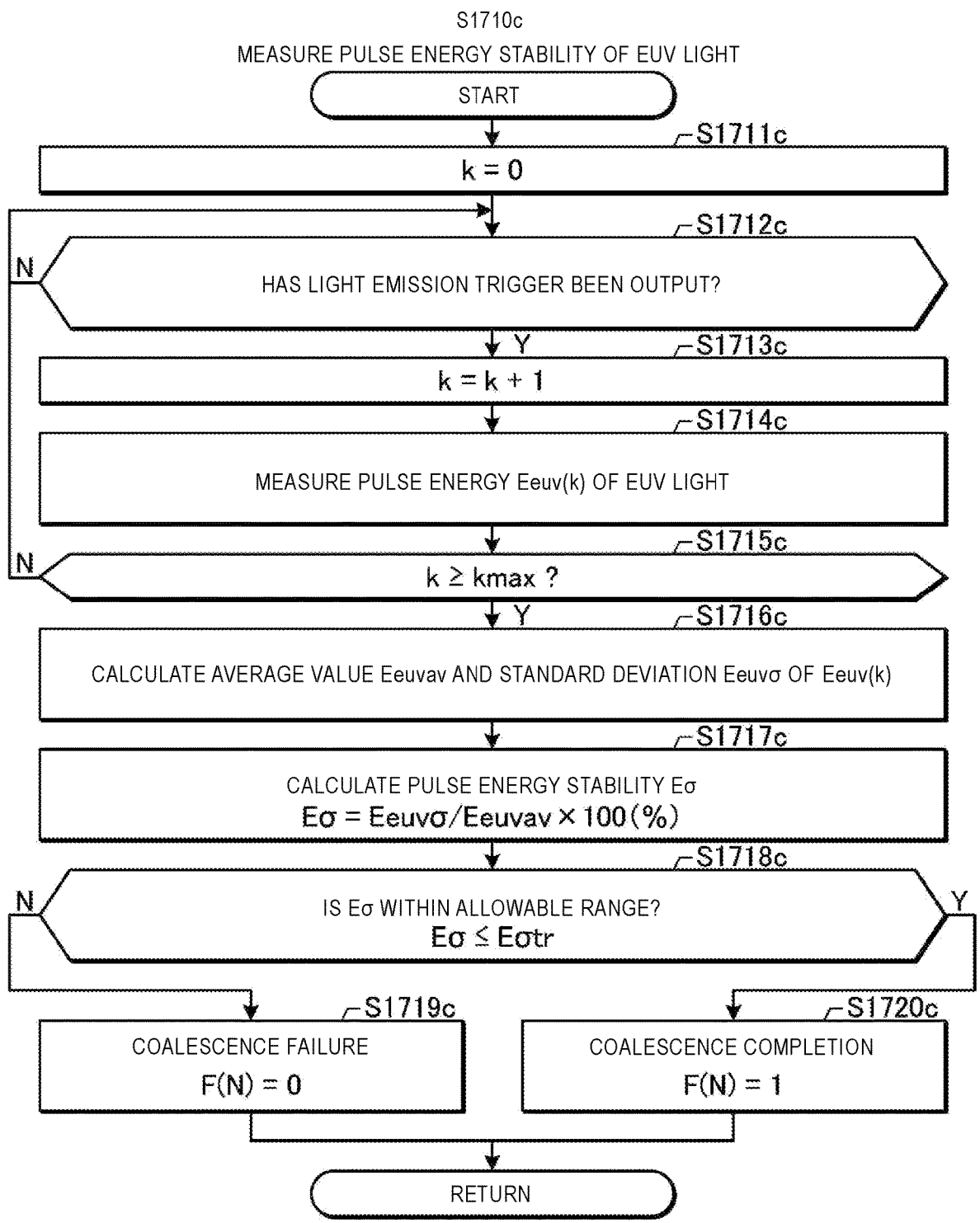
FIG. 26 is a flowchart showing details of the operation of measuring pulse energy stability Eσ of the EUV light.

FIG. 26 is a flowchart showing details of the operation of measuring the pulse energy stability Eσ of the EUV light. FIG. 26 corresponds to a subroutine of S1710c of FIG. 25.

In S1711c, the EUV light generation processor 5 sets a counter k for counting the number of pulses of the EUV light to 0.

In S1712c, the EUV light generation processor 5 determines whether or not a light emission trigger has been output to the laser device 3. When the light emission trigger is not output (S1712c:NO), the EUV light generation processor 5 waits until the light emission trigger is output. When the light emission trigger is output (S1712c:YES), the EUV light generation processor 5 advances processing to S1713c.

In S1713c, the EUV light generation processor 5 adds 1 to the value of the counter k to update the value of k.

In S1714c, the EUV light generation processor 5 measures the pulse energy Eeuv(k) of the EUV light by the EUV sensor 40.

In S1715c, the EUV light generation processor 5 determines whether or not the value of the counter k is equal to or more than kmax. When the value of the counter k is less than kmax (S1715c:NO), the EUV light generation processor 5 returns processing to S1712c. When the value of the counter k is equal to or more than kmax (S1715c:YES), the EUV light generation processor 5 advances processing to S1716c.

In S1716c, the EUV light generation processor 5 calculates an average value Eeuvav and standard deviation Eeuvσ of kmax values of the pulse energy Eeuv(k) of the EUV light.

In S1717c, the EUV light generation processor 5 calculates the pulse energy stability Eσ of the EUV light by the following equation.

$$E\sigma = Eeuv\sigma/Eeuvav \times 100\%$$

In S1718c, the EUV light generation processor 5 determines whether or not the pulse energy stability Eσ of the EUV light is within an allowable range, for example, equal to or less than the threshold Eσtr.

When the pulse energy stability Eσ is not within the allowable range (S1718c:NO), the EUV light generation processor 5 advances processing to S1719c. In S1719c, the EUV light generation processor 5 determines that coalescence failure occurs and sets the value of the flag F(N) to 0.

When the pulse energy stability Eσ is within the allowable range (S1718c:YES), the EUV light generation processor 5 advances processing to S1720c. In S1720c, the EUV light generation processor 5 determines that the coalescence is completed and sets the value of the flag F(N) to 1.

After S1719c or S1720c, the EUV light generation processor 5 ends the processing of the present flowchart and returns to processing shown in FIG. 25.

5.1.3 Operation of Solid Target Replenishment Processor 85

The operation of the solid target replenishment processor 85 that has received the one-time solid target replenishment amount Qt is similar to that in the first embodiment.

5.2 Effect (8) According to the third embodiment, the EUV light generation apparatus 1 includes the EUV sensor 40 that detects the state of the EUV light generated in the plasma generation region 25.

Accordingly, by detecting the state of the EUV light, it is possible to detect the state of the coalescence without performing the signal process for detecting a satellite from the signal of the optical sensor 423 or the image sensor 443, and to determine the appropriate replenishment amount Qt.

(9) According to the third embodiment, while increasing the trial replenishment amount N·Qmin of the solid target substance 27a from the solid target replenishment device 8 to the tank 260, the EUV light generation processor 5 obtains the pulse energy Eeuv(k) of the EUV light measured by the EUV sensor 40 in synchronization with the replenishment of the solid target substance 27a from the solid target replenishment device 8 to the tank 260. The EUV light generation processor 5 determines, as the replenishment amount Qt, the maximum value Nmax·Qmin of the trial replenishment amount N·Qmin in the case in which the pulse energy stability Eσ is within the allowable range.

Accordingly, by measuring the pulse energy stability Eσ of the EUV light while increasing the trial replenishment amount N·Qmin, it is possible to appropriately determine the range of the replenishment amount Qt in which the coalescence is completed. Then, by setting the maximum value Nmax·Qmin of the trial replenishment amount N·Qmin in the case in which the pulse energy stability Eσ is within the allowable range as the one-time replenishment amount Qt, it is possible to suppress an increase in the number of times of replenishment and to suppress a decrease in the lifetime of the solid target replenishment device 8.

In other respects, the third embodiment is similar to the first embodiment.

6. TEMPERATURE CONTROL OF TANK 260 WHEN REPLENISHING SOLID TARGET SUBSTANCE 27a

6.1 Configuration

Figure 27:
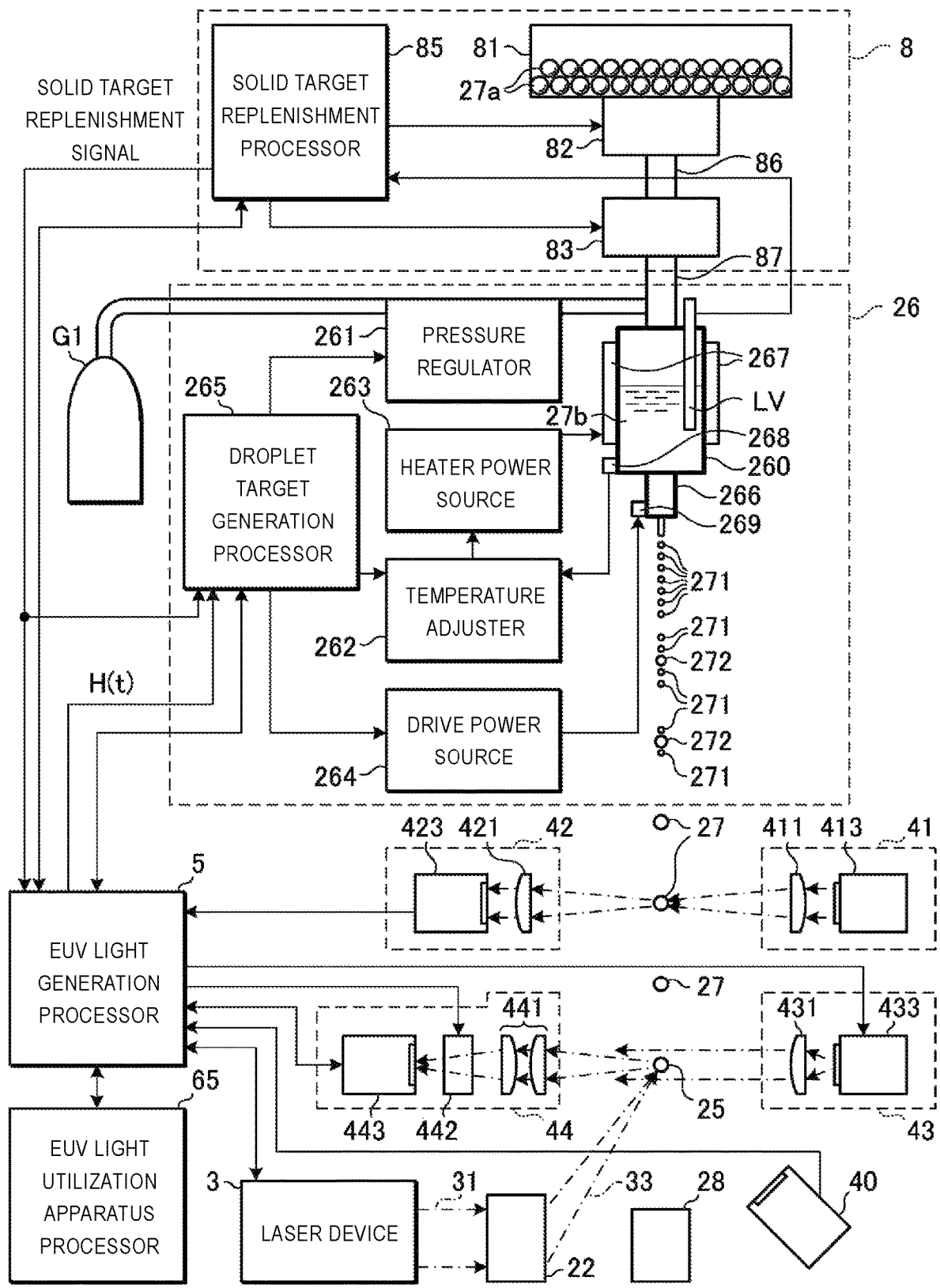
FIG. 27 shows the configuration of the droplet target generation device and the periphery thereof in the EUV light generation system according to a fourth embodiment.

FIG. 27 shows the configuration of the droplet target generation device 26 and the periphery thereof in the EUV light generation system 11 according to a fourth embodiment. In the fourth embodiment, a signal line is arranged so that the solid target replenishment signal output from the solid target replenishment processor 85 is input not only to the EUV light generation processor 5 but also to the droplet target generation processor 265. Further, another signal line for transmitting a heating function H(t) from the EUV light generation processor 5 to the droplet target generation processor 265 is arranged. In other respects, the configuration of the fourth embodiment is similar to that of the first embodiment.

6.2 Operation of Various Processors

6.2.1 Overview

Figure 28:
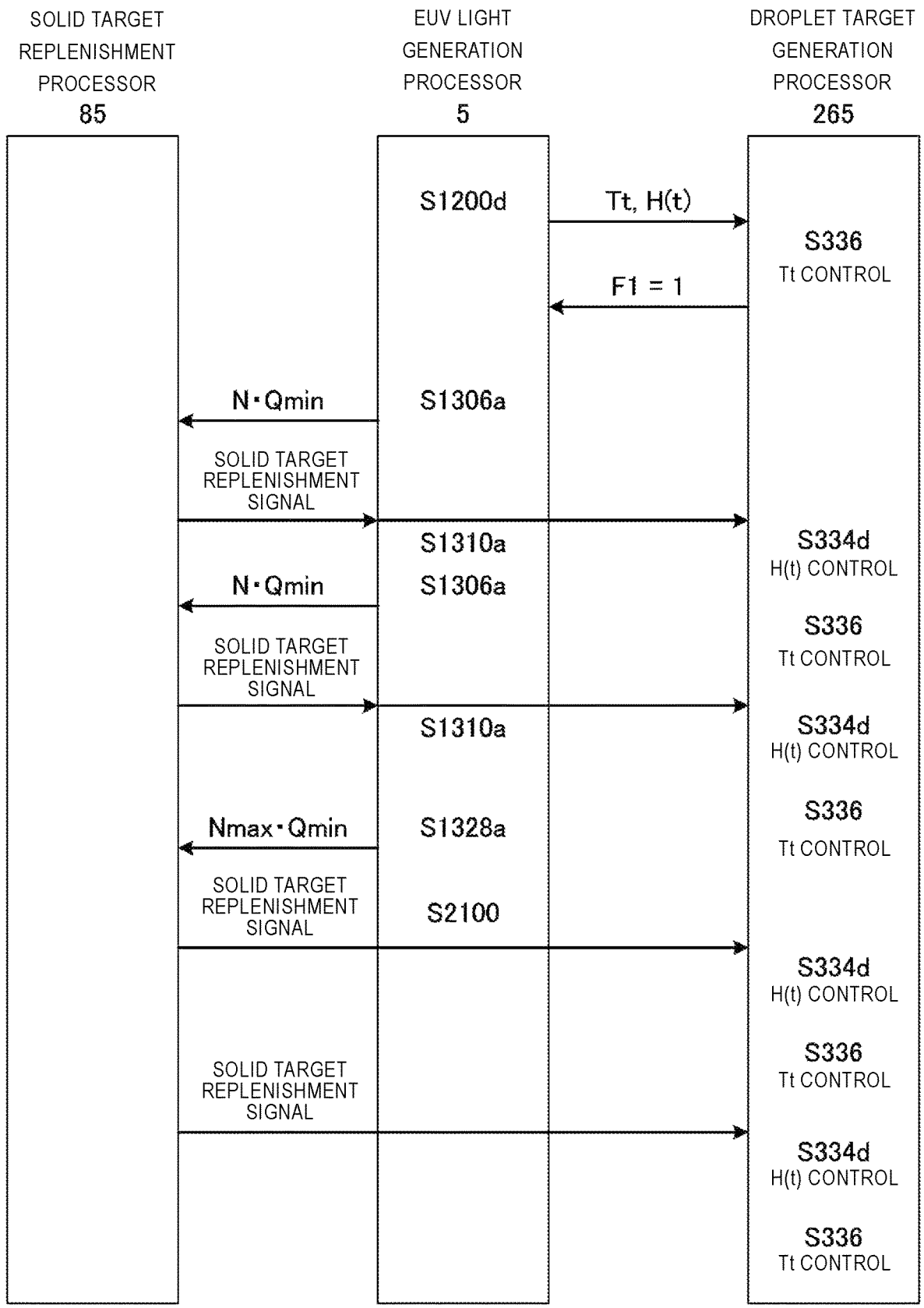
FIG. 28 is a time chart showing an outline of cooperation among the EUV light generation processor, the droplet target generation processor, and the solid target replenishment processor in the fourth embodiment.

FIG. 28 is a time chart showing an outline of cooperation among the EUV light generation processor 5, the droplet target generation processor 265, and the solid target replenishment processor 85 in the fourth embodiment.

As shown in FIG. 28, in S1200d, the EUV light generation processor 5 transmits, in addition to the target temperature Tt of the tank 260, the heating function H(t) to the droplet target generation processor 265. The droplet target generation processor 265 performs control in accordance with the target temperature Tt in S336.

The target replenishment signal output from the solid target replenishment processor 85 is input not only to the EUV light generation processor 5 but also to the droplet target generation processor 265. The droplet target generation processor 265 which receives the solid target replenishment signal performs control in accordance with the heating function H(t) so that the power supplied to the heater 267 in S334d is temporarily increased. After S334d, the droplet target generation processor 265 performs control in accordance with the target temperature Tt in S336.

Thereafter, each time the solid target replenishment signal is output from the solid target replenishment processor 85, the control of S334d is temporarily performed, and then, the control of S336 is performed. The temporary control of S334d is also performed when the EUV light generation processor 5 measures the coalescence target 272 to determine the one-time solid target replenishment amount Qt (S1310a) and when the EUV light is generated after the one-time solid target replenishment amount Qt is determined to be Nmax·Qmin (S2100).

6.2.2 Operation of EUV Light Generation Processor 5

Figure 29:
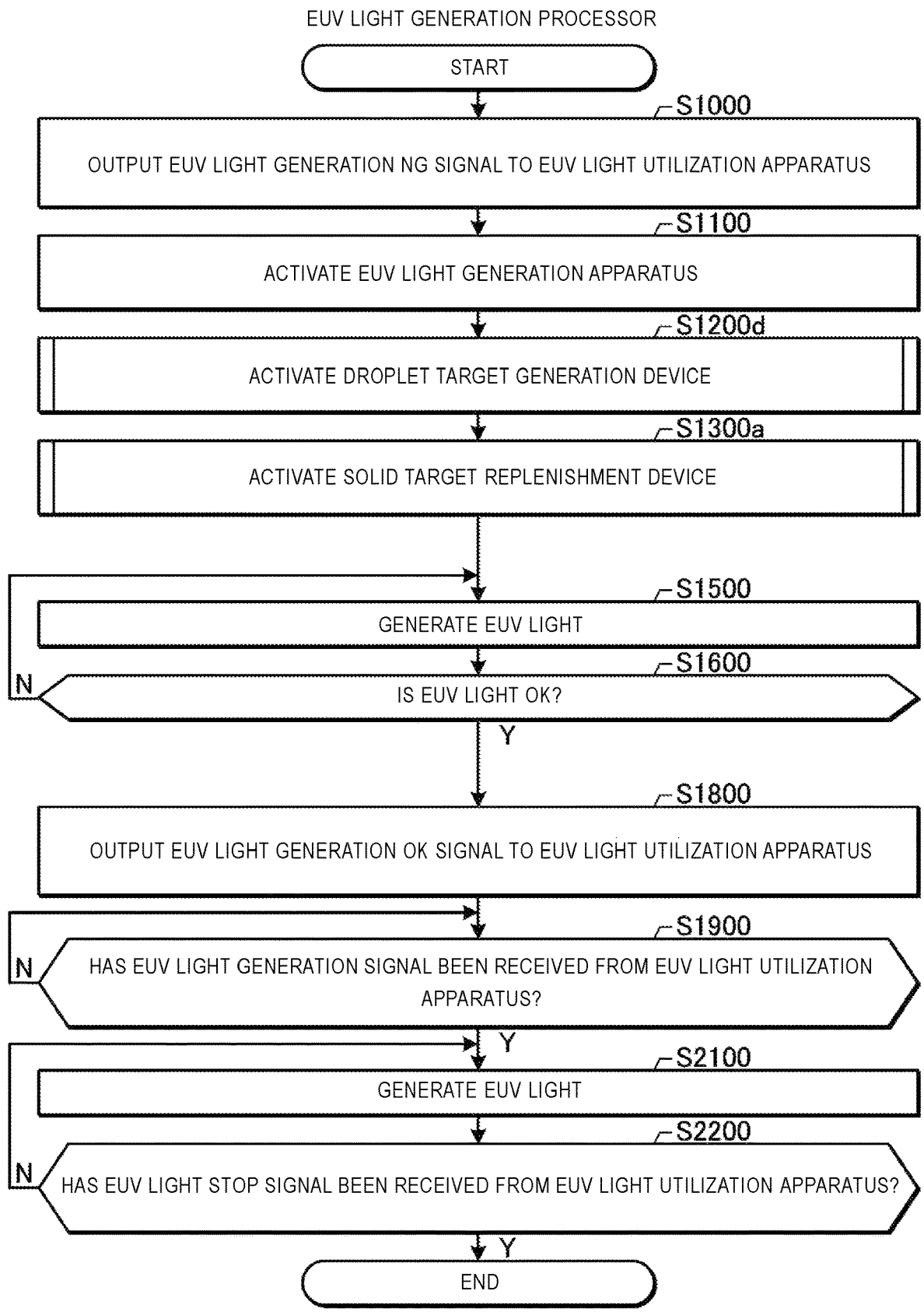
FIG. 29 is a flowchart showing operation of the EUV light generation processor in the fourth embodiment.

FIG. 29 is a flowchart showing operation of the EUV light generation processor 5 in the fourth embodiment. The difference between the first embodiment and the fourth embodiment is that the process of S1200d is performed instead of S1200 as the process to activate the droplet target generation device 26.

The process of S1300a is similar to that of the first embodiment. In the fourth embodiment, the process of the droplet target generation processor 265 is temporarily changed in S334d when the coalescence target 272 is measured (S1310a) in order to determine the one-time solid target replenishment amount Qt. Therefore, the coalescence may not be completed when N is 1, and the minimum value Nmin may be more than 1.

Figure 30:
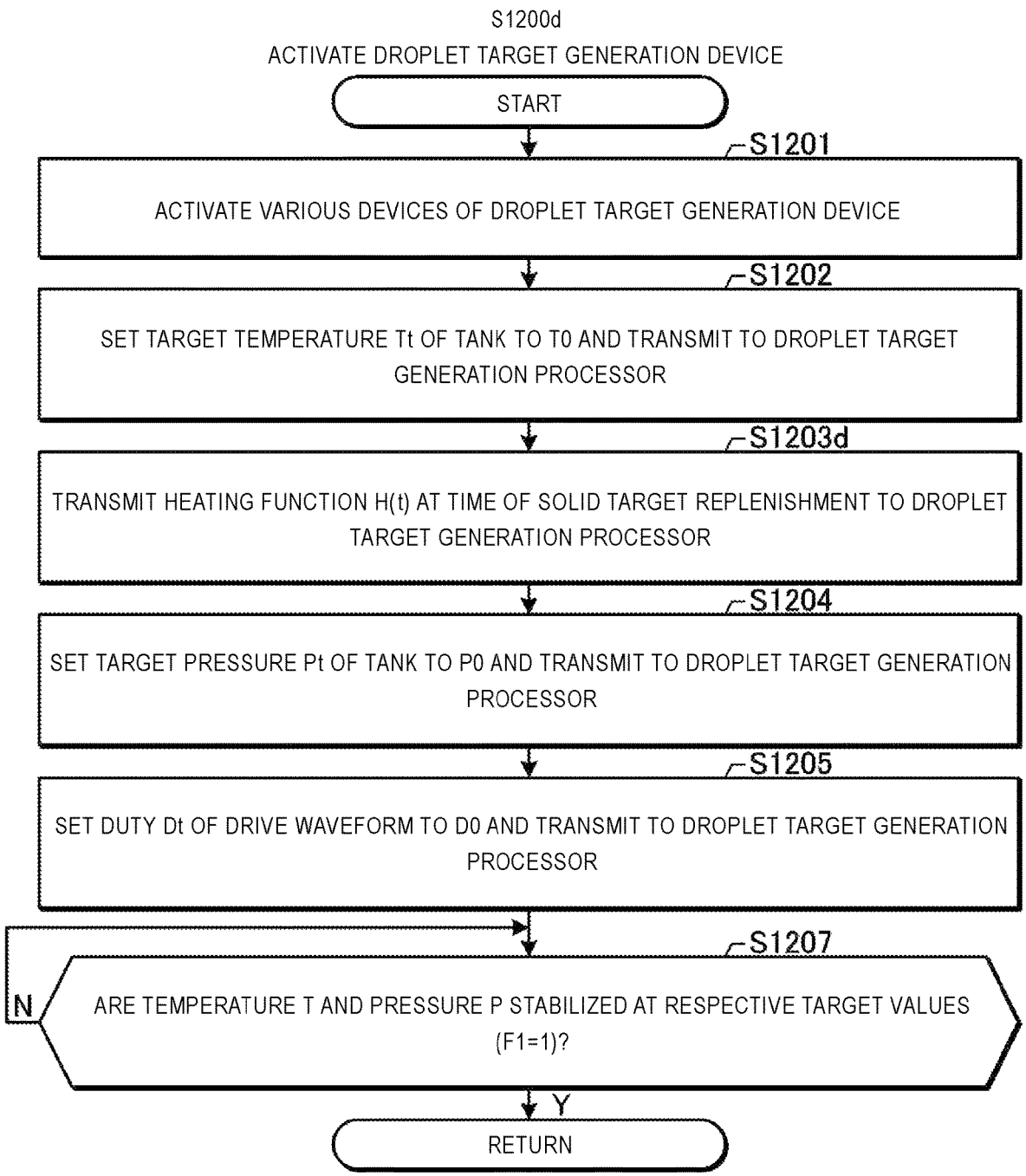
FIG. 30 is a flowchart showing details of the operation of activating the droplet target generation device.

FIG. 30 is a flowchart showing details of the operation of activating the droplet target generation device 26. FIG. 30 corresponds to a subroutine of S1200d of FIG. 29.

In the fourth embodiment, in addition to the target value transmitted to the droplet target generation processor 265 in the comparative example and the first embodiment, the heating function H(t) at the time of solid target replenishment is also transmitted to the droplet target generation processor 265 (S1203d).

In other respects, the processing of FIG. 30 is similar to that of FIG. 8.

Figure 31:
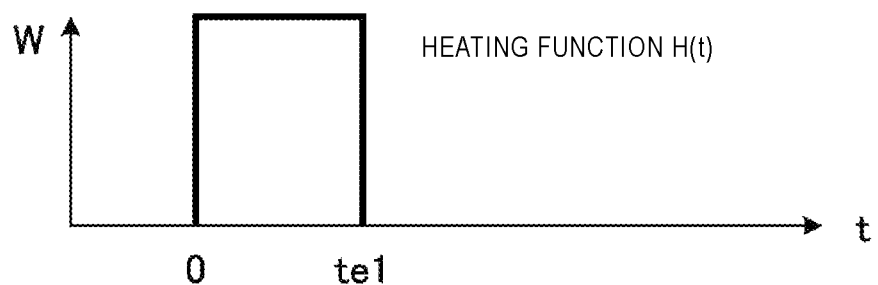
FIG. 31 is a graph showing an example of a heating function H(t).

FIG. 31 is a graph showing an example of the heating function H(t). The heating function H(t) is, for example, a function of heater power W with respect to time t. The time t when the solid target replenishment signal is received is set to 0. The heating function H(t) may be a function in which the heater power W is set to a fixed value in a fixed time from 0 until the time t becomes te1.

6.2.3 Operation of Droplet Target Generation Processor 265

Figure 32:
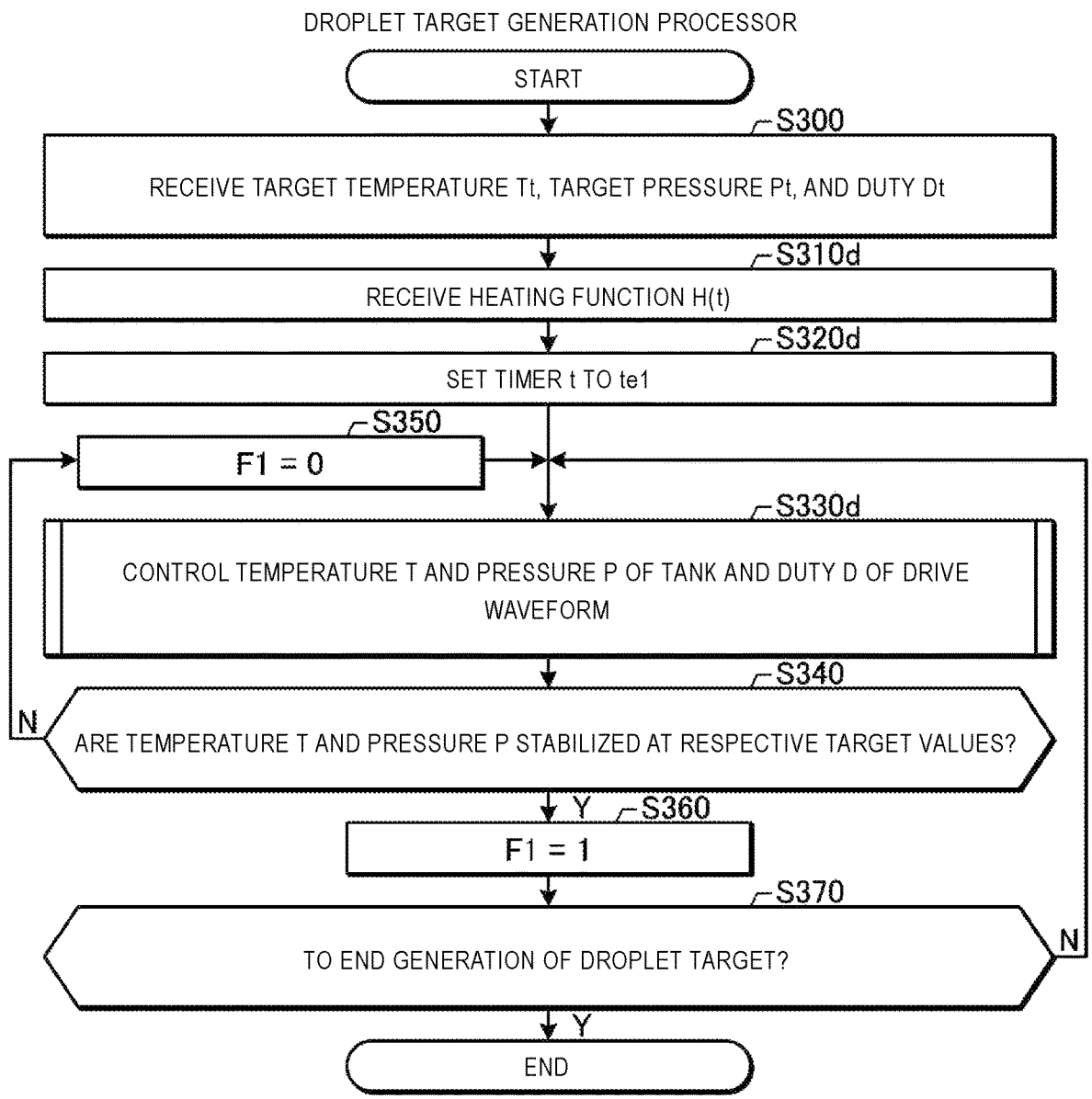
FIG. 32 is a flowchart showing operation of the droplet target generation processor in the fourth embodiment.

FIG. 32 is a flowchart showing operation of the droplet target generation processor 265 in the fourth embodiment. In the fourth embodiment, in addition to the target value received in S300, the heating function H(t) at the time of solid target replenishment is also received in S310d. Further, in S320d, the initial value of the timer t is set to te1. Here, the operation of the timer t is not started, and only the initial value is set.

In the comparative example and the first embodiment, the process of S330 is performed as the process for controlling the temperature T and the pressure P of the tank 260 and the duty D of the drive waveform, whereas in the fourth embodiment, the process of S330d is performed. As will be described with reference to FIG. 33, in S330d, whether to perform the process of S336 or the process of S334d is selected in accordance with the value of the timer t.

In other respects, FIG. 32 is similar to FIG. 10.

Figure 33:
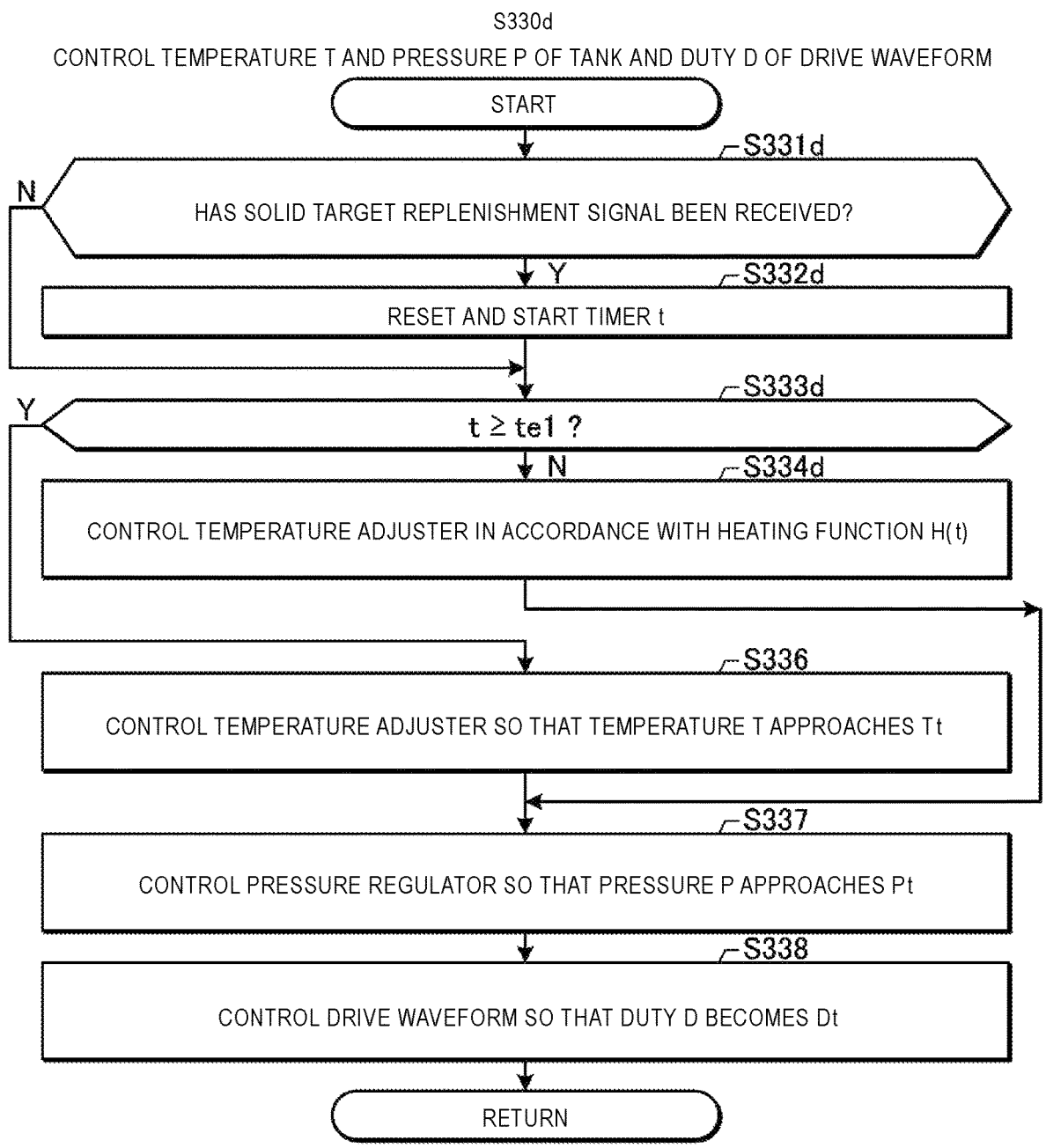
FIG. 33 is a flowchart showing details of the operation of controlling the temperature T and the pressure P of the tank and the duty D of the drive waveform.

FIG. 33 is a flowchart showing details of the operation of controlling the temperature T and the pressure P of the tank 260 and the duty D of the drive waveform. FIG. 33 corresponds to a subroutine of S330d of FIG. 32.

In S331d, the droplet target generation processor 265 determines whether or not the solid target replenishment signal has been received from the solid target replenishment processor 85.

When the solid target replenishment signal is not received (S331d:NO), the droplet target generation processor 265 advances processing to S333d.

When the solid target replenishment signal is received (S331d:YES), the droplet target generation processor 265 advances processing to S332d.

In S332d, the droplet target generation processor 265 resets and starts the timer t. That is, the droplet target generation processor 265 resets the value of the timer t to 0, and starts updating the timer t in accordance with elapse of time thereafter.

After S332d, the droplet target generation processor 265 advances processing to S333d.

In S333d, the droplet target generation processor 265 determines whether or not the value of the timer t is equal to or more than te1.

When the value of the timer t is equal to or more than te1 (S333d:YES), the droplet target generation processor 265 advances processing to S336 and controls the temperature adjuster 262 so that the temperature T of the tank 260 approaches the target temperature Tt. The case in which the value of the timer t is equal to or more than te1 (S333d:YES) is one of a case in which the timer t has not been reset even once after the value of the timer t is set to te1 (S320d) and a case in which the time te1 has elapsed since the timer t has been reset and started (S332d).

When the value of the timer t is less than te1 (S333d:NO), the droplet target generation processor 265 advances processing to S334d and controls the temperature adjuster 262 in accordance with the heating function H(t). The case in which the value of the timer t is less than te1 (S333d:NO) is a case in which the time te1 has not elapsed since the timer t has been reset and started (S332d). Thus, the control in accordance with the heating function H(t) is performed only for a certain period of time after the solid target replenishment signal is received.

After S334d or S336, the droplet target generation processor 265 advances processing to S337. The processes of S337 and S338 are similar to those described with reference to FIG. 11. After S338, the droplet target generation processor 265 ends the processing of the present flowchart and returns to processing shown in FIG. 32.

In other respects, the fourth embodiment is similar to the first embodiment.

6.3 Application to Second Embodiment

Figure 34:
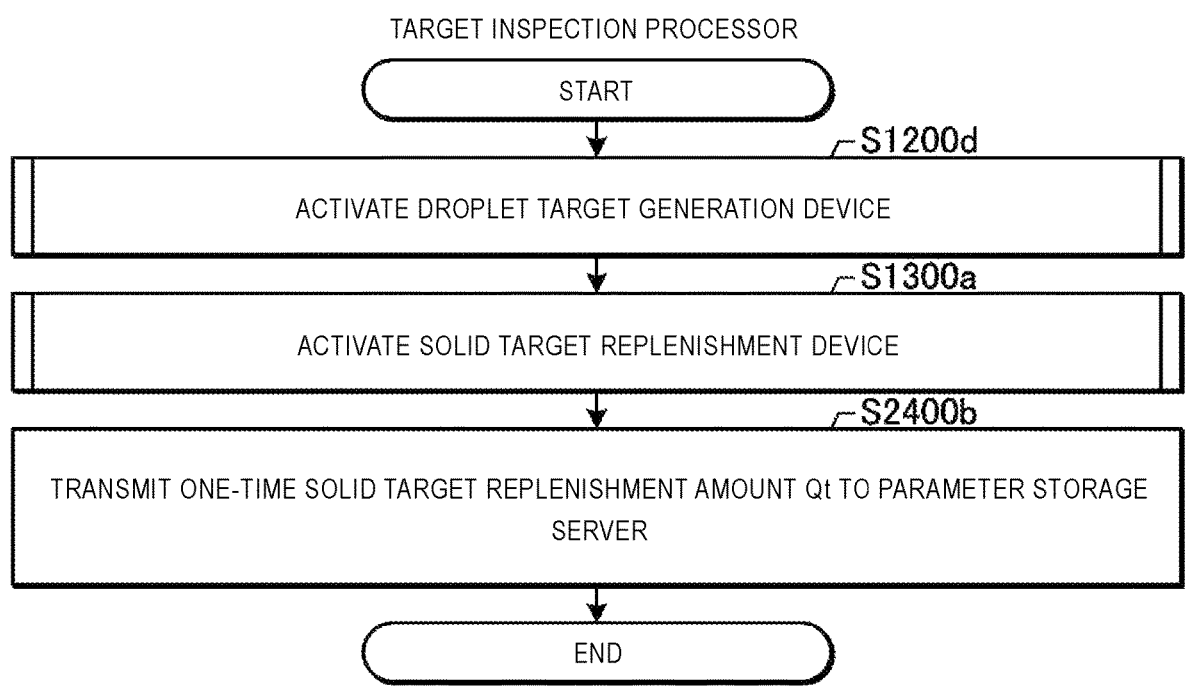
FIG. 34 is a flowchart for controlling the temperature of the tank when a solid target substance is replenished in the second embodiment.

FIG. 34 is a flowchart for controlling the temperature of the tank 260 when the solid target substance 27a is replenished in the second embodiment. For applying the temperature control of the fourth embodiment to the second embodiment, a signal line may be added to the configuration shown in FIG. 21 so that the solid target replenishment signal output from the solid target replenishment processor 85 is input not only to the target inspection processor 75 but also to the droplet target generation processor 265, and another signal line for transmitting the heating function H(t) from the target inspection processor 75 to the droplet target generation processor 265 may be added.

As shown in FIG. 34, by replacing S1200 of FIG. 22 with S1200d (see FIGS. 29 and 30), the temperature control of the tank 260 can be performed when the solid target substance 27a is replenished in the second embodiment.

The processing of the droplet target generation processor 265 may be similar to that of FIGS. 32 and 33.

The processing of the solid target replenishment processor 85 may be similar to that of FIG. 20.

6.4 Application to Third Embodiment

Figure 35:
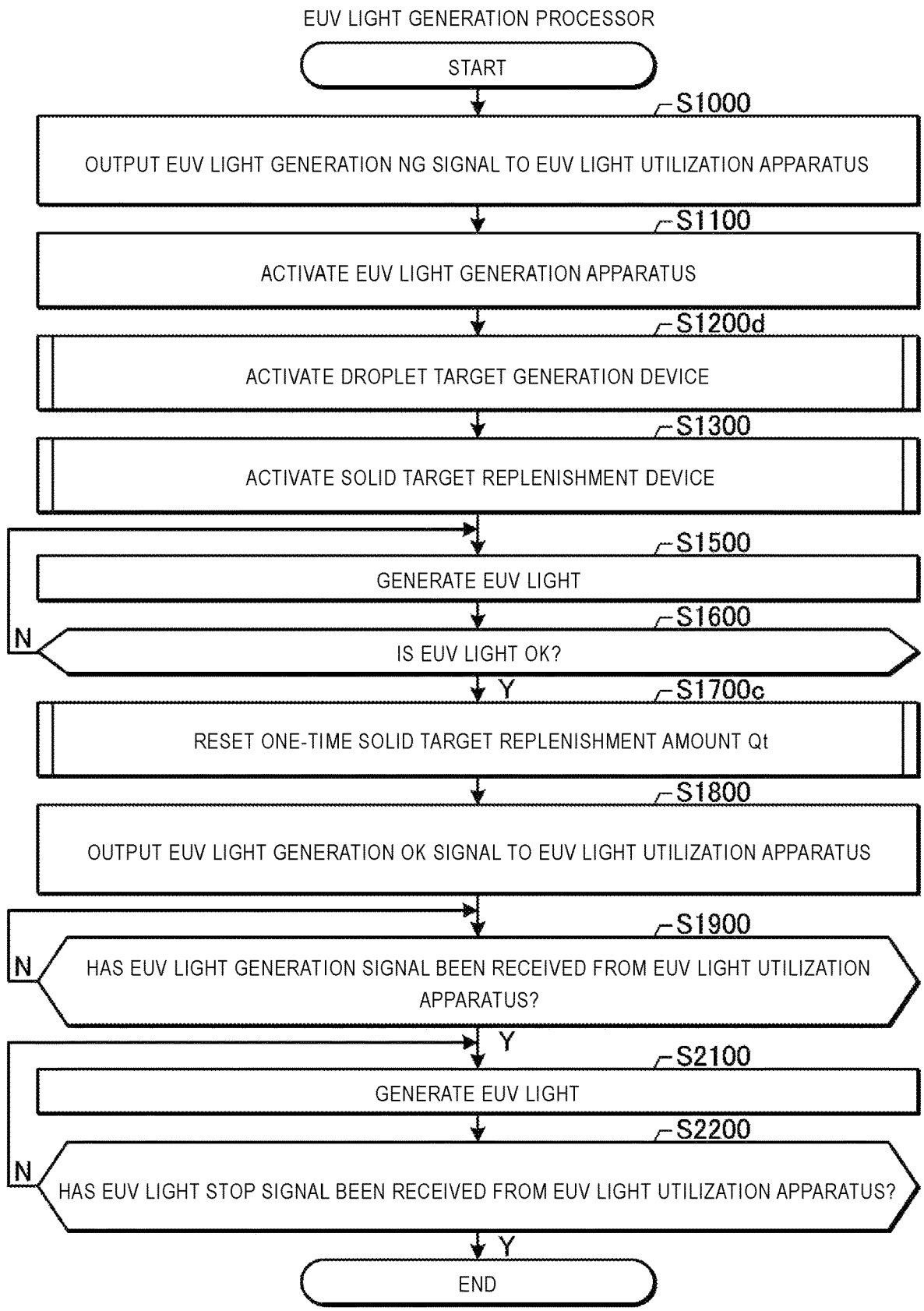
FIG. 35 is a flowchart for controlling the temperature of the tank when the solid target substance is replenished in the third embodiment.

FIG. 35 is a flowchart for controlling the temperature of the tank 260 when the solid target substance 27a is replenished in the third embodiment.

As shown in FIG. 35, by replacing S1200 of FIG. 24 with S1200*d* (see FIGS. 29 and 30), the temperature control of the tank 260 can be performed when the solid target substance 27a is replenished in the third embodiment.

The processing of the droplet target generation processor 265 may be similar to that of FIGS. 32 and 33.

The processing of the solid target replenishment processor 85 may be similar to that of FIG. 20.

6.5 Effect

(10) According to the fourth embodiment, the droplet target generation device 26 further includes the heater 267 arranged at at least one of the tank 260 and the nozzle 266. The droplet target generation processor 265 temporarily changes the power supplied to the heater 267 in synchronization with the replenishment of the solid target substance 27a from the solid target replenishment device 8 to the tank 260.

Accordingly, by temporarily changing the power supplied to the heater 267 in synchronization with the replenishment of the solid target substance 27a, the minimum value and the maximum value of the replenishment amount Qt at which the coalescence is completed are both increased, and the solid target substance 27a having the larger replenishment amount Qt can be supplied to the tank 260 at one time.

(11) According to the fourth embodiment, the EUV light generation apparatus 1 includes the passage sensor unit 42 or the imaging unit 44 that detects the state of the coalescence of the plurality of droplet targets 271 in synchronization with the replenishment of the solid target substance 27a from the solid target replenishment device 8 to the tank 260 and the change of the power. The EUV light generation processor 5 determines the replenishment amount Qt based on the detection result of the passage sensor unit 42 or the imaging unit 44, and the solid target replenishment processor 85 controls the solid target replenishment device 8.

Accordingly, it is possible to determine the appropriate replenishment amount Qt by detecting the state of the coalescence in synchronization with the change of the power and determining the replenishment amount Qt based on the detection result.

(12) According to the fourth embodiment, while increasing the trial replenishment amount N·Qmin of the solid target substance 27a from the solid target replenishment device 8 to the tank 260, the EUV light generation processor 5 acquires the detection result output from the passage sensor unit 42 or the imaging unit 44 in synchronization with the replenishment of the solid target substance 27a from the solid target replenishment device 8 to the tank 260 and the change of the power. The EUV light generation processor 5 determines, as the replenishment amount Qt, the maximum value Nmax·Qmin of the trial replenishment amount N·Qmin in the case in which the coalescence of the droplet targets 271 is completed.

Accordingly, by measuring the state of the coalescence while increasing the trial replenishment amount N·Qmin, it is possible to accurately determine the range of the replenishment amount Qt in which the coalescence is completed.

Then, by setting the maximum value Nmax·Qmin of the trial replenishment amount N·Qmin in the case in which the coalescence is completed as the one-time replenishment amount Qt, it is possible to suppress an increase in the number of times of replenishment and to suppress a decrease in the lifetime of the solid target replenishment device 8.

In other respects, the fourth embodiment is similar to the first embodiment.

7. DUTY CONTROL OF DRIVE WAVEFORM WHEN REPLENISHING SOLID TARGET SUBSTANCE 27a

7.1 Configuration

Figure 36:
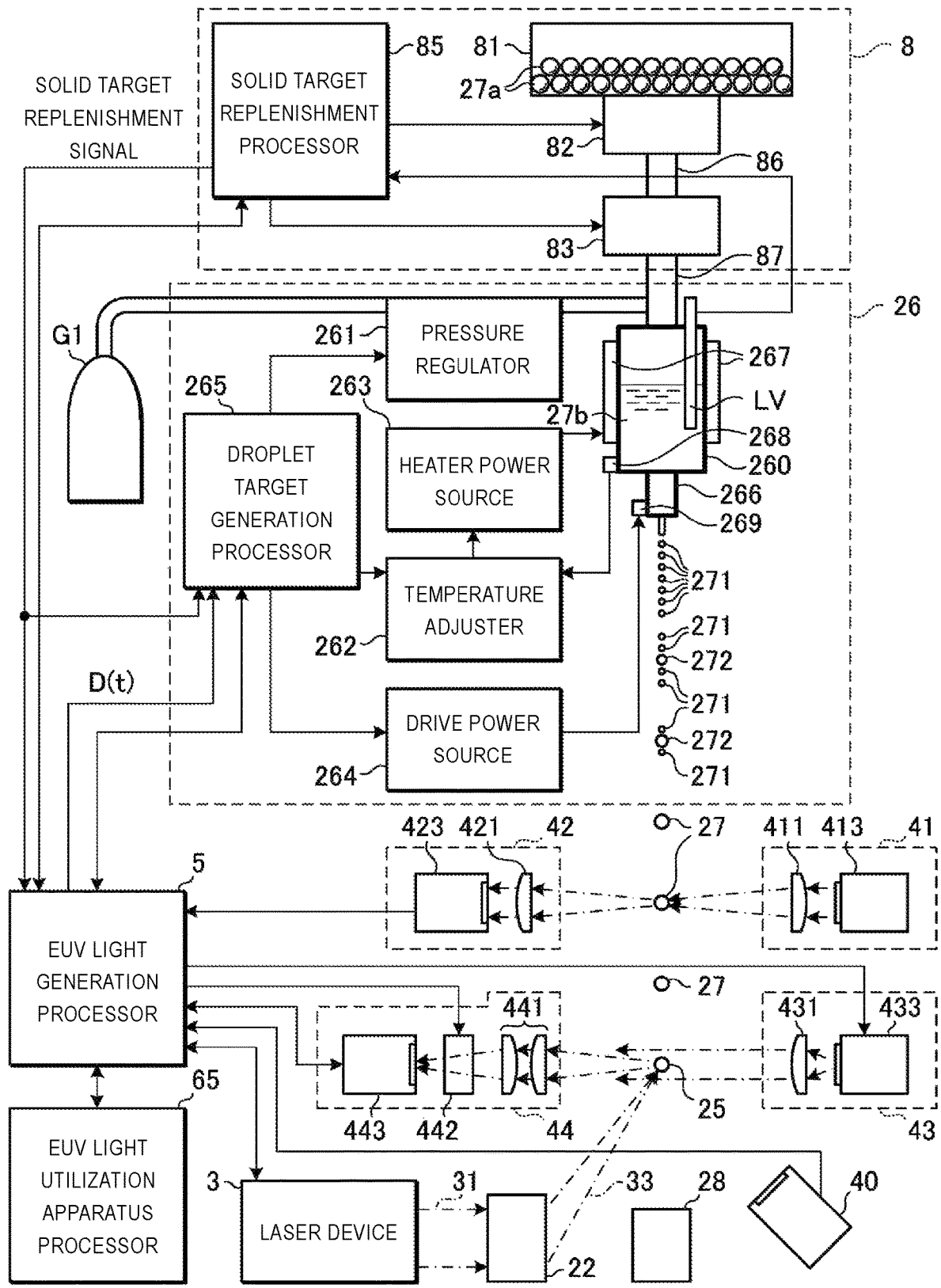
FIG. 36 shows the configuration of the droplet target generation device and the periphery thereof in the EUV light generation system according to a fifth embodiment.

FIG. 36 shows the configuration of the droplet target generation device 26 and the periphery thereof in the EUV light generation system 11 according to a fifth embodiment. In the fifth embodiment, a signal line for transmitting a duty change function D(t) instead of the heating function H(t) from the EUV light generation processor 5 to the droplet target generation processor 265 is arranged. In other respects, the configuration of the fifth embodiment is similar to that of the fourth embodiment.

7.2 Operation of Various Processors

7.2.1 Overview

Figure 37:
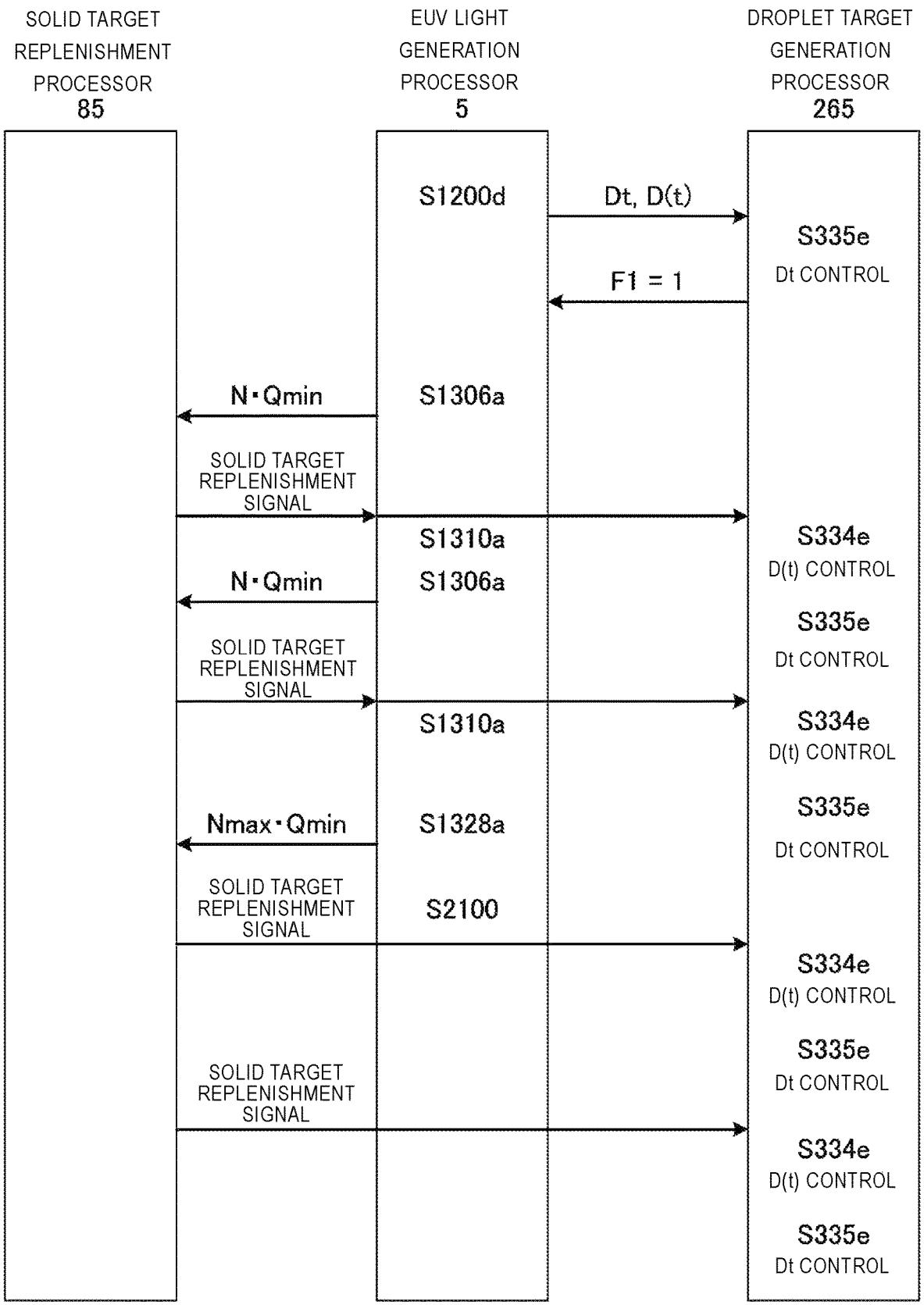
FIG. 37 is a time chart showing an outline of cooperation among the EUV light generation processor, the droplet target generation processor, and the solid target replenishment processor in the fifth embodiment.

FIG. 37 is a time chart showing an outline of cooperation among the EUV light generation processor 5, the droplet target generation processor 265, and the solid target replenishment processor 85 in the fifth embodiment.

As shown in FIG. 37, in S1200*d*, the EUV light generation processor 5 transmits the duty Dt of the drive waveform and a duty change function D(t) to the droplet target generation processor 265. The droplet target generation processor 265 performs control in accordance with the duty Dt in S335*e*.

The droplet target generation processor 265 which receives the solid target replenishment signal performs control in accordance with the duty change function D(t) so that the duty D of the drive waveform is temporarily changed in S334*e*. After S334*e*, the droplet target generation processor 265 performs control according to the duty Dt in S335*e*.

Thereafter, each time the solid target replenishment signal is output from the solid target replenishment processor 85, the control of S334*e* is temporarily performed, and then, the control of S335*e* is performed. The temporary control of S334*e* is also performed when the EUV light generation processor 5 measures the coalescence target 272 to determine the one-time solid target replenishment amount Qt (S1310*a*) and when the EUV light is generated after the one-time solid target replenishment amount Qt is determined to be Nmax·Qmin (S2100).

7.2.2 Operation of EUV Light Generation Processor 5

Figure 38:
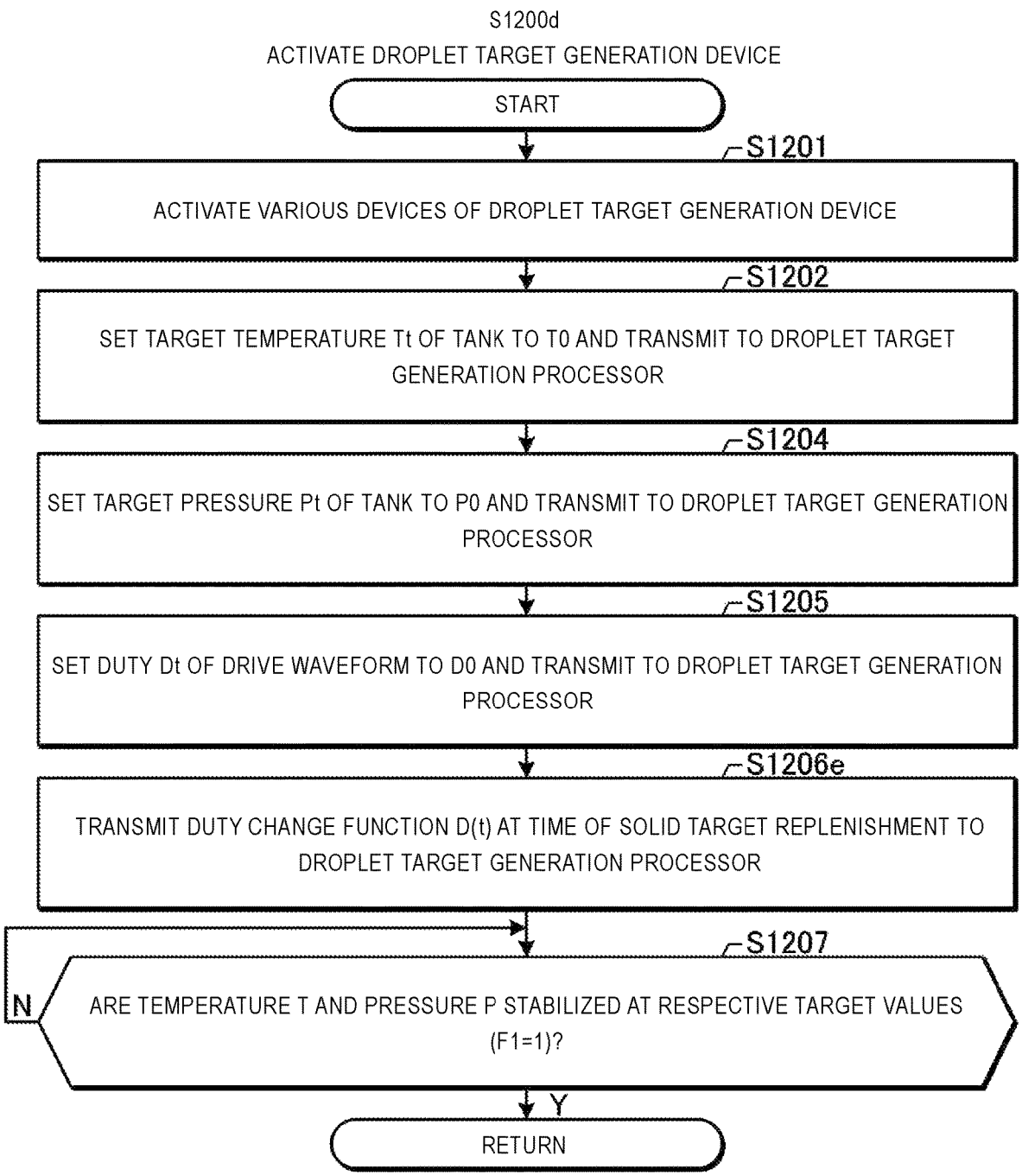
FIG. 38 is a flowchart showing details of the operation of activating the droplet target generation device.

FIG. 38 is a flowchart showing details of the operation of activating the droplet target generation device 26. The basic operation of the EUV light generation processor 5 is similar to that described with reference to FIG. 29. FIG. 38 corresponds to a subroutine of S1200*d* of FIG. 29.

In the fifth embodiment, instead of the heating function H(t) at the time of solid target replenishment, the duty change function D(t) at the time of solid target replenishment is transmitted to the droplet target generation processor 265 (S1206e).

Figure 39:
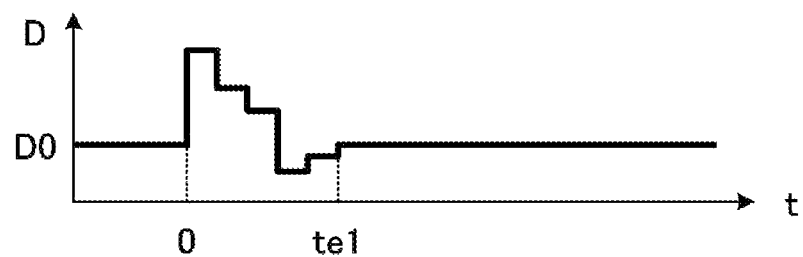
FIG. 39 is a graph showing an example of a duty change function D(t).

FIG. 39 is a graph showing an example of the duty change function D(t). The duty change function D(t) is a function of the duty D with respect to time t. The duty change function D(t) may be a function that changes the duty D to a value different from an original duty D0 in fixed time from 0 until the time t becomes te1.

7.2.3 Operation of Droplet Target Generation Processor 265

Figure 40:
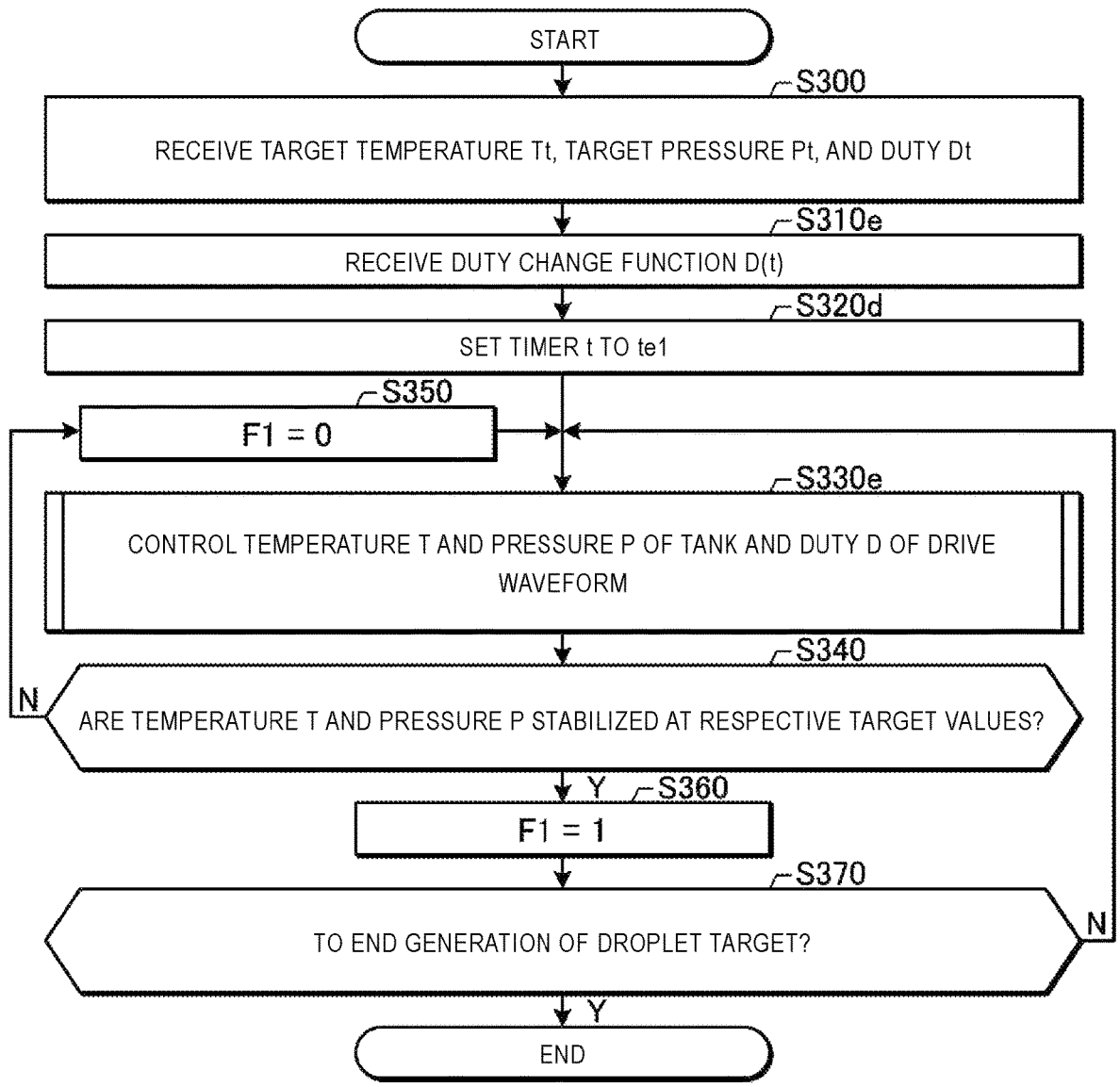
FIG. 40 is a flowchart showing operation of the droplet target generation processor in the fifth embodiment.

FIG. 40 is a flowchart showing operation of the droplet target generation processor 265 in the fifth embodiment. In the fifth embodiment, in addition to the target value received in S300, the duty change function D(t) at the time of solid target replenishment is also received in S310e.

Instead of S330d in the fourth embodiment, the process of S330e is performed in the fifth embodiment.

In other respects, FIG. 40 is similar to FIG. 32.

Figure 41:
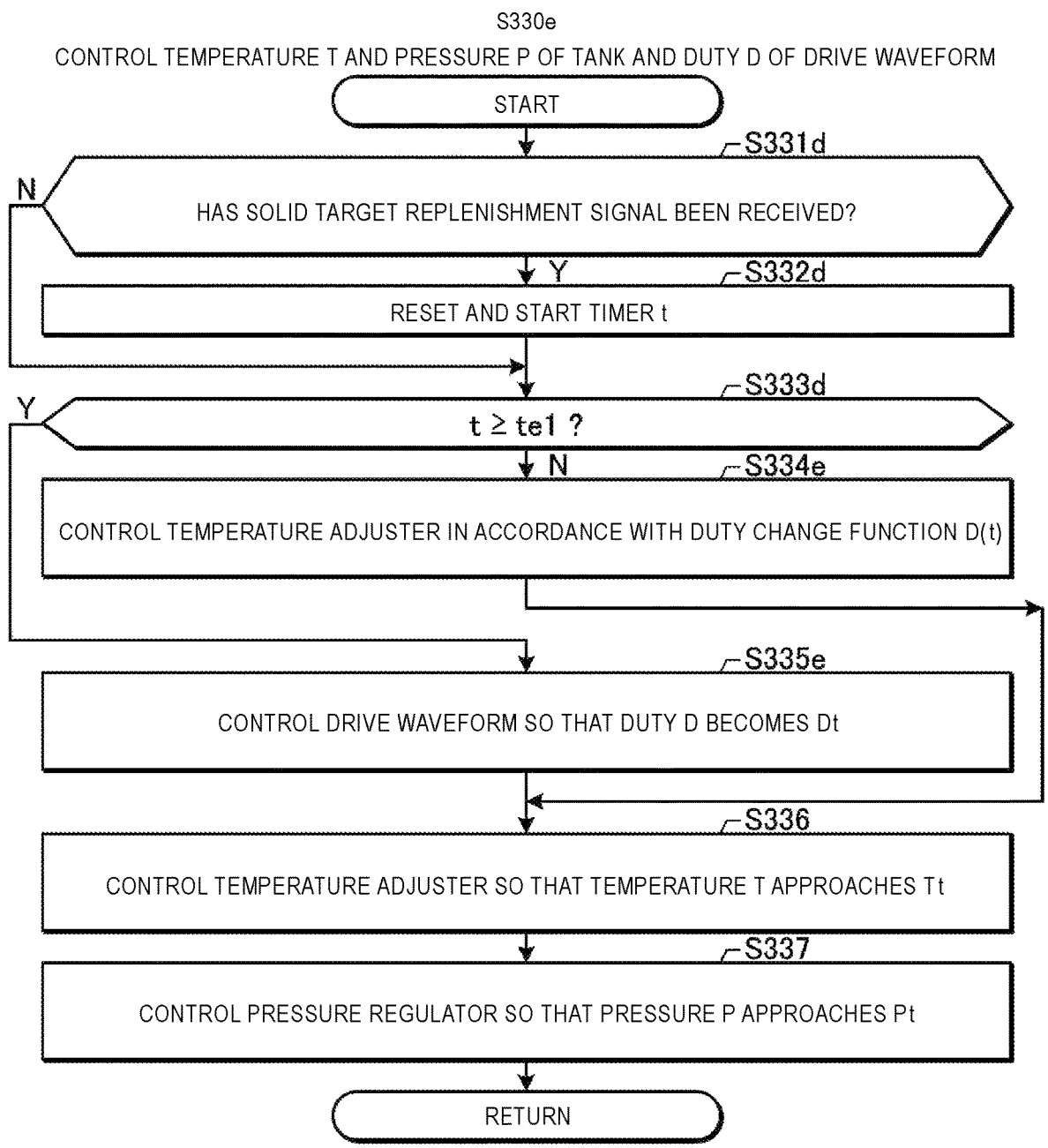
FIG. 41 is a flowchart showing details of the operation of controlling the temperature T and the pressure P of the tank and the duty D of the drive waveform.

FIG. 41 is a flowchart showing details of the operation of controlling the temperature T and the pressure P of the tank 260 and the duty D of the drive waveform. FIG. 41 corresponds to a subroutine of S330e of FIG. 40.

In S333d, the droplet target generation processor 265 determines whether or not the value of the timer t is equal to or more than te1.

When the value of the timer t is equal to or more than te1 (S333d:YES), the droplet target generation processor 265 advances processing to S335e and controls the drive waveform of the vibration device 269 so that the duty D becomes Dt.

When the value of the timer t is less than te1 (S333d:NO), the droplet target generation processor 265 advances processing to S334e and controls the duty D of the drive waveform in accordance with the duty change function D(t).

After S334e or S335e, the droplet target generation processor 265 advances processing to S336. The processes of S336 and S337 are similar to those described with reference to FIG. 11. After S337, the droplet target generation processor 265 ends the processing of the present flowchart and returns to processing shown in FIG. 40.

7.3 Effect

(13) According to the fifth embodiment, the droplet target generation device 26 further includes the vibration device 269 that applies vibration to the nozzle 266. The droplet target generation processor 265 temporarily changes the drive waveform input to the vibration device 269 in synchronization with the replenishment of the solid target substance 27a from the solid target replenishment device 8 to the tank 260.

Accordingly, by temporarily changing the drive waveform input to the vibration device 269 in synchronization with the replenishment of the solid target substance 27a, the minimum value and the maximum value of the replenishment amount Qt at which the coalescence is completed are both increased, and the solid target substance 27a having the larger replenishment amount Qt can be supplied to the tank 260 at one time.

(14) According to the fifth embodiment, the drive waveform is a rectangular wave, and the droplet target generation processor 265 changes the duty D of the rectangular wave in synchronization with the replenishment of the solid target substance 27a from the solid target replenishment device 8 to the tank 260.

Accordingly, by changing the duty D of the rectangular wave, the drive waveform can be changed by a simple process.

In other respects, the fifth embodiment is similar to the fourth embodiment.

8. MODULATION CONTROL OF DRIVE WAVEFORM WHEN REPLENISHING SOLID TARGET SUBSTANCE 27a

8.1 Configuration

Figure 42:
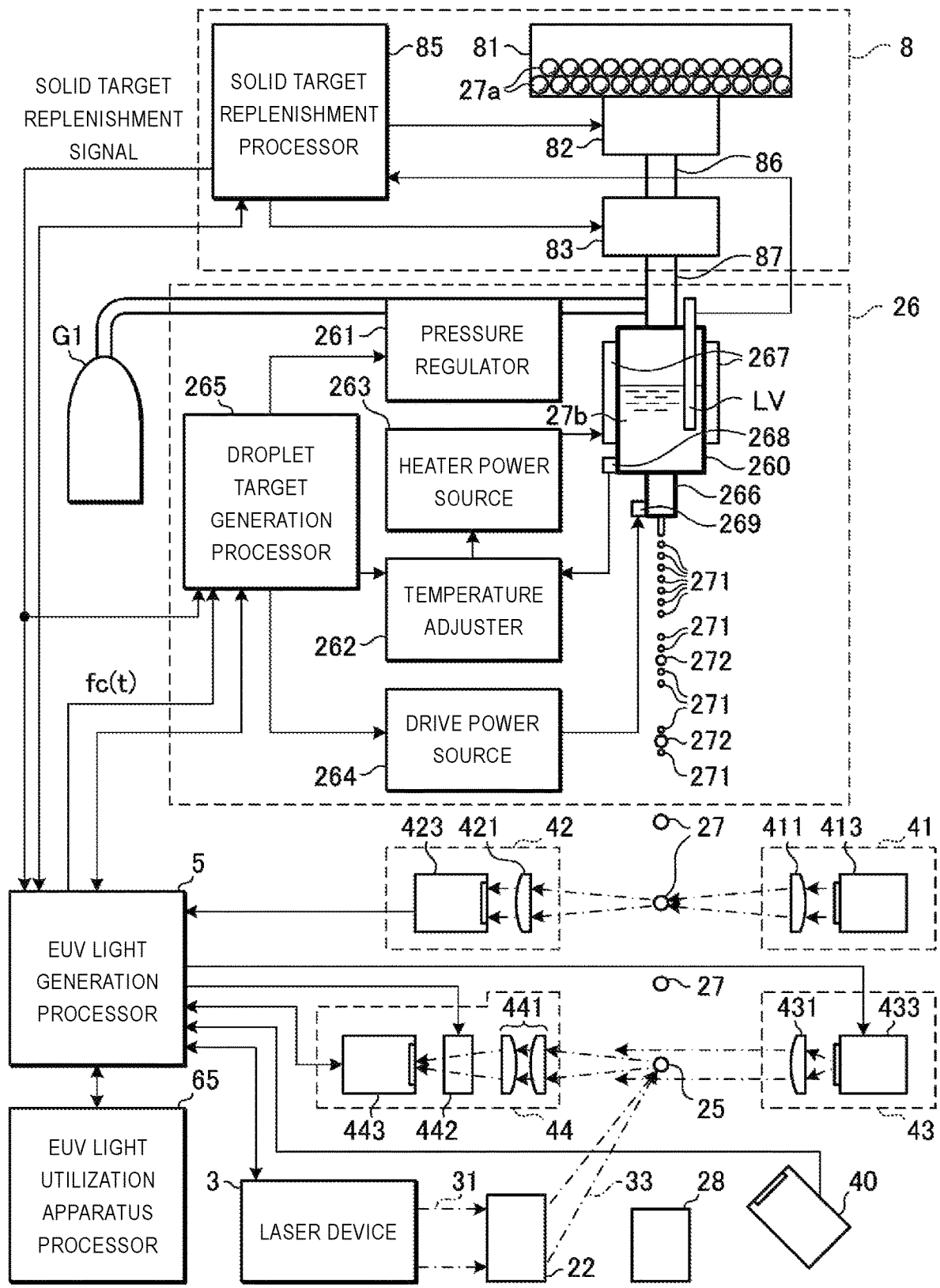
FIG. 42 shows the configuration of the droplet target generation device and the periphery thereof in the EUV light generation system according to a sixth embodiment.

FIG. 42 shows the configuration of the droplet target generation device 26 and the periphery thereof in an EUV light generation system 11 according to a sixth embodiment. In the sixth embodiment, the droplet target generation processor 265 generates a modulated wave generated by modulation as the drive waveform of the drive signal to be supplied to the drive power source 264. Then, in synchronization with the solid target replenishment signal, the modulation parameter such as a carrier frequency fc is changed to temporarily change the drive waveform. Hereinafter, description will be provided on a case in which the carrier frequency fc is changed, and then, on a case in which other modulation parameters are changed.

As shown in FIG. 42, in the sixth embodiment, a signal line for transmitting a carrier frequency change function fc(t) instead of the heating function H(t) from the EUV light generation processor 5 to the droplet target generation processor 265 is arranged. In other respects, the configuration of the sixth embodiment is similar to that of the fourth embodiment.

8.2 Operation of Various Processors

8.2.1 Overview

Figure 43:
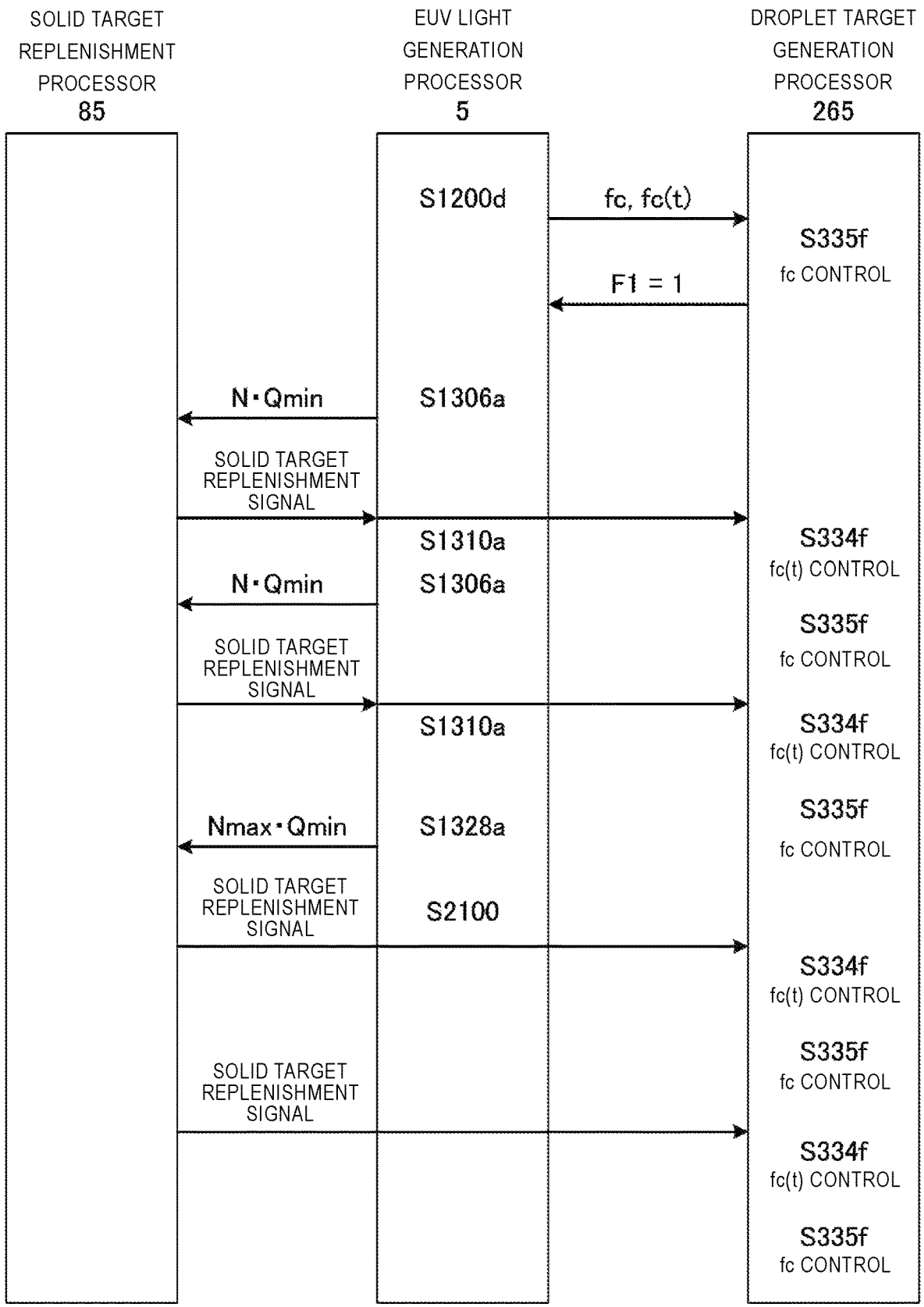
FIG. 43 is a time chart showing an outline of cooperation among the EUV light generation processor, the droplet target generation processor, and the solid target replenishment processor in the sixth embodiment.

FIG. 43 is a time chart showing an outline of cooperation among the EUV light generation processor 5, the droplet target generation processor 265, and the solid target replenishment processor 85 in the sixth embodiment.

As shown in FIG. 43, in S1200d, the EUV light generation processor 5 transmits the carrier frequency fc and the carrier frequency change function fc(t) to the droplet target generation processor 265. The droplet target generation processor 265 performs control in accordance with the carrier frequency fc in S335f.

The droplet target generation processor 265 which receives the solid target replenishment signal performs control in accordance with the carrier frequency change function fc(t) so that the carrier frequency fc is temporarily changed in S334f. After S334f, the droplet target generation processor 265 performs control in accordance with the carrier frequency fc in S335f.

Thereafter, each time the solid target replenishment signal is output from the solid target replenishment processor 85, the control of S334f is temporarily performed, and then, the control of S335f is performed. The temporary control of S334f is also performed when the EUV light generation processor 5 measures the coalescence target 272 to determine the one-time solid target replenishment amount Qt (S1310a) and when the EUV light is generated after the one-time solid target replenishment amount Qt is determined to be Nmax·Qmin (S2100).

8.2.2 Operation of EUV Light Generation Processor 5

Figure 44:
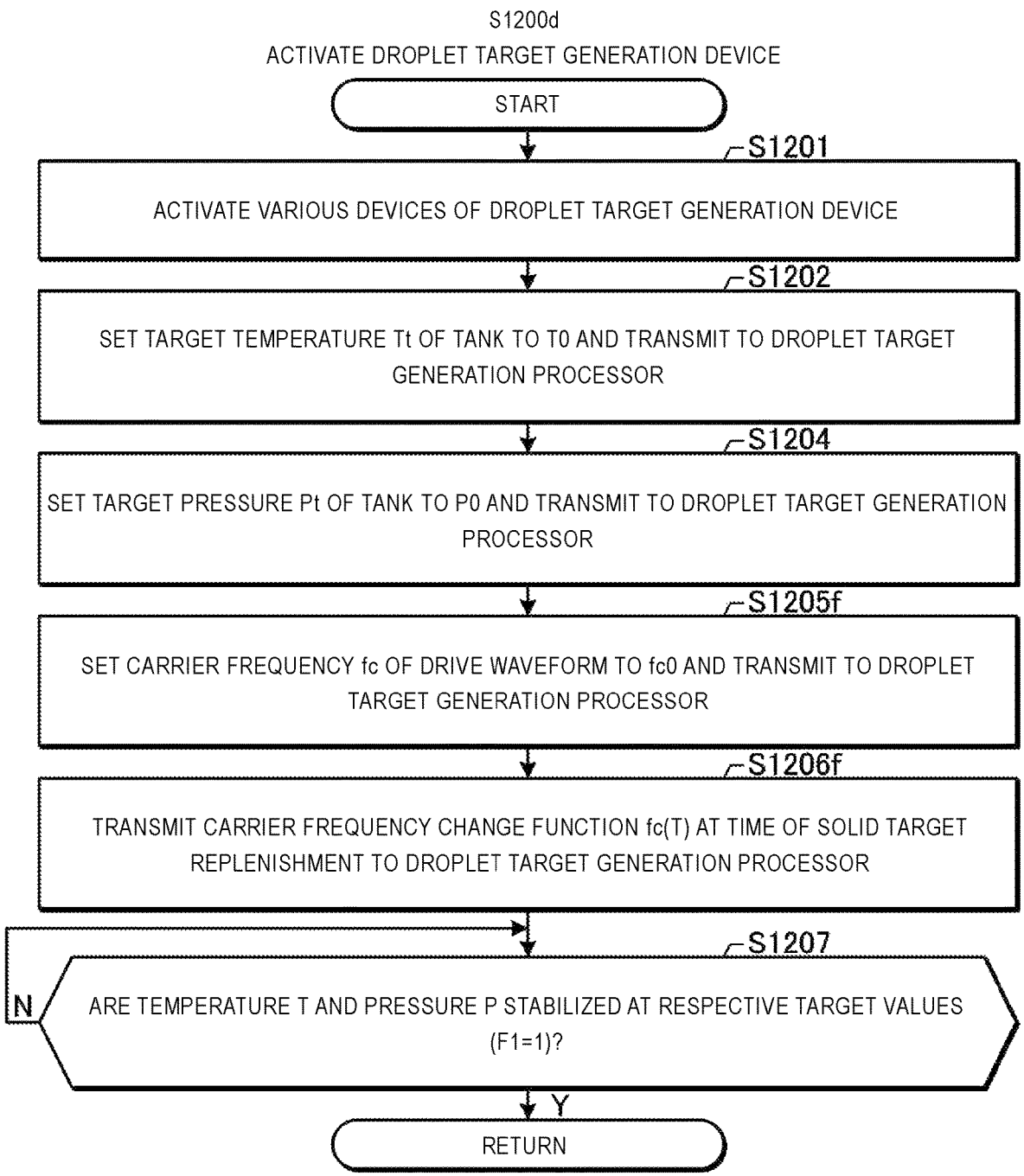
FIG. 44 is a flowchart showing details of the operation of activating the droplet target generation device.

FIG. 44 is a flowchart showing details of the operation of activating the droplet target generation device 26. The basic operation of the EUV light generation processor 5 is similar to that described with reference to FIG. 29. FIG. 44 corresponds to a subroutine of S1200d of FIG. 29.

In the sixth embodiment, instead of the duty D of the drive waveform, the carrier frequency fc is transmitted to the droplet target generation processor 265 (S1205f).

In the sixth embodiment, instead of the heating function H(t) at the time of solid target replenishment, the carrier frequency change function fc(t) at the time of solid target replenishment is transmitted to the droplet target generation processor 265 (S1206f).

Figure 45:
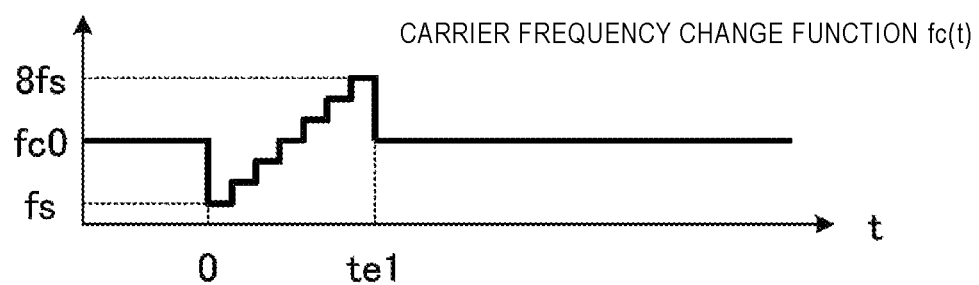
FIG. 45 is a graph showing an example of a carrier frequency change function fc(t).

FIG. 45 is a graph showing an example of the carrier frequency change function fc(t). The carrier frequency change function fc(t) is a function of the carrier frequency fc with respect to time t. The carrier frequency change function fc(t) may be a function that changes the carrier frequency fc to a value different from an original carrier frequency fc0 in a fixed time from 0 until the time t becomes te1.

8.2.3 Operation of Droplet Target Generation Processor 265

Figure 46:
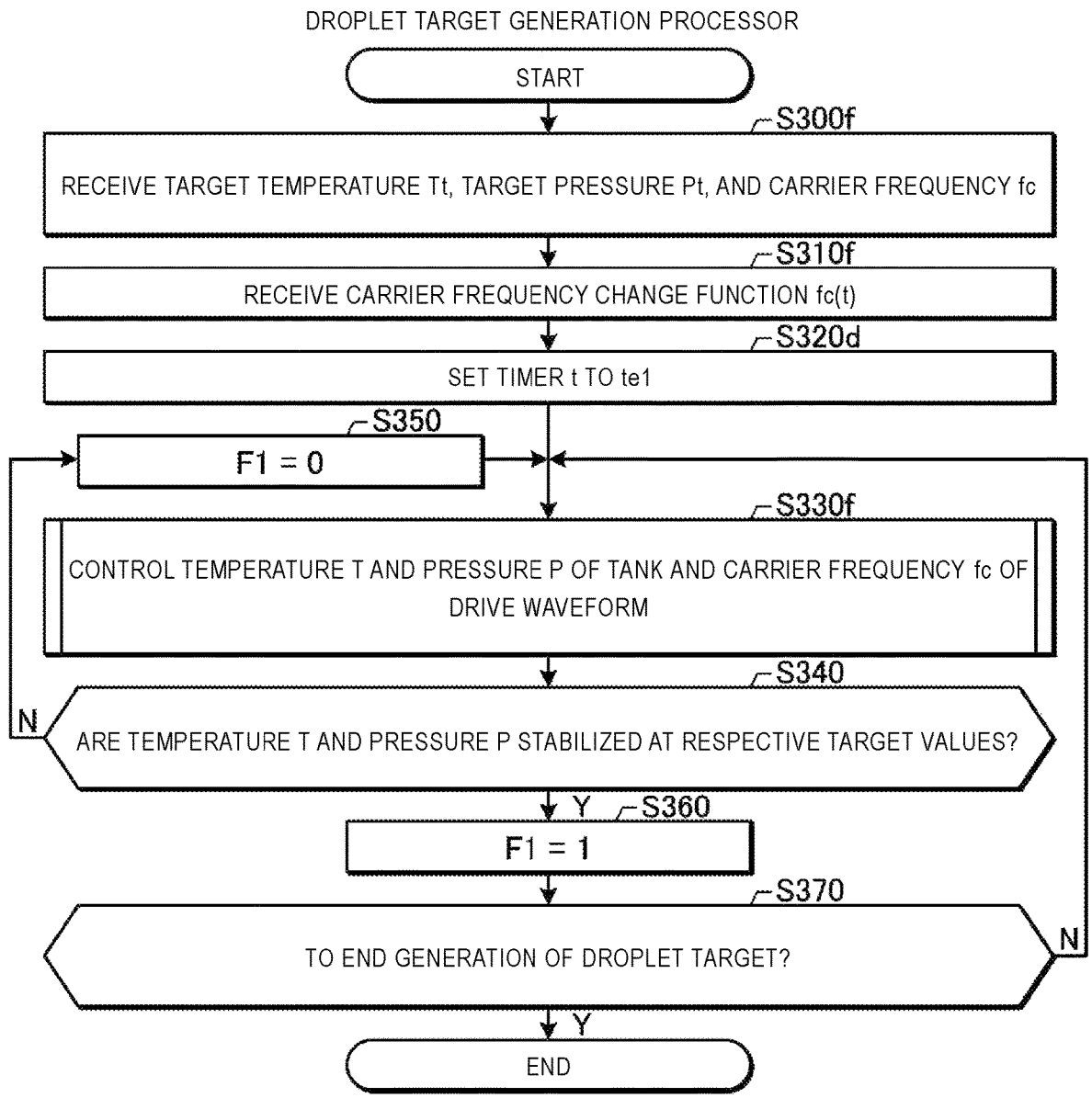
FIG. 46 is a flowchart showing operation of the droplet target generation processor in the sixth embodiment.

FIG. 46 is a flowchart showing operation of the droplet target generation processor 265 in the sixth embodiment. In the sixth embodiment, the carrier frequency fc is received in S300f instead of the duty D, and the carrier frequency change function fc(t) at the time of solid target replenishment is received in S310f.

Instead of S330d in the fourth embodiment, in the sixth embodiment, the process of controlling the temperature T and the pressure P of the tank 260 and the carrier frequency fc is performed in S330f.

In other respects, FIG. 46 is similar to FIG. 32.

Figure 47:
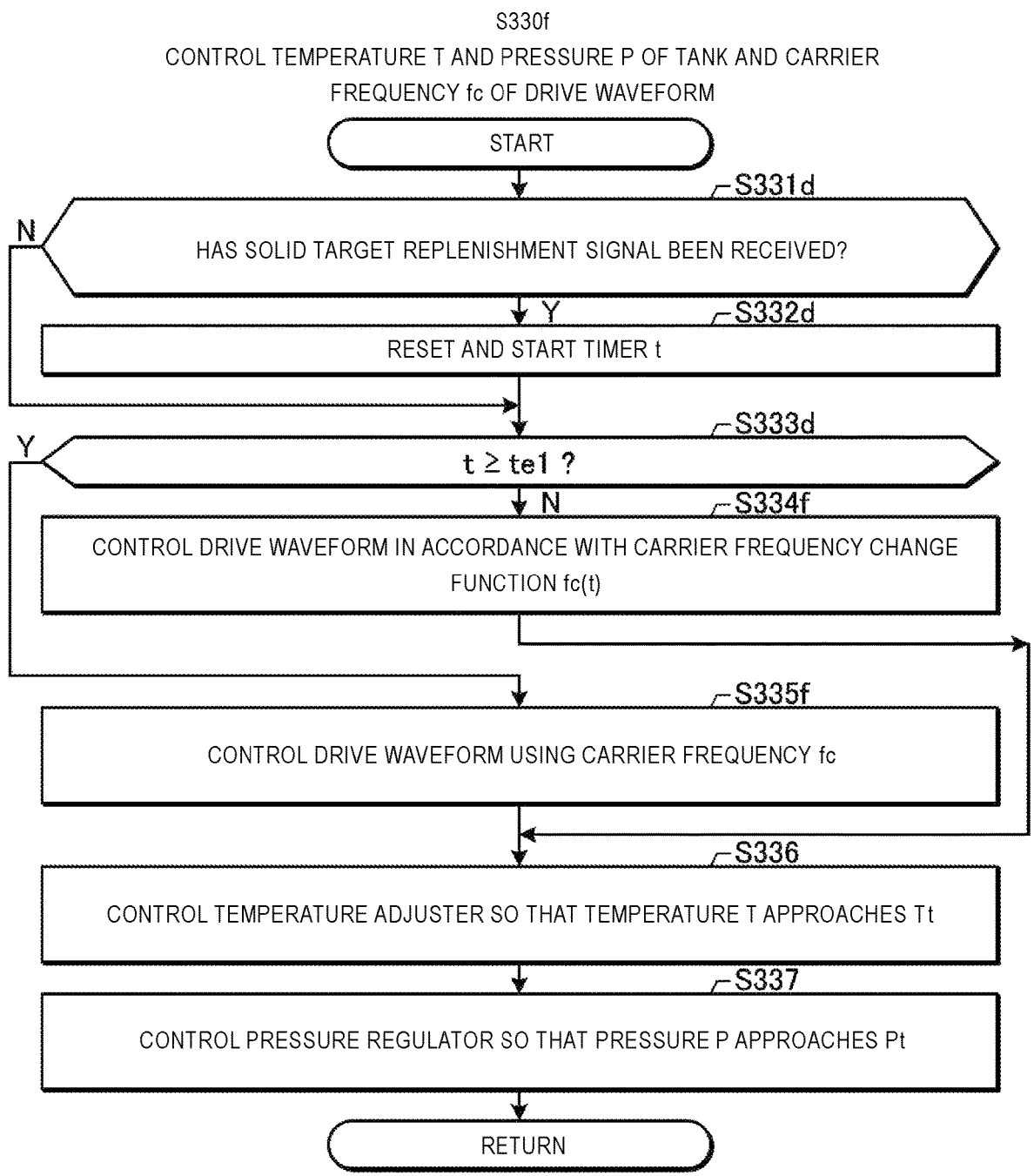
FIG. 47 is a flowchart showing details of the operation of controlling the temperature T and the pressure P of the tank and carrier frequency fc.

FIG. 47 is a flowchart showing details of the operation of controlling the temperature T and the pressure P of the tank 260 and the carrier frequency fc. FIG. 47 corresponds to a subroutine of S330f of FIG. 46.

In S333d, the droplet target generation processor 265 determines whether or not the value of the timer t is equal to or more than te1.

When the value of the timer t is equal to or more than te1 (S333d:YES), the droplet target generation processor 265 advances processing to S335f and controls the drive waveform of the vibration device 269 so that the carrier frequency fc becomes fc0.

When the value of the timer t is less than te1 (S333d:NO), the droplet target generation processor 265 advances processing to S334f and controls the drive waveform in accordance with the carrier frequency change function fc(t).

After S334f or S335f, the droplet target generation processor 265 advances processing to S336. The processes of S336 and S337 are similar to those described with reference to FIG. 11. After S337, the droplet target generation processor 265 ends the processing of the present flowchart and returns to processing shown in FIG. 46.

8.2.4 Example of Modulated Wave

The drive signal output from the droplet target generation processor 265 to the drive power source 264 is obtained by using a carrier wave Vc(t) and a signal wave Vs(t) defined by the following equation, and may be a modulated wave obtained by modulating the carrier wave Vc(t) with the signal wave Vs(t).

$$Vc(t) = Vcm \times \sin(2\pi \times fc \times t)$$

$$Vs(t) = Vsm \times \cos(2\pi \times fs \times t)$$

Here, Vcm is the carrier amplitude, Vsm is the signal wave amplitude, fc is the carrier frequency, and fs is the signal wave frequency. The carrier frequency fc is a multiple of the signal frequency fs, and it is desirable that, for example, $v/(fc \cdot d)$ is equal to or more than 3 and equal to or less than 8, where the velocity of the target 27 is v m/s and the opening diameter of the nozzle 266 is d mm. The coalescence-completed target-to-target distance Ld is given by the following equation.

$$Ld = Vd/fs$$

As described above, in the sixth embodiment, the coalescence-completed target-to-target distance Ld is determined in accordance with the signal wave frequency fs.

8.2.4.1 PM Modulated Wave Vpm(t)

The drive signal may be the following PM modulated wave Vpm(t).

$$Vpm(t) = Vcm \times \sin\{2\pi \times fc \times t + \delta\theta \times Vs(t) + \Phi\} = Vcm \times \sin\{2\pi \times fc \times t + \delta\theta \times Vsm \times \cos(2\pi \times fs \times t) + \Phi\}$$

Here, $\delta\theta$ is a maximum phase shift (deviation) and the maximum phase shift $\delta\theta$ is equal to or more than 0 and equal to or less than $\pi$. $\Phi$ is a phase difference, and the phase difference $\Phi$ is equal to or more than 0 and equal to or less than $2\pi$.

In FIG. 42 to FIG. 47, description has been provided on a case in which the carrier frequency fc is temporarily changed as a modulation parameter. That is, in the control (S334f) within a certain period of time after receiving the solid target replenishment signal, the carrier frequency fc is temporarily changed in accordance with the carrier frequency change function fc(t).

Alternatively, in S334f, the drive waveform may be changed by changing the maximum phase shift $\delta\theta$ instead of the carrier frequency fc. Here, the maximum phase shift $\delta\theta$ is temporarily changed in accordance with the maximum phase shift change function $\delta\theta(t)$ instead of the carrier frequency shift function fc(t).

Alternatively, in S334f, the drive waveform may be changed by changing the phase difference $\Phi$ instead of the carrier frequency fc. Here, the phase difference $\Phi$ is temporarily changed in accordance with a phase difference change function $\Phi(t)$ instead of the carrier frequency change function fc(t).

Alternatively, the drive waveform may be temporarily changed by changing a combination of two or more of the carrier frequency fc, the maximum phase shift $\delta\theta$, and the phase difference $\Phi$.

8.2.4.2 FM Modulated Wave Vfm(t)

The drive signal may be the following FM modulated wave Vfm(t).

$$Vfm(t) = Vcm \times \sin\{2\pi \times fc \times t + \delta f \times \int Vs(t) + \Phi\} = Vcm \times \sin\{2\pi \times fc \times t + \delta f/fs \times \sin(2\pi \times fs \times t) + \Phi\}$$

Here, $\delta f$ is a maximum frequency deviation and the maximum frequency deviation $\delta f$ is equal to or more than 0 and equal to or less than the carrier frequency fc. $\Phi$ is the phase difference, and the phase difference Φ is equal to or more than 0 and equal to or less than 2π.

The drive waveform may be temporarily changed by changing one of the carrier frequency fc, the maximum frequency deviation δf, and the phase difference Φ, or a combination of two or more thereof.

8.2.4.3 AM Modulated Wave Vam(t)

The drive signal may be the following AM modulated wave Vam(t).

$$Vam(t)=\{Vcm+Vs(t+\Phi)\}\times\sin(2\pi\times fc\times t)=\{Vcm+Vsm\times\cos(2\pi\times fs\times t+\Phi)\}\times\sin(2\pi\times fc\times t)$$

Here, the ratio given by Vsm/Vcm is referred to as the modulation degree, and the modulation degree is equal to or more than 0 and equal to or less than 1. Φ is the phase difference.

The drive waveform may be temporarily changed by changing one of the carrier frequency fc, the modulation degree Vsm/Vcm, and the phase difference Φ, or a combination of two or more thereof.

8.3 Effect

(15) According to the sixth embodiment, the drive waveform is the modulated wave obtained by modulating the carrier wave Vc(t) with the signal wave Vs(t). The droplet target generation processor 265 changes at least one of parameters of the carrier wave Vc(t) and parameters of the signal wave Vs(t) in synchronization with the replenishment of the solid target substance 27a from the solid target replenishment device 8 to the tank 260.

Accordingly, by changing at least one of the parameters of the carrier wave Vc(t) and the parameters of the signal wave Vs(t), the drive waveform can be changed by a simple process.

(16) According to the sixth embodiment, the EUV light generation apparatus 1 includes the passage sensor unit 42 or the imaging unit 44 that detects the state of the coalescence of the plurality of droplet targets 271 in synchronization with the replenishment of the solid target substance 27a from the solid target replenishment device 8 to the tank 260 and the change of the drive waveform. The EUV light generation processor 5 determines the replenishment amount Qt based on the detection result of the passage sensor unit 42 or the imaging unit 44, and the solid target replenishment processor 85 controls the solid target replenishment device 8.

Accordingly, it is possible to determine the appropriate replenishment amount Qt by detecting the state of the coalescence in synchronization with the change of the drive waveform and determining the replenishment amount Qt based on the detection result.

(17) According to the sixth embodiment, while increasing the trial replenishment amount N·Qmin of the solid target substance 27a from the solid target replenishment device 8 to the tank 260, the EUV light generation processor 5 acquires the detection result output from the passage sensor unit 42 or the imaging unit 44 in synchronization with the replenishment of the solid target substance 27a from the solid target replenishment device 8 to the tank 260 and the change of the drive waveform. The EUV light generation processor 5 determines, as the replenishment amount Qt, the maximum value Nmax·Qmin of the trial replenishment amount N·Qmin in the case in which the coalescence of the droplet targets 271 is completed.

Accordingly, by measuring the state of the coalescence while increasing the trial replenishment amount N·Qmin, it is possible to accurately determine the range of the replenishment amount Qt in which the coalescence is completed. Then, by setting the maximum value Nmax·Qmin of the trial replenishment amount N·Qmin in the case in which the coalescence is completed as the one-time replenishment amount Qt, it is possible to suppress an increase in the number of times of replenishment and to suppress a decrease in the lifetime of the solid target replenishment device 8.

In other respects, the sixth embodiment is similar to the fourth embodiment.

9. OTHERS

9.1 Measuring Instrument 82 of Solid Target Replenishment Device 8

Figure 48:
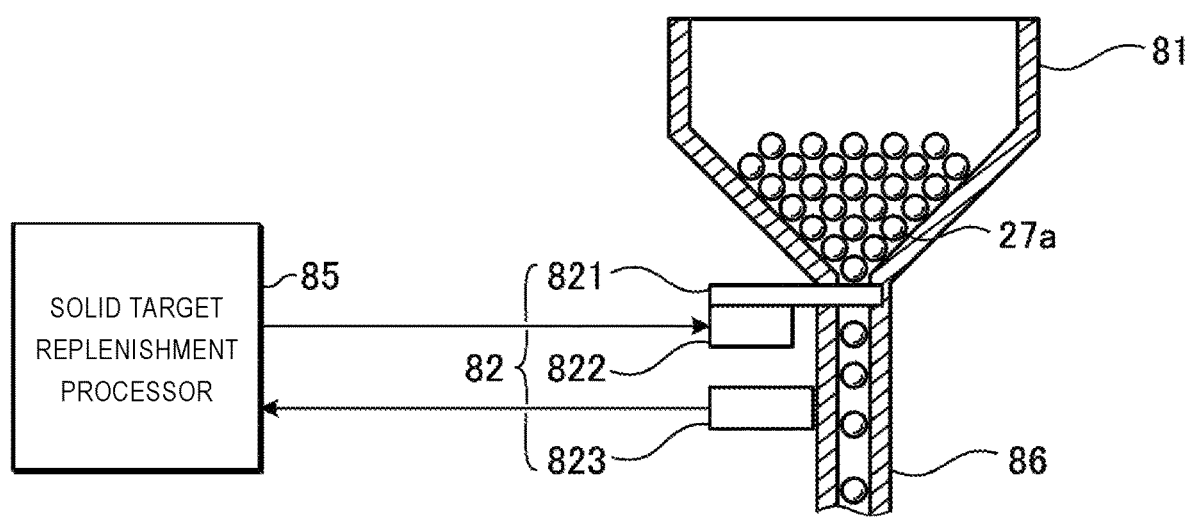
FIG. 48 schematically shows the configuration of a measuring instrument of the solid target replenishment device that can be used in each embodiment.

FIG. 48 schematically shows the configuration of the measuring instrument 82 of the solid target replenishment device 8 that can be used in each embodiment. The measuring instrument 82 includes a shutter 821 arranged between the solid target container 81 and the supply pipe 86, an actuator 822 that opens and closes the shutter 821, and an eddy current sensor 823 arranged in the middle of the supply pipe 86. The actuator 822 and the eddy current sensor 823 are controlled by the solid target replenishment processor 85.

The eddy current sensor 823 continuously generates a first magnetic field in pulses from the outside of the supply pipe 86 toward the supply pipe 86. The first magnetic field generates an eddy current in the supply pipe 86 or the inside thereof, and the eddy current generates a second magnetic field. The eddy current and the second magnetic field vary depending on whether or not there is the solid target substance 27a inside the supply pipe 86. The eddy current sensor 823 detects the second magnetic field and determines whether or not the solid target substance 27a has passed through the inside of the supply pipe 86.

By using the eddy current sensor 823, the solid target substance 27a inside the supply pipe 86 can be detected without forming a hole in the supply pipe 86.

The solid target replenishment processor 85 determines, based on the output of the eddy current sensor 823, whether or not the solid target substance 27a corresponding to the one-time solid target replenishment amount Qt has passed through the measuring instrument 82. When the solid target substance 27a corresponding to the replenishment amount Qt has passed, the shutter 821 is closed.

Figure 49:
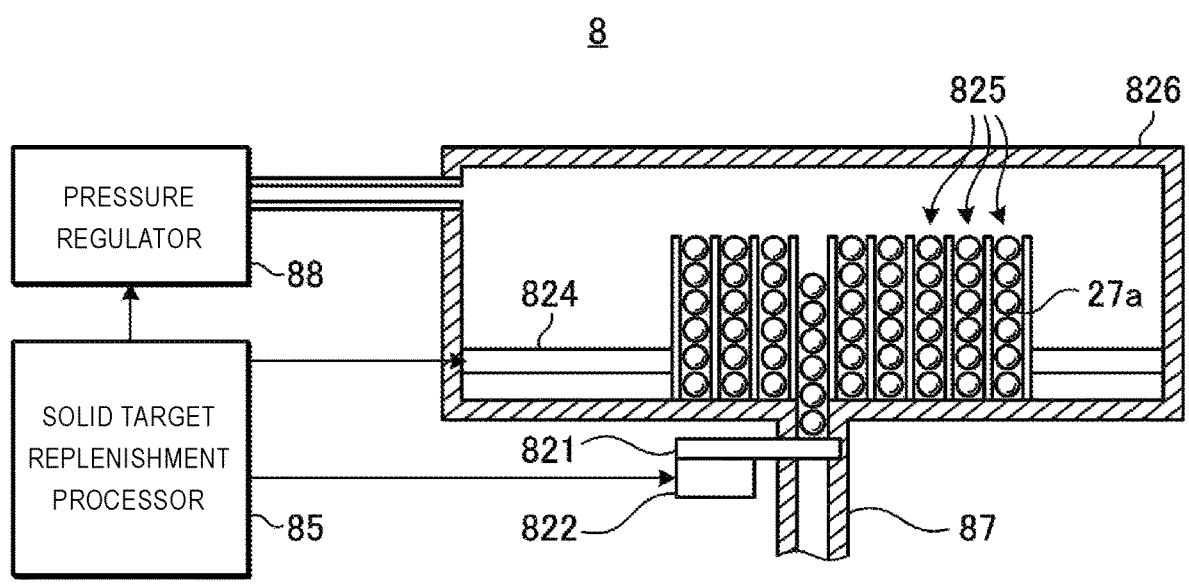
FIG. 49 schematically shows an alternative configuration of the solid target replenishment device that can be used in each embodiment.

9.2 Solid Target Replenishment Device 8 in which One-Time Replenishment Amount Qt is Fixed FIG. 49 schematically shows an alternative configuration of the solid target replenishment device 8 that can be used in each embodiment. The solid target replenishment device 8 includes a pressure container 826 connected to the supply pipe 87. A plurality of storage portions 825 and a moving mechanism 824 for integrally moving the plurality of storage portions 825 are arranged inside the pressure container 826. A shutter 821 is arranged between the pressure container 826 and the supply pipe 87, and the shutter 821 is configured to be opened and closed by an actuator 822. The moving mechanism 824 and the actuator 822 are controlled by the solid target replenishment processor 85.

In the solid target replenishment device 8, the measuring instrument 82 and the load lock device 83 are not arranged.

The pressure regulator 88 is connected to the pressure container 826 via a pipe and regulates the inside of the pressure container 826 to have the same pressure as the inside of the tank 260 of the droplet target generation device 26. The temperature inside the pressure container 826 is lower than the melting point of the target substance.

Each of the plurality of storage portions 825 stores the solid target substance 27a corresponding to the one-time solid target replenishment amount Qt set in advance using the measurement result of the target measurement system or the like described in the second embodiment. The moving mechanism 824 moves the plurality of storage portions 825 such that one of the plurality of storage portions 825 is located at the connection portion with the supply pipe 87. When the shutter 821 is opened, all the solid target substance 27a corresponding to the one-time solid target replenishment amount Qt stored in the one storage portion 825 is replenished to the tank 260 through the supply pipe 87.

Thus, the solid target replenishment device 8 includes the storage portion 825 for storing the replenishment amount Qt of the solid target substance 27a, and may replenish the one-time replenishment amount Qt of the solid target substance 27a to the tank 260 by moving the solid target substance 27a stored in the storage portion 825 to the tank 260.

Accordingly, the solid target substance 27a stored in the storage portion 825 is moved to the tank 260 as it is, so that the measuring instrument 82 of the solid target substance 27a or the control thereof can be omitted or simplified.

9.3 Load Lock Device 83 Including Shutter 831

Figure 50:
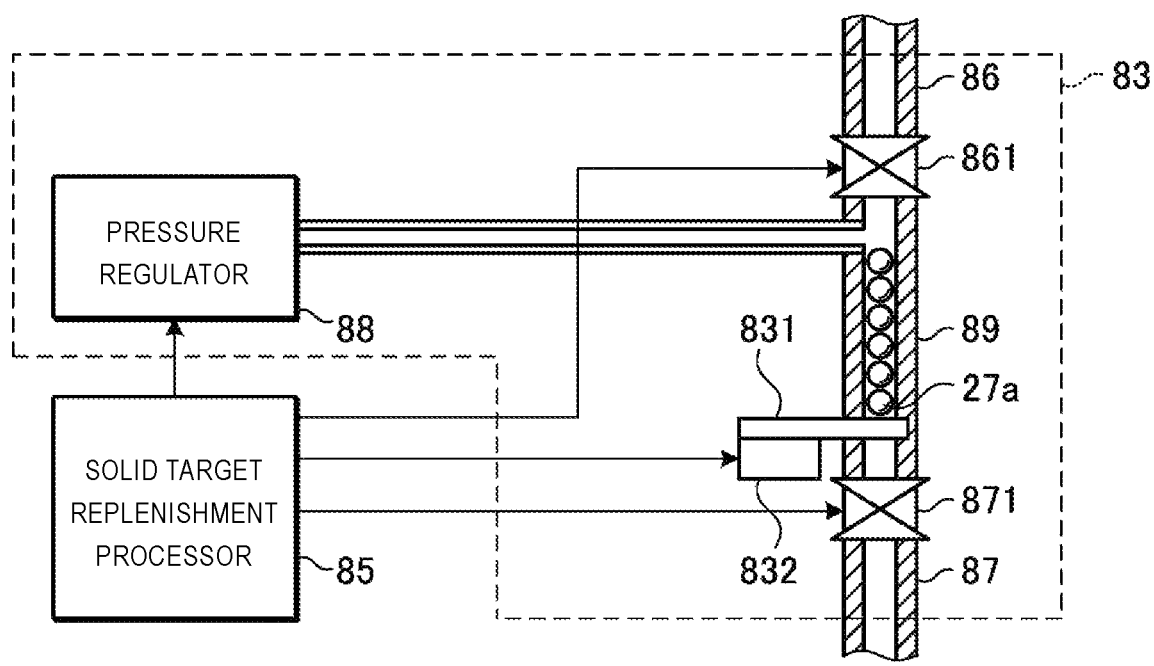
FIG. 50 schematically shows an alternative configuration example of a load lock device that can be used in each embodiment.
Figure 51:
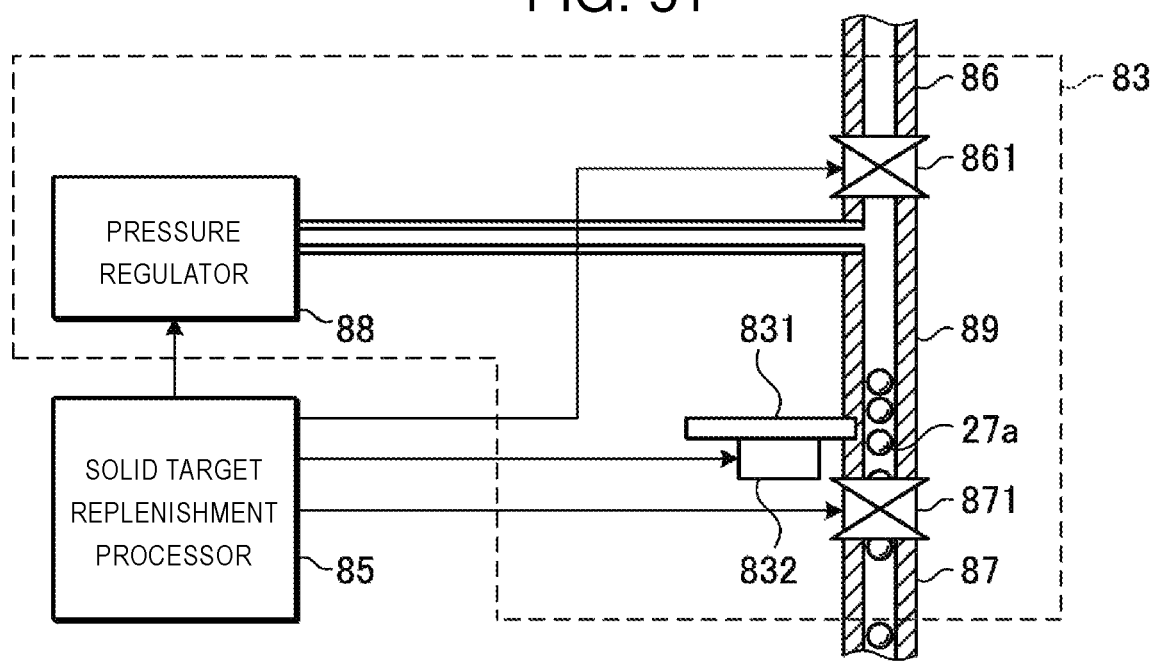
FIG. 51 schematically shows the alternative configuration example of the load lock device that can be used in each embodiment.

FIGS. 50 and 51 schematically show an alternative configuration example of the load lock device 83 that can be used in each embodiment. The load lock device 83 shown in FIGS. 50 and 51 includes a shutter 831 and an actuator 832 in addition to the configuration described with reference to FIG. 3. The shutter 831 is located near the lower end of the load lock chamber 89. The actuator 832 is configured to switch the shutter 831 between the closed state shown in FIG. 50 and the open state shown in FIG. 51 by driving the shutter 831.

Before opening the inlet valve 861 in S506 of FIG. 20, the shutter 831 is closed. Since the shutter 831 is in the closed state when the inlet valve 861 is opened and the solid target substance 27a moves to the load lock chamber 89, the solid target substance 27a is suppressed from colliding with the outlet valve 871 and damaging the outlet valve 871.

After opening the outlet valve 871 in S510, the shutter 831 is opened to move the solid target substance 27a in the load lock chamber 89 through the outlet valve 871 to the tank 260. Thus, the outlet valve 871 is suppressed from being damaged. Further, in this example, the solid target replenishment signal is transmitted at the timing of opening the shutter 831.

Figure 52:
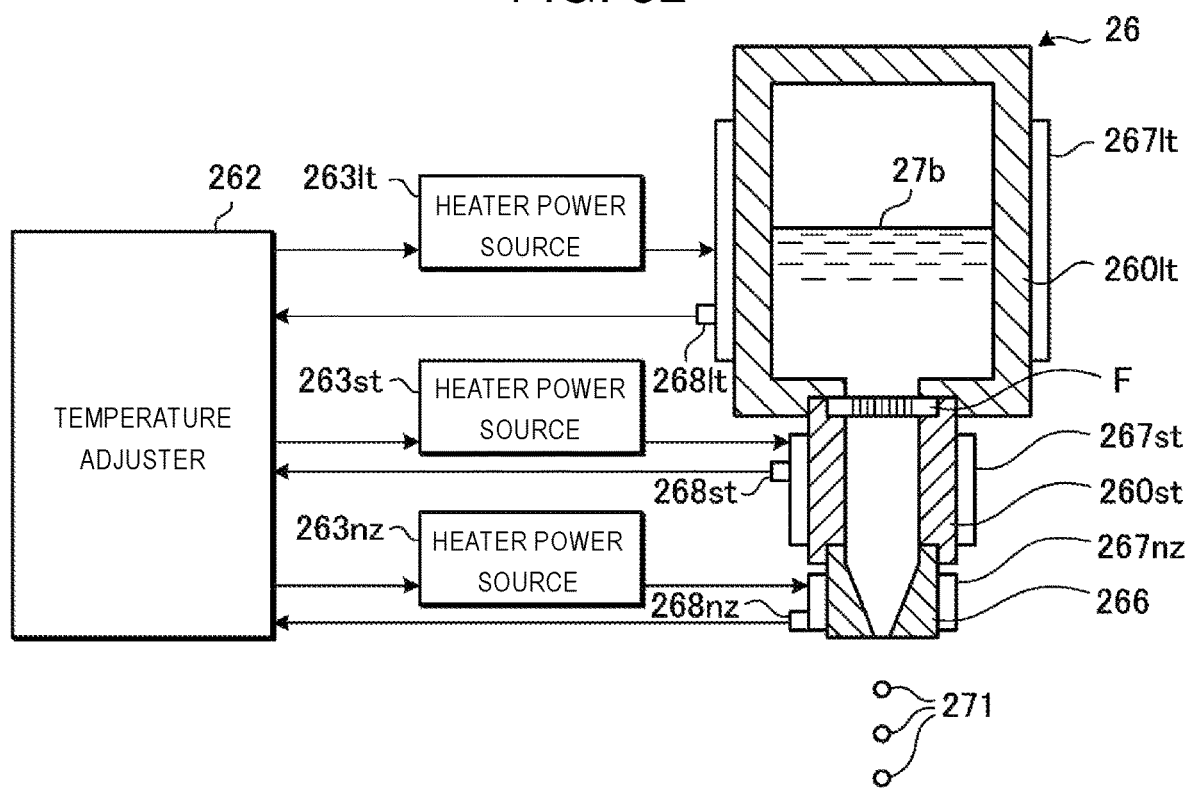
FIG. 52 schematically shows an alternative configuration example of the droplet target generation device that can be used in each embodiment.

9.4 Droplet Target Generation Device 26 in which Heater 267st and Heater 267nz are Arranged in Small Tank 260st and Nozzle 266 Respectively FIG. 52 schematically shows an alternative configuration example of the droplet target generation device 26 that can be used in each embodiment.

The droplet target generation device 26 includes a large tank 260lt, a small tank 260st, and a nozzle 266. The large tank 260lt melts the solid target substance 27a therein to form the liquid target substance 27b. The small tank 260st causes the liquid target substance 27b melted in the large tank 260lt to pass therethrough toward the nozzle 266. The nozzle 266 outputs the liquid target substance 27b having passed through the small tank 260st. A filter F is arranged between the large tank 260lt and the small tank 260st.

Heaters 267lt, 267st, 267nz are arranged at the large tank 260lt, the small tank 260st, and the nozzle 266, respectively. The heaters 267lt, 267st, 267nz are connected to heater power sources 263lt, 263st, 263nz, respectively, and heat the large tank 260lt, the small tank 260st, and the nozzle 266 to a predetermined temperature higher than the melting point of the target substance. The temperature adjuster 262 controls the heater power sources 263lt, 263st, 263nz based on outputs of sensors 268lt, 268st, 268nz arranged on the heaters 267lt, 267st, 267nz, respectively, to thereby control the temperatures of the large tank 260lt, the small tank 260st, and the nozzle 266.

In the fourth embodiment, at least the heater 267nz arranged at the nozzle 266 may be subjected to temperature control in synchronization with the replenishment of the solid target substance 27a. Alternatively, the heaters 267nz, 267st arranged at the nozzle 266 and the small tank 260st may be subjected to such temperature control. When such a droplet target generation device 26 is employed, the temperatures of the nozzle 266 and the small tank 260st are stabilized when the solid target substance 27a is replenished, and generation of a satellite is suppressed. As a result, it is possible to increase the one-time replenishment amount Qt of the solid target substance 27a.

9.5 Pressure Regulator 261

Figure 53:
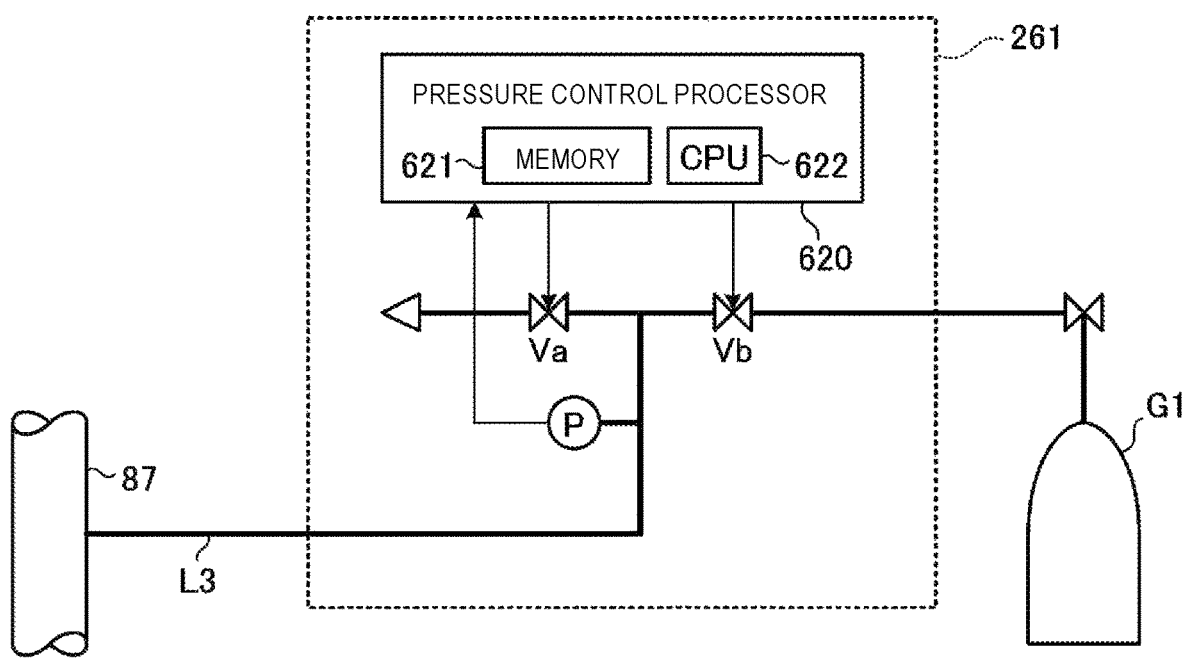
FIG. 53 schematically shows the configuration of a pressure regulator that can be used in the droplet target generation apparatus of each embodiment.

FIG. 53 schematically shows the configuration of the pressure regulator 261 that can be used in the droplet target generation device 26 of each embodiment. The pressure regulator 261 includes a pressure control processor 620, valves Va, Vb, and a pressure gauge P. The same may apply to the pressure regulator 88 included in the load lock device 83.

The pressure control processor 620 is a processor that includes a memory 621 in which a control program is stored and a CPU 622 which executes the control program. The pressure control processor 620 is specifically configured or programmed to perform various processes included in the present disclosure.

The valves Va, Vb are arranged at a pipe between the gas cylinder G1 and an exhaust device (not shown), and a pipe L3 connected to the supply pipe 87 is connected between the valves Va, Vb. The pressure gauge P is arranged at the pipe L3.

When both the valves Va, Vb are opened, the gas leaks from the gas cylinder G1 to the exhaust device, but the gas pressure supplied to the pipe L3 changes in accordance with the relationship between the opening degree of the valve Va and the opening degree of the valve Vb. The pressure control processor 620 controls the valves Va, Vb based on the gas pressure detected by the pressure gauge P, so that the gas pressure supplied to the pipe L3 can be regulated.

9.6 EUV Light Utilization Apparatus 6

Figure 54:
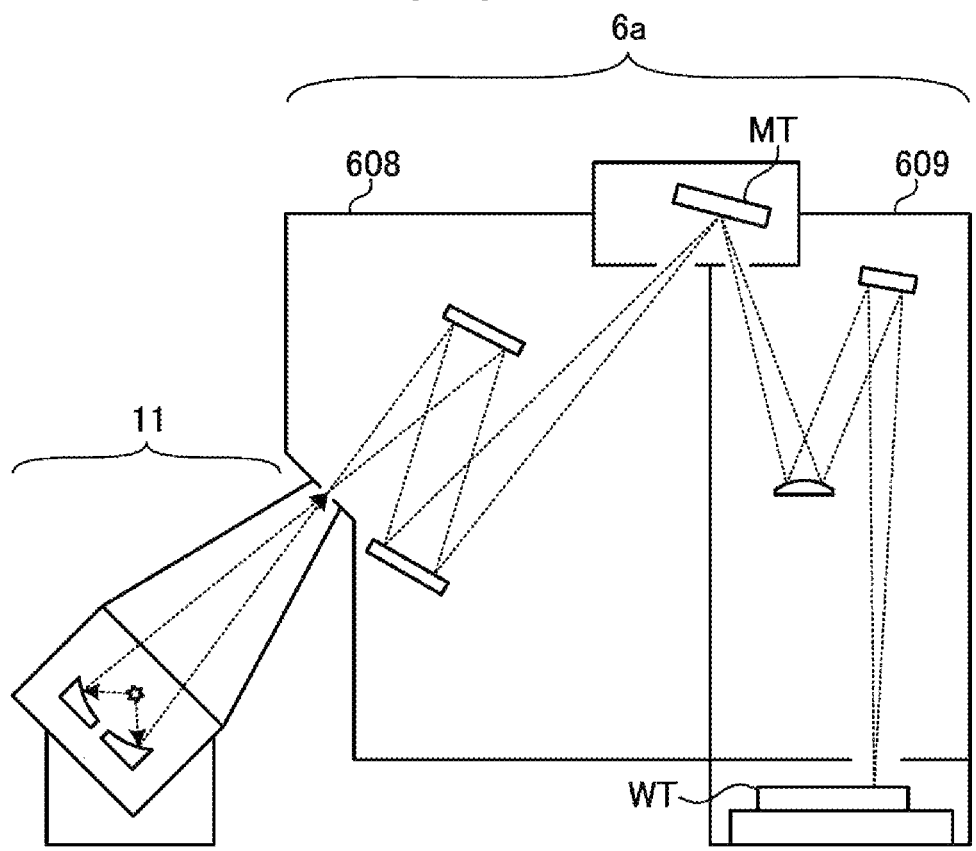
FIG. 54 schematically shows the configuration of an exposure apparatus connected to the EUV light generation system.

FIG. 54 schematically shows the configuration of an exposure apparatus 6a connected to the EUV light generation system 11.

In FIG. 54, the exposure apparatus 6a as the EUV light utilization apparatus 6 (see FIG. 1) includes a mask irradiation unit 608 and a workpiece irradiation unit 609. The mask irradiation unit 608 illuminates, via a reflection optical system, a mask pattern of a mask table MT with the EUV light incident from the EUV light generation system 11. The workpiece irradiation unit 609 images the EUV light reflected by the mask table MT onto a workpiece (not shown) arranged on a workpiece table WT via a reflection optical system. The workpiece is a photosensitive substrate such as a semiconductor wafer on which photoresist is applied. The exposure apparatus 6a synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

Figure 55:
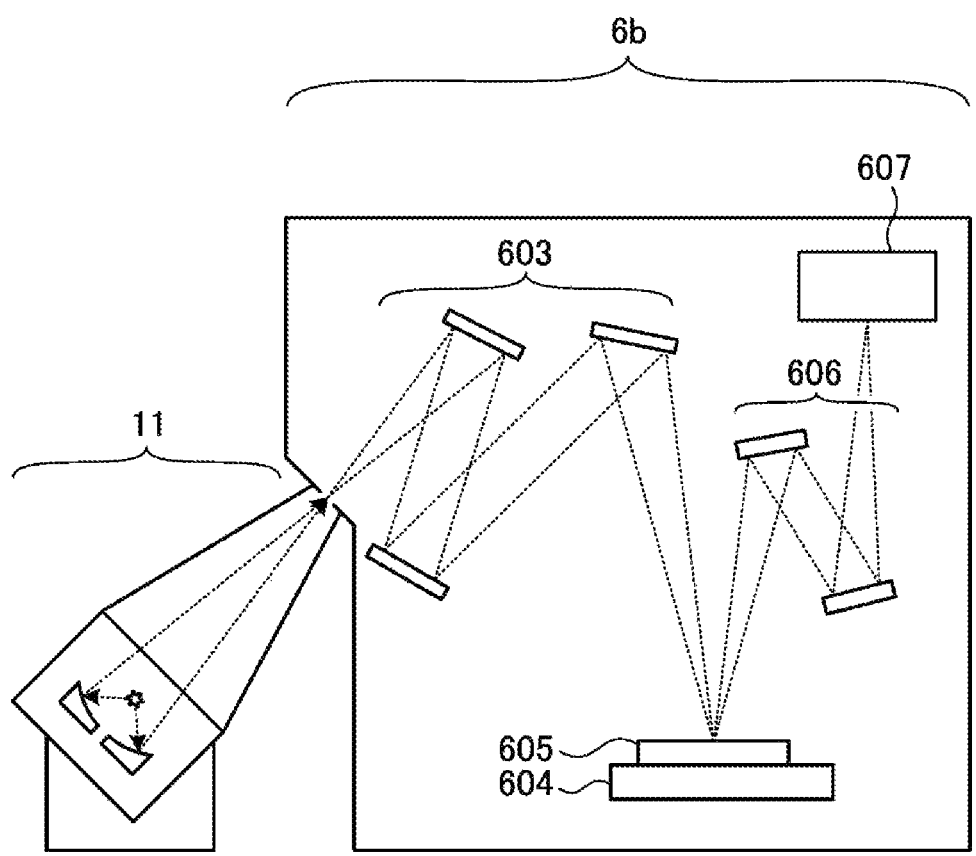
FIG. 55 schematically shows the configuration of an inspection apparatus connected to the EUV light generation system.

FIG. 55 schematically shows the configuration of an inspection apparatus 6b connected to the EUV light generation system 11.

In FIG. 55, the inspection apparatus 6b as the EUV light utilization apparatus 6 (see FIG. 1) includes an illumination optical system 603 and a detection optical system 606. The illumination optical system 603 reflects the EUV light incident from the EUV light generation system 11 to illuminate a mask 605 placed on a mask stage 604. Here, the mask 605 conceptually includes a mask blanks before a pattern is formed. The detection optical system 606 reflects the EUV light from the illuminated mask 605 and forms an image on a light receiving surface of a detector 607. The detector 607 having received the EUV light obtains the image of the mask 605. The detector 607 is, for example, a time delay integration (TDI) camera. A defect of the mask 605 is inspected based on the image of the mask 605 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 6a.

9.7 Supplement

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. An extreme ultraviolet light generation apparatus comprising:
    a droplet target generation device including a tank configured to melt a solid target substance to generate a liquid target substance, and a nozzle configured to continuously generate a droplet target from the liquid target substance in the tank and output the droplet target toward a plasma generation region to which pulse laser light is concentrated, and configured to apply a velocity difference between a plurality of droplet targets including the droplet target so that the plurality of droplet targets coalesce; and
    a solid target replenishment device configured to replenish the tank with a one-time replenishment amount of the solid target substance such that the solid target substance reaches the tank before being melted and that the coalescence of the plurality of droplet targets is completed before the plurality of droplet targets reach the plasma generation region.

2. The extreme ultraviolet light generation apparatus according to claim 1,
    further comprising a processor configured to store the replenishment amount and control the solid target replenishment device in accordance with the stored replenishment amount.

3. The extreme ultraviolet light generation apparatus according to claim 1, further comprising:
    a detection device configured to detect a state of the coalescence of the plurality of droplet targets in synchronization with the replenishment of the solid target substance from the solid target replenishment device to the tank; and
    a processor configured to determine the replenishment amount based on a detection result of the detection device and control the solid target replenishment device in accordance with the replenishment amount.

4. The extreme ultraviolet light generation apparatus according to claim 3,
    wherein the detection device includes an optical sensor configured to output a passage signal of the droplet target.

5. The extreme ultraviolet light generation apparatus according to claim 4,
    wherein, while increasing a trial replenishment amount of the solid target substance from the solid target replenishment device to the tank, the processor acquires the passage signal of the droplet target output from the optical sensor in synchronization with the replenishment of the solid target substance from the solid target replenishment device to the tank, and determines, as the replenishment amount, a maximum value of the trial replenishment amount in a case in which the coalescence of the droplet targets is completed.

6. The extreme ultraviolet light generation apparatus according to claim 3,
    wherein the detection device includes an image sensor configured to capture an image of the droplet target.

7. The extreme ultraviolet light generation apparatus according to claim 6,
    wherein, while increasing a trial replenishment amount of the solid target substance from the solid target replenishment device to the tank, the processor acquires the image of the droplet target captured by the image sensor in synchronization with the replenishment of the solid target substance from the solid target replenishment device to the tank, and determines, as the replenishment amount, a maximum value of the trial replenishment amount in a case in which the coalescence of the droplet targets is completed.

8. The extreme ultraviolet light generation apparatus according to claim 3,
    wherein the detection device includes an EUV sensor configured to detect a state of extreme ultraviolet light generated in the plasma generation region.

9. The extreme ultraviolet light generation apparatus according to claim 8,
wherein, while increasing a trial replenishment amount of the solid target substance from the solid target replenishment device to the tank, the processor acquires pulse energy of the extreme ultraviolet light measured by the EUV sensor in synchronization with the replenishment of the solid target substance from the solid target replenishment device to the tank, and determines, as the replenishment amount, a maximum value of the trial replenishment amount in a case in which stability of the pulse energy is within an allowable range.

10. The extreme ultraviolet light generation apparatus according to claim 1,
further comprising a processor,
wherein the droplet target generation device further includes a heater arranged at at least one of the tank and the nozzle, and
the processor temporarily changes power supplied to the heater in synchronization with the replenishment of the solid target substance from the solid target replenishment device to the tank.

11. The extreme ultraviolet light generation apparatus according to claim 10,
further comprising a detection device configured to detect a state of the coalescence of the plurality of droplet targets in synchronization with replenishment of the solid target substance from the solid target replenishment device to the tank and the change in the power,
wherein the processor determines the replenishment amount based on a detection result of the detection device and controls the solid target replenishment device.

12. The extreme ultraviolet light generation apparatus according to claim 11,
wherein, while increasing a trial replenishment amount of the solid target substance from the solid target replenishment device to the tank, the processor acquires the detection result output from the detection device in synchronization with the replenishment of the solid target substance from the solid target replenishment device to the tank and the change in the power and determines, as the replenishment amount, a maximum value of the trial replenishment amount in a case in which the coalescence of the droplet targets is completed.

13. The extreme ultraviolet light generation apparatus according to claim 1,
further comprising a processor,
wherein the droplet target generation device further includes a vibration device that applies vibration to the nozzle, and
the processor temporarily changes a drive waveform input to the vibration device in synchronization with the replenishment of the solid target substance from the solid target replenishment device to the tank.

14. The extreme ultraviolet light generation apparatus according to claim 13,
wherein the drive waveform is a rectangular wave, and
the processor temporarily changes a duty of the rectangular wave in synchronization with the replenishment of the solid target substance from the solid target replenishment device to the tank.

15. The extreme ultraviolet light generation apparatus according to claim 13,
wherein the drive waveform is a modulated wave obtained by modulating a carrier wave, and
the processor changes at least one of a parameter of the carrier wave and a parameter of the modulation in synchronization with the replenishment of the solid target substance from the solid target replenishment device to the tank.

16. The extreme ultraviolet light generation apparatus according to claim 13,
further comprising a detection device configured to detect a state of the coalescence of the plurality of droplet targets in synchronization with replenishment of the solid target substance from the solid target replenishment device to the tank and the change in the drive waveform,
wherein the processor determines the replenishment amount based on a detection result of the detection device and controls the solid target replenishment device.

17. The extreme ultraviolet light generation apparatus according to claim 16,
wherein, while increasing a trial replenishment amount of the solid target substance from the solid target replenishment device to the tank, the processor acquires the detection result output from the detection device in synchronization with the replenishment of the solid target substance from the solid target replenishment device to the tank and the change in the drive waveform and determines, as the replenishment amount, a maximum value of the trial replenishment amount in a case in which the coalescence of the droplet targets is completed.

18. The extreme ultraviolet light generation apparatus according to claim 1,
wherein the solid target replenishment device includes a storage portion for storing the replenishment amount of the solid target substance, and replenishes the replenishment amount of the solid target substance to the tank by moving the solid target substance stored in the storage portion to the tank.

19. The extreme ultraviolet light generation apparatus according to claim 1,
wherein the solid target substance is in a form of a plurality of particles.

20. The extreme ultraviolet light generation apparatus according to claim 19,
wherein the solid target replenishment device includes a solid target container containing the solid target substance.

21. The extreme ultraviolet light generation apparatus according to claim 20,
wherein the solid target replenishment device further includes a valve arranged in a pipe connecting the solid target container and the tank.

22. The extreme ultraviolet light generation apparatus according to claim 21,
wherein the one-time replenishment amount of the solid target substance passes the pipe by opening and closing the valve once.

23. The extreme ultraviolet light generation apparatus according to claim 1, further comprising:
a detection device including an EUV sensor configured to detect a state of extreme ultraviolet light generated in the plasma generation region in synchronization with the replenishment of the solid target substance from the solid target replenishment device to the tank; and
a processor configured to determine the replenishment amount based on a detection result of the EUV sensor and control the solid target replenishment device in accordance with the replenishment amount.

24. The extreme ultraviolet light generation apparatus according to claim 1,
further comprising a processor,
wherein the droplet target generation device further includes a heater arranged at at least one of the tank and the nozzle, and
the processor temporarily increases power supplied to the heater in synchronization with the replenishment of the solid target substance from the solid target replenishment device to the tank.

25. An electronic device manufacturing method, comprising:
generating extreme ultraviolet light using an extreme ultraviolet light generation apparatus;
outputting the extreme ultraviolet light to an exposure apparatus; and
exposing a photosensitive substrate to the extreme ultraviolet light in the exposure apparatus to manufacture an electronic device,
the extreme ultraviolet light generation apparatus including:
a droplet target generation device including a tank configured to melt a solid target substance to generate a liquid target substance, and a nozzle configured to continuously generate a droplet target from the liquid target substance in the tank and output the droplet target toward a plasma generation region to which pulse laser light is concentrated, and configured to apply a velocity difference between a plurality of droplet targets including the droplet target so that the plurality of droplet targets coalesce; and
a solid target replenishment device configured to replenish the tank with a one-time replenishment amount of the solid target substance such that the solid target substance reaches the tank before being melted and that the coalescence of the plurality of droplet targets is completed before the plurality of droplet targets reach the plasma generation region.

26. An electronic device manufacturing method, comprising:
inspecting a defect of a mask by irradiating the mask with extreme ultraviolet light generated by an extreme ultraviolet light generation apparatus;
selecting a mask using a result of the inspection; and
exposing and transferring a pattern formed on the selected mask onto a photosensitive substrate,
the extreme ultraviolet light generation apparatus including:
a droplet target generation device including a tank configured to melt a solid target substance to generate a liquid target substance, and a nozzle configured to continuously generate a droplet target from the liquid target substance in the tank and output the droplet target toward a plasma generation region to which pulse laser light is concentrated, and configured to apply a velocity difference between a plurality of droplet targets including the droplet target so that the plurality of droplet targets coalesce; and
a solid target replenishment device configured to replenish the tank with a one-time replenishment amount of the solid target substance such that the solid target substance reaches the tank before being melted and that the coalescence of the plurality of droplet targets is completed before the plurality of droplet targets reach the plasma generation region.

* * * * *